(12) United States Patent
Fink et al.

(10) Patent No.: US 11,260,586 B2
(45) Date of Patent: Mar. 1, 2022

(54) MULTIMATERIAL 3D-PRINTING WITH FUNCTIONAL FIBER

(71) Applicant: Massachusetts Institute of Technology, Cambridge, MA (US)

(72) Inventors: Yoel Fink, Brookline, MA (US); Gabriel Zi Jie Loke, Cambridge, MA (US); Rodger Yuan, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 537 days.

(21) Appl. No.: 15/816,964

(22) Filed: Nov. 17, 2017

(65) Prior Publication Data

US 2018/0141274 A1 May 24, 2018

Related U.S. Application Data

(60) Provisional application No. 62/423,825, filed on Nov. 18, 2016.

(51) Int. Cl.
*B33Y 10/00* (2015.01)
*B29C 64/209* (2017.01)
(Continued)

(52) U.S. Cl.
CPC .......... *B29C 64/209* (2017.08); *B29C 64/118* (2017.08); *B29C 70/88* (2013.01);
(Continued)

(58) Field of Classification Search
CPC ......... B33Y 10/00; B33Y 30/00; B33Y 80/00; B29C 64/118; B29C 64/00;
(Continued)

(56) References Cited

U.S. PATENT DOCUMENTS 4,234,907 A 11/1980 Daniel
4,515,432 A 5/1985 Sherwin
(Continued)

FOREIGN PATENT DOCUMENTS

WO 2003079073 9/2003
WO 2007038718 4/2007
(Continued)

OTHER PUBLICATIONS

PCT/US2017/044127, International Search Report, Form PCT/ISA/210 First Sheet, Continuation of First Sheet, Second Sheet, Continuation of Second Sheet, Extra Sheet, dated Nov. 2017.
(Continued)

*Primary Examiner* — Matthew D Matzek
(74) *Attorney, Agent, or Firm* — Theresa A. Lober

(57) ABSTRACT

In a method for printing a three dimensional structure, a continuous length of fiber that includes, interior to a surface of the fiber, a plurality of different materials arranged as an in-fiber functional domain, with at least two electrical conductors disposed in the functional domain in electrical contact with at least one functional domain material, is dispensed through a single heated nozzle. After sections of the length of fiber are dispensed from the heated nozzle, the sections are fused together in an arrangement of a three dimensional structure. The structure can thereby include a continuous length of fiber of least three different materials arranged as an in-fiber functional device, with the continuous length of fiber disposed as a plurality of fiber sections that are each in a state of material fusion with another fiber section in a spatial arrangement of the structure.

30 Claims, 20 Drawing Sheets

(51) Int. Cl.
| | |
|---|---|
| *B33Y 80/00* | (2015.01) |
| *B29C 70/88* | (2006.01) |
| *B33Y 30/00* | (2015.01) |
| *B29C 64/118* | (2017.01) |
| *G01K 7/16* | (2006.01) |
| *H01B 7/02* | (2006.01) |
| *H01B 13/00* | (2006.01) |
| *H01B 13/14* | (2006.01) |
| *H01L 31/0203* | (2014.01) |
| *H01L 31/032* | (2006.01) |
| *H01L 41/053* | (2006.01) |
| *H01L 41/23* | (2013.01) |
| *H01M 10/058* | (2010.01) |
| *H05B 33/04* | (2006.01) |
| *H05B 33/10* | (2006.01) |
| *H05K 5/06* | (2006.01) |
| *B29L 31/34* | (2006.01) |
| *B29K 101/12* | (2006.01) |
| *H01M 4/38* | (2006.01) |
| *H01M 4/505* | (2010.01) |
| *H01M 4/525* | (2010.01) |
| *H01M 4/58* | (2010.01) |
| *H01M 4/587* | (2010.01) |

(52) U.S. Cl.
CPC .............. *B33Y 10/00* (2014.12); *B33Y 30/00* (2014.12); *B33Y 80/00* (2014.12); *G01K 7/16* (2013.01); *H01B 7/0233* (2013.01); *H01B 7/0275* (2013.01); *H01B 13/0016* (2013.01); *H01B 13/14* (2013.01); *H01L 31/0203* (2013.01); *H01L 31/032* (2013.01); *H01L 41/0533* (2013.01); *H01L 41/23* (2013.01); *H01M 10/058* (2013.01); *H05B 33/04* (2013.01); *H05B 33/10* (2013.01); *H05K 5/065* (2013.01); *B29K 2101/12* (2013.01); *B29K 2827/18* (2013.01); *B29K 2905/12* (2013.01); *B29K 2995/0005* (2013.01); *B29K 2995/0013* (2013.01); *B29L 2031/34* (2013.01); *B29L 2031/3468* (2013.01); *H01M 4/386* (2013.01); *H01M 4/387* (2013.01); *H01M 4/505* (2013.01); *H01M 4/525* (2013.01); *H01M 4/587* (2013.01); *H01M 4/5825* (2013.01)

(58) Field of Classification Search
CPC ......... Y10T 428/2929–2931; Y10T 428/2973; H01G 11/08; H01G 11/10; D01F 8/00; D01F 8/04
USPC ................ 428/373–374, 364, 372, 397, 398
See application file for complete search history.

(56) References Cited

U.S. PATENT DOCUMENTS

| | | | |
|---|---|---|---|
| 5,546,413 | A | 8/1996 | Lebby et al. |
| 5,753,381 | A | 5/1998 | Feldman et al. |
| 5,906,004 | A | 5/1999 | Lebby et al. |
| 6,228,228 | B1 | 5/2001 | Singh et al. |
| 6,560,398 | B1 | 5/2003 | Roach et al. |
| 7,292,758 | B2 | 11/2007 | Bayindir et al. |
| 7,295,734 | B2 | 11/2007 | Bayindir et al. |
| 7,567,740 | B2 | 7/2009 | Bayindir et al. |
| 7,805,029 | B2 | 9/2010 | Bayindir et al. |
| 8,098,966 | B2 | 1/2012 | Bayindir et al. |
| 8,541,940 | B2 | 9/2013 | Moran-Mirabal et al. |
| 9,156,205 | B2 | 10/2015 | Mark et al. |
| 9,263,614 | B2 | 2/2016 | Deng et al. |
| 9,365,013 | B2 | 6/2016 | Fink et al. |
| 9,373,807 | B2 | 6/2016 | Pan et al. |
| 9,512,036 | B2 | 12/2016 | Abouraddy et al. |
| 10,509,186 | B2 | 12/2019 | Fink et al. |
| 2003/0075210 | A1 | 4/2003 | Stollwerck et al. |
| 2005/0018975 | A1 | 1/2005 | Ho et al. |
| 2005/0227059 | A1 | 10/2005 | Granstrom et al. |
| 2007/0053637 | A1 | 3/2007 | Golwalkar et al. |
| 2008/0227349 | A1 | 9/2008 | Eyck et al. |
| 2009/0097805 | A1* | 4/2009 | Bayindir ................ G02B 6/02 385/101 |
| 2013/0202888 | A1* | 8/2013 | Abouraddy .............. B29B 9/00 428/372 |
| 2014/0212084 | A1 | 7/2014 | Gumennik et al. |
| 2014/0272411 | A1 | 9/2014 | Gumennik |
| 2015/0044463 | A1 | 2/2015 | Fink et al. |
| 2015/0276506 | A1 | 10/2015 | Djeu |
| 2015/0357078 | A1 | 12/2015 | Lessing et al. |
| 2016/0028102 | A1 | 1/2016 | Bae et al. |
| 2016/0155534 | A1 | 6/2016 | Fink et al. |
| 2016/0233399 | A1 | 8/2016 | Maki |
| 2016/0297104 | A1* | 10/2016 | Guillemette ........... B29C 48/18 |
| 2016/0339633 | A1* | 11/2016 | Stolyarov ............ B29C 48/865 |
| 2018/0017248 | A1 | 1/2018 | Athauda et al. |
| 2018/0023801 | A1 | 1/2018 | Athauda et al. |
| 2018/0141274 | A1 | 5/2018 | Fink et al. |
| 2019/0047240 | A1 | 2/2019 | Sorin et al. |
| 2019/0118474 | A1* | 4/2019 | Hikmet ................. B33Y 80/00 |
| 2020/0028198 | A1 | 1/2020 | Lee et al. |

FOREIGN PATENT DOCUMENTS

| | | | |
|---|---|---|---|
| WO | 2012047344 | 4/2012 | |
| WO | 2014047660 | 3/2014 | |
| WO | 2015077262 | 5/2015 | |
| WO | 2015175061 | 11/2015 | |
| WO | WO-2017055984 A1 * | 4/2017 | ............ B33Y 70/00 |
| WO | 2017207514 | 12/2017 | |

OTHER PUBLICATIONS

PCT/US2017/044127, Written Opinion of the International Searching Authority, Form PCT/ISA/237 Cover Sheet, Box No. 1, Box No. IV, Box No. V, Supplemental Box 7 sheets, dated Nov. 2017.
Rein et al., "Self-assembled fibre optoelectronics with discrete translational symmetry," Nature Communications, 7:12807, pp. 1-8, Oct. 2016.
PCT/US2017/062410, International Search Report, Form PCT/ISA/210 First Sheet, Continuation of First Sheet, Second Sheet, Continuation of Second Sheet, Patent Family Annex Sheet, Further Information for PCT/ISA/210 Extra Sheet, dated May 2018.
PCT/US2017/062410, Written Opinion of the International Searching Authority, Form PCT/ISA/237 Cover Sheet, Box No. 1, Box No. III, Box No. IV, Box No. V, Box Nos. VI-VII, Separate Sheet Sheets 1-5, dated May 2018.
Nguyen et al., "3D-Printed Transparent Glass," Adv. Mater., V. 29, p. 1701181-1-1701181-5, Apr. 2017.
Willis et al., "Printed Optics: 3D Printing of Embedded Optical Elements for Interactive Devices," UIST 12, Cambridge, MA, ACM 978-1-4503-1580—Jul. 12, 2010, pp. 1-10, Oct. 2012.
Klein et al., "Additive Manufacturing of Optically Transparent Glass," 3D Printing and Additive Manufacturing, V. 2, N. 3, pp. 92-105, 2015.
Saari et al., "Fabrication and Analysis of a Composite 3D Printed Capacitive Force Sensor," 3D Printing and Additive Manufacturing, V. 3, No. 3, pp. 137-141, Sep. 2016.
Tian et al., "Interface and performance of 3D printed continuous carbon fiber reinforced PLA composites," Composites:Part A, V. 88, pp. 198-205, Jun. 2016.
Matsuzaki et al., "Three-dimensional printing of continuous-fiber composites by in-nozzle impregnation," nature Scientific Reports, pp. 1-7, Mar. 2016.

* cited by examiner

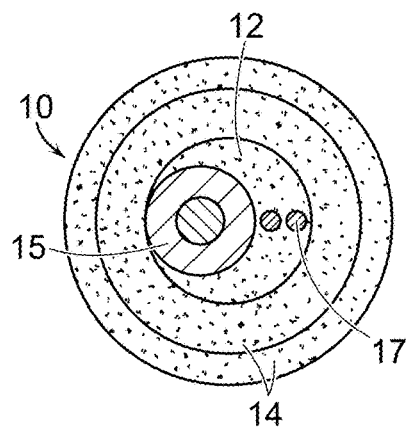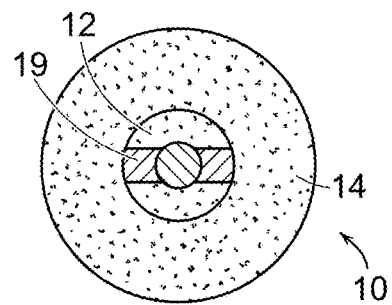
Figure 5A   Figure 5B
Figure 6A
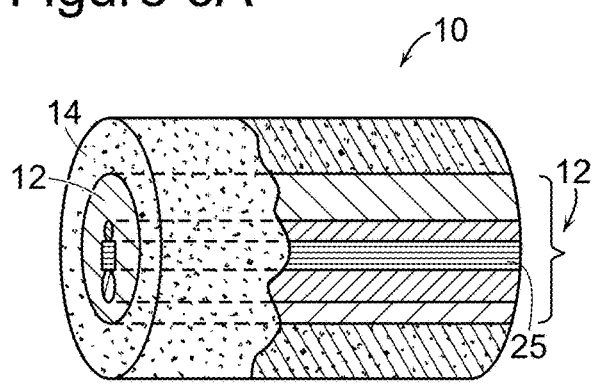
Figure 6B
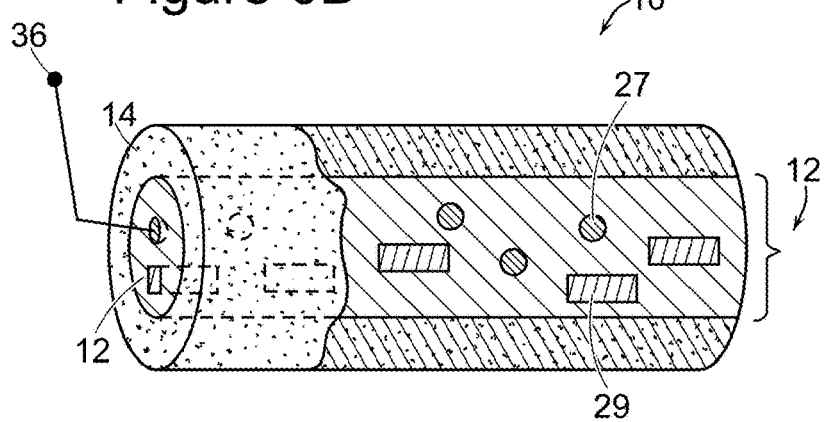

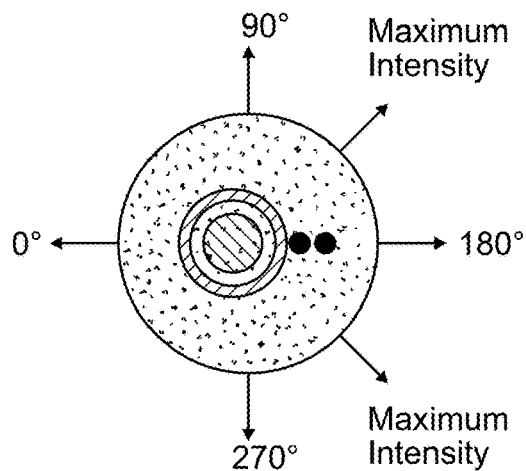
Figure 22D
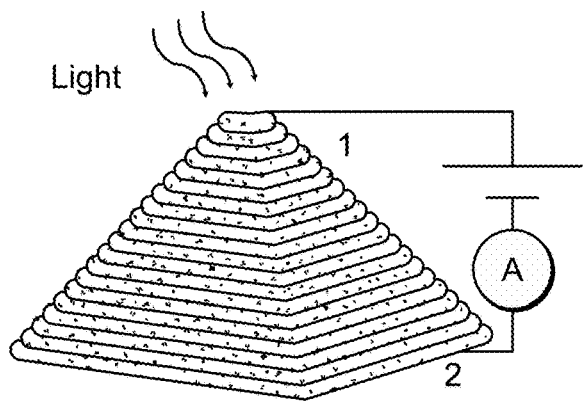
Figure 23A
Figure 23B
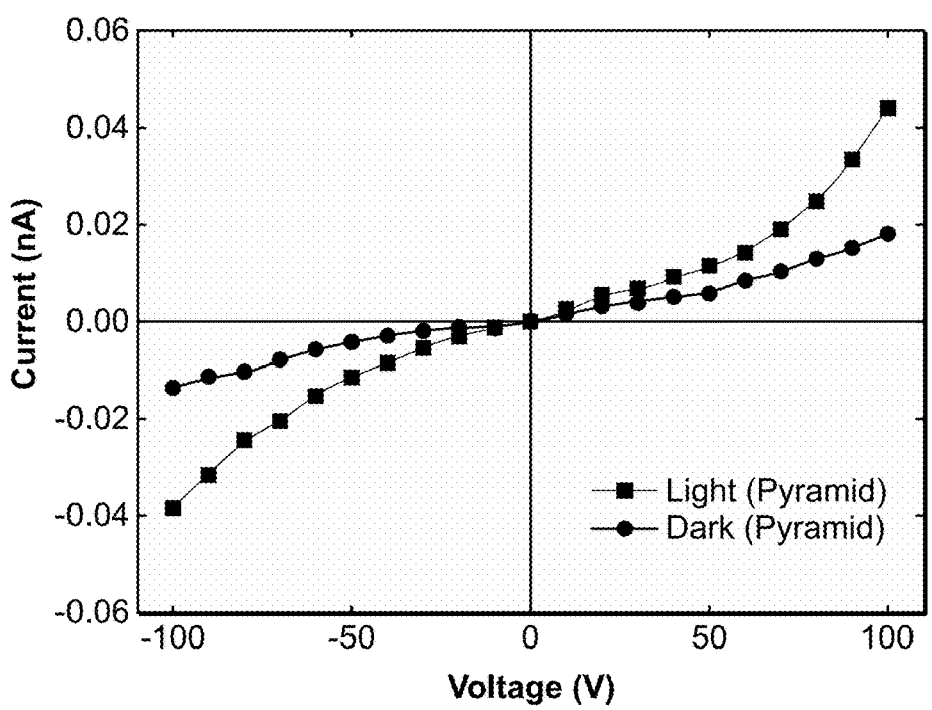

MULTIMATERIAL 3D-PRINTING WITH FUNCTIONAL FIBER

CROSS-REFERENCE TO RELATED APPLICATION

This application claims the benefit of U.S. Provisional Patent Application No. 62/423,825, filed Nov. 18, 2017, the entirety of which is hereby incorporated by reference.

STATEMENT REGARDING FEDERALLY SPONSORED RESEARCH

This invention was made with Government support under Contract No. DMR-1419807, awarded by the MRSEC, and under Contract No. W911NF-13-D-0001, awarded by the United States Army Research Office. The Government has certain rights in the invention.

BACKGROUND

This invention relates generally to additive manufacturing, and more particularly relates to 3D-printing and structures produced by 3D-printing.

Additive manufacturing is a process in which a structural product is built through layer-by-layer deposition of materials. Employing additive manufacturing methods, a three-dimensional structure is formed by, e.g., the continuous deposition of one material, or by the deposition of several different materials in sequence. Conventional multimaterial Fused Deposition Modelling (FDM) 3D printers have been demonstrated for this process, depositing one material at a time, with each material extruded through a different nozzle.

There is increasing interest in the field of 3D-printing for additive manufacturing of geometrically-customizable and complex objects. At the same time, a growing range of applications call for the formation of functionally complex objects. Here, "functional" is commonly defined as the ability of an object to exhibit an active or passive capability, e.g., in which the object can react or produce signals as a result of interaction with electromagnetic, electronic, optical, thermodynamic, or chemical stimuli. One advantage of 3D-printing processes is the ability to manufacture custom shapes and designs quickly, unlike more conventional manufacturing techniques which can require extensive production machinery set-up. The incorporation of functionalities into printed objects enables the extension of 3D-printed object applicability to a wide range of fields; for example, enabling customizable functional wearables that produce feedback on heart rate or blood pressure, printed pipes that provide feedback on the heat profile of water flow, and printed robotics and biomedical prosthetics parts that are integrated with touch sensors.

While the sequential, material-specific additive manufacturing paradigm of 3D-printing clearly enables production of a wide range of interesting structures, the paradigm inherently limits the resolution and geometry of the resulting structures. Moreover, the printability of structures that are functional, e.g., that include functional electronic devices, is often limited only to printable ink materials that inherently have the properties required for compatibility with a given printing system. As a result, functional structures that can be printed, as well as non-printable devices, are generally produced separately from a printed structure, and then embedded into the printed structure geometry. For most applications, this approach is found to be too expensive and too inefficient because added processing steps such as hole or channel machining are required. Alternatively, it has been proposed to print functional materials and devices onto an already-printed structure. Strain sensors, batteries, and light emitting diodes have been demonstrated with such a double-printing process. But only relatively simple, low-curvature, generally two-dimensional planar printed structures, like substrates, can accommodate a second printing step for device production.

Thus, while additive manufacturing has rapidly advanced over the years, with an increasing range of operating materials and printing speeds, significant challenges exist to combine multiple materials with disparate properties while producing functional devices having quality interfaces and at submicron length scales commensurate with functional devices. There remains a lack of ability to employ many desirable functional materials and combine such materials into device geometries, and there remains a severe limitation on the resolution with which printed devices can be produced. As a result, there has yet to be achieved the bridging of nanoscale and microscale functional structures and devices with printed macroscale objects.

SUMMARY

In a method for 3D-printing a three dimensional structure, a continuous length of fiber that includes, interior to a surface of the fiber, a plurality of different materials arranged as an in-fiber functional domain, with at least two electrical conductors disposed in the functional domain in electrical contact with at least one functional domain material, is dispensed through a single heated nozzle. After sections of the length of fiber are dispensed from the heated nozzle, the sections are fused together in an arrangement of a three dimensional structure.

The 3D-printing method can be conducted with a heated nozzle that includes a nozzle channel having a nozzle channel length between a nozzle channel inlet and a nozzle channel outlet, the nozzle channel length having a substantially circular cross section and an inner nozzle channel diameter. A heating tube is mechanically connected to the nozzle channel outlet, with the heating tube having a heating tube length between a heating tube inlet and a heating tube outlet, and having a substantially circular cross section with an inner heating tube diameter. A source of heat is disposed at the heating tube for heating the heating tube. The heating tube length is no greater than about 10% of a nozzle length that includes the nozzle channel length and the heating tube length.

The 3D-printed structure that is produced can include a continuous length of fiber with least three different materials arranged as an in-fiber functional device. Here the continuous length of fiber is disposed as a plurality of fiber sections that are each in a state of material fusion with another fiber section in a spatial arrangement of the structure. The 3D-printed structure that is produced can also include a continuous length of fiber with a plurality of different materials arranged as an in-fiber functional domain, with at least two electrical conductors disposed in electrical contact with materials in the functional domain. The continuous length of fiber is disposed as a plurality of fiber sections that are each in a state of material fusion with another fiber section in a spatial arrangement of the structure.

There can be employed in the 3D-printing process a filament that includes a continuous length of fiber having an interior region with at least three different materials arranged as an in-fiber functional device. A cladding region of a cladding material, having a cladding glass transition temperature, surrounds the interior region along the length of fiber. A fusion domain region of a fusion domain material, having a fusion domain material glass transition temperature, surrounds the cladding region. The cladding region glass transition temperature is at least about 50° C. greater than the fusion domain material glass transition temperature.

BRIEF DESCRIPTION OF THE DRAWINGS

FIGS. 5A-5B are cross-sectional views of example functional domain elements and material arrangements of the fiber fusion domain and the functional domain, in a multimaterial functional fiber;

FIGS. 6A-6B are cross-sectional longitudinal side views of example functional domain elements and material arrangements in a multimaterial functional fiber;

FIG. 22D is a schematic cross-sectional view of an electroluminescent fiber with angular definition of the intensity measurements plotted in FIG. 22C;

FIG. 23A is a schematic view of a pyramid 3D-printed of a photodetecting fiber, with the pyramid arranged for photodetection;

FIG. 23B is a plot of measured current out of the photodetecting fiber in the pyramid of FIG. 23A as a function of the voltage applied to the fiber, under dark conditions and under a condition of illumination of the pyramid;

DETAILED DESCRIPTION

Figure 1:
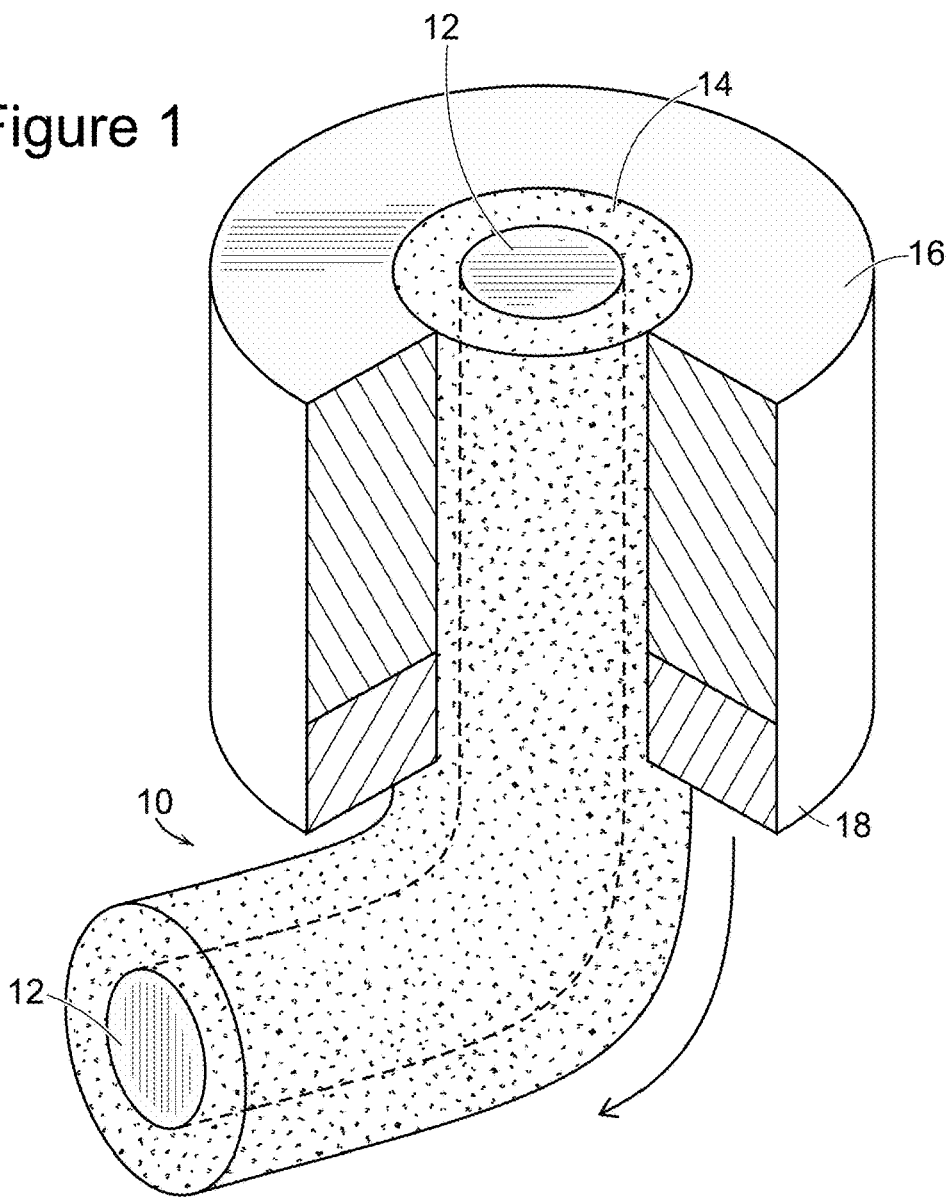
FIG. 1 is a schematic perspective view of a multimaterial functional fiber being dispensed through a heated nozzle.

FIG. 1 is a schematic perspective view of a functional fiber being processed by a fiber surface heating method provided herein for producing a functional 3D-printed functional fiber structure. The functional fiber 10 includes a functional domain 12 and a fusion domain 14. The fusion domain 14 is radially outward of the functional domain 12. Together, the functional domain and the fusion domain form regions of functional fiber 10, hereinafter referred to as the fiber 10, which can include further regions as described below. As shown in FIG. 1, the fiber is passed through, i.e., dispensed from, a print nozzle 16 for 3D-printing with the fiber. The print nozzle 16 includes a hot end 18 which heats the fiber and from which the heated fiber is dispensed for arrangement into a 3D-print geometry. As explained in detail below, the print nozzle configuration and the conditions at which the fiber is dispensed from the print nozzle cause the surface of the fusion domain 14 to be heated to a temperature that enables the fiber to form geometric turns and that enables the fusion domain to adhere to itself, while prohibiting any significant heating of the functional domain of the fiber. Under these conditions, the materials within the functional domain are maintained in a solid state during the 3D-print process, thereby preserving the structures, positions of materials, and interfaces within the functional domain.

With this ability to preserve the fiber functional domain during the printing process, the functional domain can include any suitable materials for providing a selected 3D-printed object functionality. In embodiments provided herein and described below, the fiber functional domain can include inorganic or organic materials that are electrically conducting, electrically semiconducting, and electrically insulating. The functional domain materials, and elements formed of the materials, can be flexible and alternatively can be brittle, glassy, and rigid. Brittle, rigid fiber materials that are not conventionally 3D-print-compatible are herein rendered amenable to 3D-printing by the circumferential encapsulation of the rigid materials in one or more layers of fiber fusion domain material that provide sufficient flexural strength for 3D-printing. This arrangement results in the functional fiber being well-suited as a feedstock ink for existing 3D-printing processes while providing heretofore unachievable functionality in 3D-printed objects.

In one embodiment, the functional domain of the fiber includes two or more different materials that are arranged in the functional domain in a selected configuration to achieve a selected functionality. For example, the functional domain of the fiber can be arranged to include several materials, e.g., at least three different materials, that are arranged as a functional device. In one embodiment, at least two electrical conductors are in electrical contact with materials in the functional domain. As described in detail below, a very wide range of functionality is achieved with this arrangement.

Figure 2:
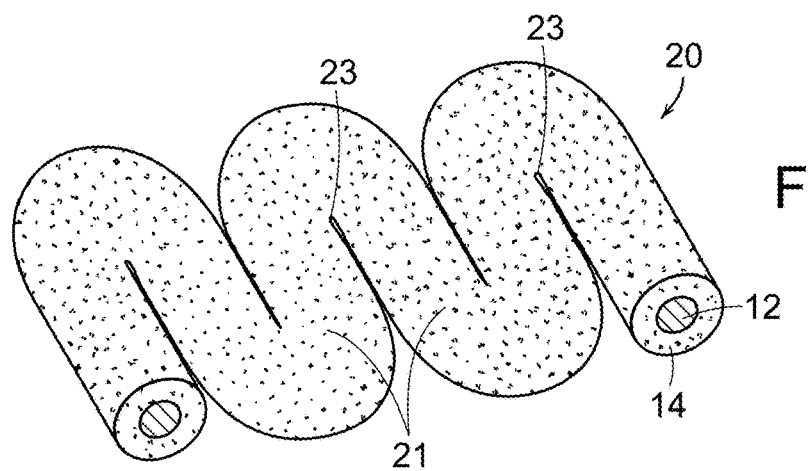
FIG. 2 is a schematic perspective view of a fused arrangement of sections of a functional fiber.

Referring also to FIG. 2, as a continuous length of the fiber 10 is passed through the print nozzle 16, the fiber portion being dispensed from the hot end 18 of the nozzle is arranged in a selected geometric structure, such as the example structure 20 in FIG. 2. As the structure is arranged, the fusion domain 14 of various sections of the fiber is fused to the fusion domain of other sections of the fiber. For example, in one embodiment shown in FIG. 2, the fiber 10 can be arranged as a structure 20 having a number of fiber sections 21 that are in a state of material fusion with another fiber section and aligned along a selected plane; the fused sections 21 are co-linear and displaced from each other by about one fiber thickness. Along the structure 20, the different sections of the fiber fusion domain are fused together along fusion lines 23 to become a continuous solid domain of fiber in structure 20 along the selected plane. The functional domain 12 of the fiber is maintained throughout the structure 20, along a path through the structure itself. The fiber therefore integrally becomes the structure itself; that is, the functional and fusion domains of the fiber are the structure 20.

Two fiber sections 21 that are fused together are permanently connected and cannot be pulled apart. As a result, an arrangement of fused fiber sections is a continuous solid material domain that in general exhibits no boundary between two fused fiber sections included in the material domain. In the embodiments provided herein, there is no air gap between fused fiber sections and there is no interfacial discontinuity between fused fiber sections.

Figure 3:
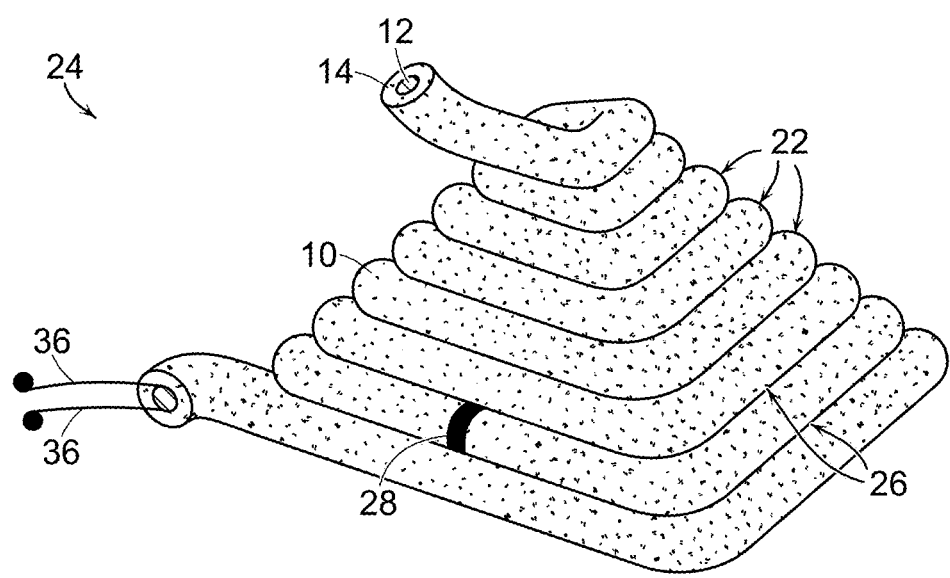
FIG. 3 is a schematic perspective view of a three dimensional pyramidal object 3D-printed of a multimaterial functional fiber.

The example structure 20 in FIG. 2 includes fused fiber sections 21 that are generally aligned along a plane; this plane can be arranged in any selected spatial orientation, and the structure can be extended to include multiple adjacent fused sections, planes of fused sections, and multiple non-planar fiber sections. As a result, the fused fiber sections can be spatially arranged, relative to each other, to form non-planar structures. For example, as shown in FIG. 3, the fiber fusion procedure enables layer-by-layer deposition of a continuous length of fiber 10 into a selected three dimensional object, such as a three dimensional pyramid 24. Sections of the continuous fiber length are here arranged into a stack of fiber layers 22.

In a stack of fiber layers arranged as a three dimensional object such as that shown in FIG. 3, the fusion domain 14 of various sections of a single continuous length of fiber 10 is fused to the fusion domain at nonadjacent sections of the fiber along the length of the fiber, so that the fiber layers are fused together. The fusion of fiber layers thereby produces a continuous solid domain of fiber that is arranged as a selected object structure in three dimensions. The continuous solid domain of fiber includes the functional domain 12 of the fiber as well as the fusion domain 14 of the fiber, and therefore the three dimensional object itself consists of the functional domain 12 as well as the fusion domain 14 of the fiber. The functional domain 12 forms a path of functionality that is integral to and distributed through the three dimensional structure itself.

The structure that is formed of the fiber length can include multiple continuous fiber lengths, and each fiber length can include different functional domain materials and elements as well as different fusion domain materials. In one embodiment, as shown in FIG. 3, along the path of fiber there can be included a site 28 at which the ends of two 3D-printed fibers are fused together to form a continuous length of different fiber materials. Similarly, there can be included in the structure sections of two or more non-planar or adjacent 3D-printed fibers, with different functional domains and/or different fusion domains that are fused together to form a homogeneous solid structure. Thus, it is not required that one single fiber, or one single functional domain, be employed.

The pyramid 24 in FIG. 3 is but one example of a printed structural object formed of the fiber 10 provided herein; substantially any structural object, whether two-dimensional or three-dimensional, that can be 3D-printed, can be formed of the fiber 10. Closed 3 dimensional structures, such as spheres, as well as 2D structures, such as planar designs, can be produced with the fiber. Structures with high curvature turns, kinks and points, and structures with overhanging features such as an arc can also be formed. 2D- and 3D-lattices can be formed, as well as hexagonal, cuboid, or other patterns and geometries. The printed structural object can be solid or can be hollow. In either case, the structure can have walls or an infill pattern of any selected geometry, such as rectangular, triangular, wiggle, honeycomb, zig-zag, linear, rectilinear and concentric fiber patterns for object walls or infill.

The fiber length that is printed into a selected structure, including a functional domain 12 and a fusion domain 14, is a three-dimensional, unsupported object for which one dimension, defined as the longitudinal dimension, is substantially larger than the other two dimensions, defined as the cross-sectional dimensions. The fiber has a continuous longitudinal length, l, that is on the order of meters, e.g., 10 m, 20 m, 50 m, 100 m, or longer, and a cross-sectional diameter, d, that is on the order of between about 50 μm and about 2000 μm, resulting in a longitudinal-to-cross sectional ratio that can be above 1000.

The fiber can be produced by any convenient process that provides a continuous fiber length including a functional domain and a fusion domain along the longitudinal fiber length. In one preferred process embodiment, the fiber is thermally drawn from a multimaterial fiber preform; in one embodiment, this thermal drawing is conducted as prescribed in U.S. Pat. No. 7,295,735, issued Nov. 13, 2007, the entirety of which is hereby incorporated by reference. As described in detail below, the preform includes any number of different materials that are selected for the fiber functional domain and the fiber fusion domain, with the materials arranged in a macroscopic geometric configuration corresponding to, though not necessarily equivalent to, the desired geometry of the fiber domains. The preform has a diameter, D on the order of about 10 mm to about 100 mm and a length, L, on the order of centimeters, e.g., less than 100 cm or less than 50 cm. The preform is characterized by a ratio of longitudinal to cross sectional dimensions that is typically between about 2 and about 100.

Figure 4A:
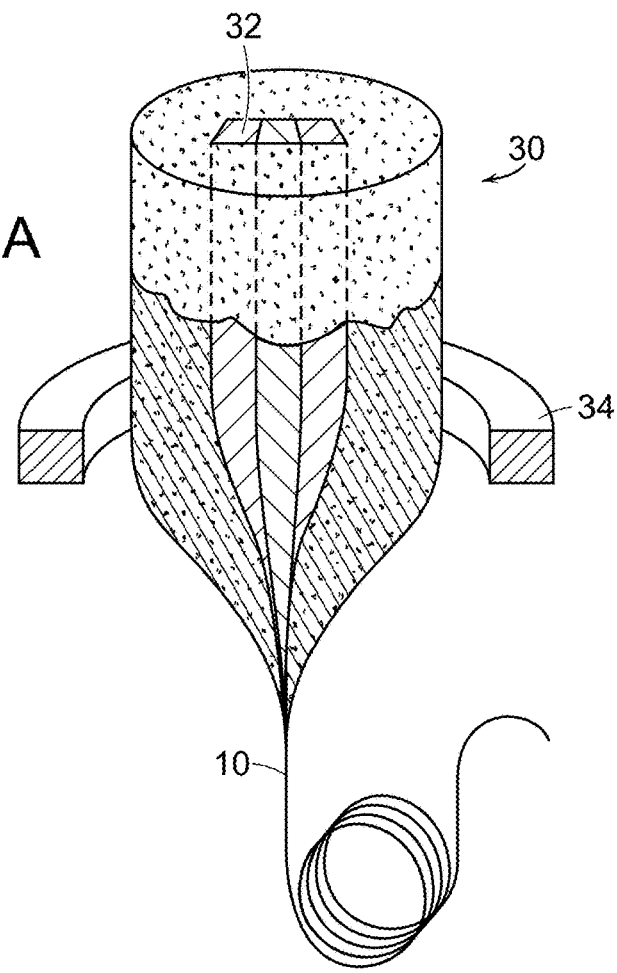
FIG. 4A is a schematic perspective view of a multimaterial functional fiber preform as the preform is thermally drawn into a multimaterial functional fiber.

As explained in detail below, and referring to FIG. 4A, in drawing a fiber preform into a fiber, the preform 30, with a selected preform arrangement 32 of materials for a desired fiber functionality, is subjected to heating and deformation under thermal fiber drawing conditions, e.g., through the hot zone 34 of a fiber draw tower, into a fiber 10 having an extended fiber length of substantially uniform cross section. The fiber drawing process forms intimate material interfaces and reduces preform element sizes to the microscale and the nanoscale along the longitudinal fiber length, and forms an extended longitudinal fiber length including one or more functional domains that provide electrical, optical, and other functionalities. Thermal drawing of a preform into a fiber is but one embodiment provided herein for production of a fiber, and is described in detail below.

Figure 4B:
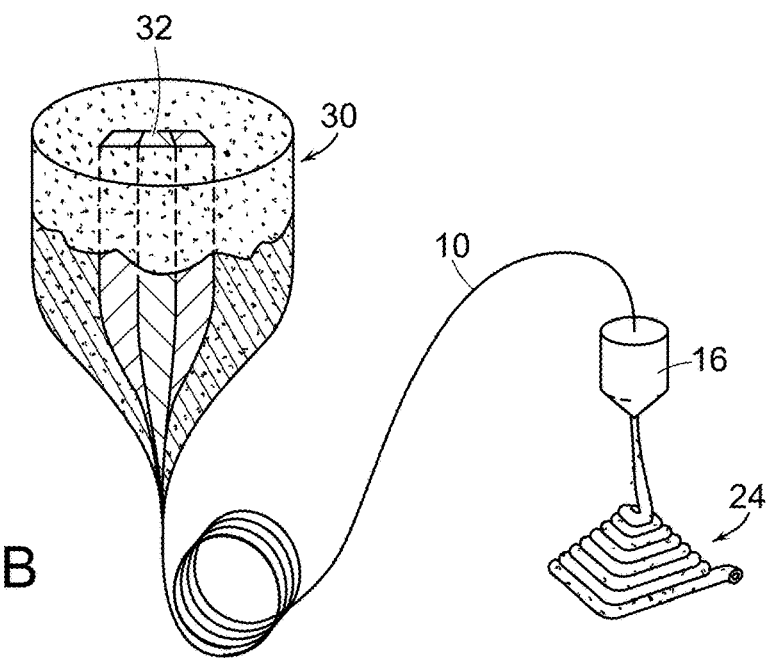
FIG. 4B is a schematic perspective view of the multimaterial functional fiber preform and fiber of FIG. 4A being fed into the nozzle of FIG. 1 for 3D-printing of an object.

Referring also to FIG. 4B, with this fiber preform thermal drawing process, the resulting drawn fiber 10 includes microscale and nanoscale functional components with a length scale in the kilometer range that are formed into a structural object by dispensing through a print nozzle 16 into a selected object arrangement 24. A coupling of fiber preform drawing techniques with 3D-printing techniques as provided herein thereby enables 3D-printing of complex structural morphologies with integral, inherent functional capabilities distributed in the structural morphology. Thus, with thermal drawing of a fiber with customized materials and internal structural arrangement, there can be 3D-printed a customized functionality integral with a structural object. The 3D-print method provided herein is thereby compatible with any multimaterial fiber in the sense that the print method can accommodate a very large range of materials and structures provided within the fiber functional domain, enabling printing of materials not only with the similar melting and glass transition temperatures typical of thermally drawn fiber, but essentially any materials or devices that can be incorporated into the fiber.

Thus, the fiber 10 can include a wide range of functional structures and materials, of varying shape and size, as well as structured voids and non-functional, e.g., aesthetic domains. The fiber 10 can include multiple different functional domains along the length of fiber and across the cross section of the fiber. In two example fiber embodiments, shown in FIGS. 5A-5B, the fiber functional domain 12 can include concentric regions of material, can include symmetric 15 and non-symmetric 17 arrangements of structures, and can include multiple elements 15, 17, 19 across the fiber cross section, each element being of a selected geometry, including generally circular 17 and generally rectangular elements 19. With this flexibility in design, the fiber 10 can exhibit a wide range of different functionalities as-provided by a plurality of materials and structures of the functional domain. The fusion domain 14 can also include multiple layers 14 and materials as shown in FIG. 5A.

Referring also to FIGS. 6A-6B, the functional domain 12 of the fiber 10 can in one embodiment include structures and regions 25 that extend continuously along the length of the fiber 10, as shown in FIG. 6A. In a further embodiment, shown in FIG. 6B, the functional domain 12 of the fiber 10 can include structures, elements 27, and regions 29 that are discontinuous, spaced apart along the longitudinal fiber length and/or spaced apart across the cross section of the functional domain 12. Different functional domain elements, structures and materials can be included, disposed in sequence along the fiber length or disposed randomly through the functional domain. Multiple identical structures can be distributed along the fiber length and/or single, individually different structures can be included along the length. Each different functional domain structure can exhibit a different capability, property, stimuli response, or other feature. In a further embodiment, the fiber 10 can include both functional domain structures or regions that are continuous along the fiber length as well as functional domain structures or regions that are discontinuous along the fiber length, thereby combining the embodiment of FIG. 6A with the embodiment of FIG. 6B.

With this wide latitude for arrangement of functional domain elements, structures, and materials, the fiber provided herein can be arranged to impart many different functions to a printed structure consisting of the fiber. The functional domain of the fiber possesses one or more functionalities that are defined here as an active or passive capability, e.g., in which the object from which the fiber is printed can react or produce signals as a result of interaction with electromagnetic, electronic, optical, thermodynamic, mechanical, biological, or chemical stimuli in the fiber environment or can provide to the fiber environment a signal, a sensory output, such as an optical output, an actuation, or power. The functional domain can therefore detect a physical quantity and respond with an electrical signal that is transmitted through the fiber by electrical conductors. The functional domain can be arranged or adapted for a particular purpose with a particular function, and thereby, may be considered as a device region; i.e., the functional region is a functional device region. Further, the printed structure can be a three dimensional object having a structural function as well as an interactive function such as sensing or display.

To achieve a selected functionality, the functional domain of the fiber can include electrically conducting materials, electrical conductors, electrically conducting regions, and devices; can include electrically insulating materials, regions, and devices; and can include semiconducting materials, regions, and devices. Organic, inorganic microelectronic, solid state, and other materials can be included in the fiber functional domain. For example, polymers, metals, piezoelectric materials, semiconductors, ceramics, composites, liquids, gases, and other elements can be included. Examples of electrically conducting materials include solder compounds such as BiSn and $In_2Bi$, low melting-temperature metals such as Sn, Bi, and In, conducting polymers such as carbon-doped polyethylene and polycarbonate, and high melting-temperature metals such as tungsten and copper. Semiconducting materials can include chalcogenide-based, that is, S-, Se-, and Te-containing compounds such as arsenic-selenide and arsenic-sulphide, as well as Group IV-based elements and compounds such as Si and SiGe. To achieve fusion between fiber sections during the 3D-printing process, the fusion domain of the fiber can include thermoplastics, thermosets, and light-curable materials, and epoxy or other materials like epoxy that solidify upon exposure to stimuli.

As a result of this wide range of material possibilities for fiber functional and fusion domains, the functionality of an object printed with the fiber provided herein can be customized by selection of corresponding materials to be included in the fiber. It can be recognized that the selected fiber materials must be compatible with the fiber production process, e.g., thermal drawing from a fiber preform. In the discussion below, example materials are described, but it is to be recognized that such are not limiting.

Referring again to FIGS. 3 and 6B, in one embodiment, the elements included in the functional domain of the fiber 10 are connected to one or more electrical and/or mechanical connections 36 to deliver and/or receive inputs and outputs from the environment surrounding the fiber. Stimuli, electrical signals, optical signals, electrical power, and other input and output is communicated and delivered to and from an object, such as the pyramid 24 in FIG. 3, by way of one or more connections 36 to the elements in the functional domain of the fiber 10. At one or both ends of the fiber 10, the elements to which a connection is desired are exposed and then connected in any suitable way to an external element, such as a circuit, power source, computer, display, or other external element.

In one embodiment, an object is formed by 3D-printing with a length of fiber that includes one or more electroluminescent (EL) functional domains. The resulting printed EL object thereby operates as a 3D EL display, and can exhibit a wide-angle, omnidirectional, continuous viewpoint. As such, 3D volumetric displays, robotics, consumer electronics, medical monitoring devices, internet-of-things objects, and other applications are well-addressed by a fiber-based, three-dimensional, EL object formed by printing a fiber into the geometrical structure of the EL object.

Figure 7A:
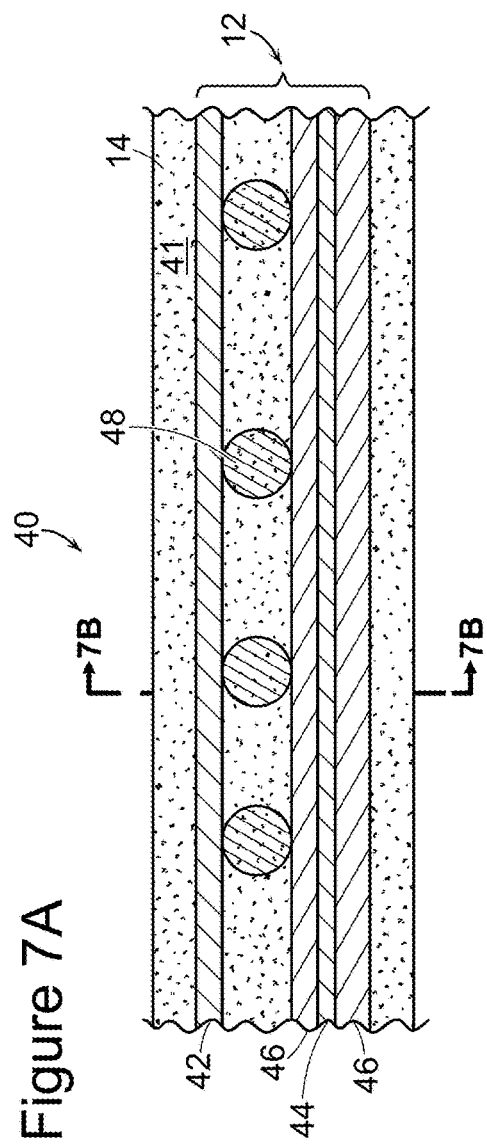
FIGS. 7A-7B are a cross-sectional longitudinal side view and cross-sectional view, respectively, of an electroluminescent fiber.
Figure 7B:
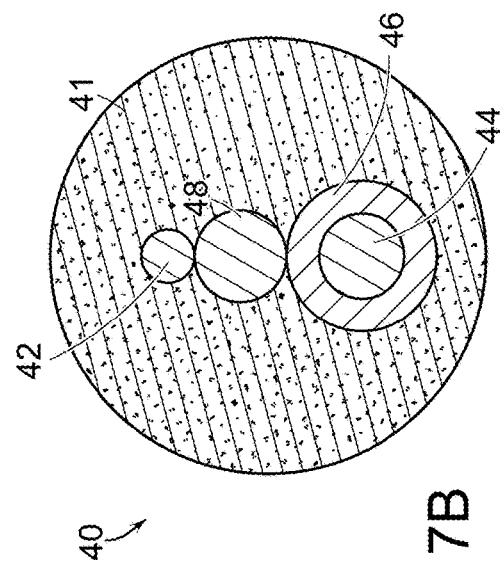

Referring to FIGS. 7A-7B, there is shown in side view and in cross-section, respectively, a section of an electroluminescent fiber (EL fiber) 40 provided in an embodiment herein for 3D-printing an EL object. The EL fiber 40 includes an electrically insulating fusion domain material 41 and a functional domain 12 including materials that provide electroluminescent functionality. In one embodiment of such, there is included in the functional domain 12 a first electrical conductor 42 and a second electrical conductor 44, with the two electrical conductors 42, 44 extending the length of the functional domain. One of the electrical conductors, here the second electrical conductor 44, is coated with a phosphor layer 46 or other electroluminescent material. Discrete, spatially separated electrically conducting elements 48, e.g., spheres, form EL pixel sites that are disposed along the length of the functional domain. Each electrical conducting element 48 is in electrical contact with both the first electrical conductor 42 and the phosphor layer 46.

The functional domain of the EL fiber extends in the plane of the fiber cross section from the edge of the first electrical conductor 42 to the edge of the phosphor layer 46 coating the second conductor 44. If the functional domain is defined in cross-section as a generally circular region, then electrically insulating material 41 included in the fusion domain can also be included as electrically insulating material 41 in the functional domain 12 around the other functional domain elements. With this arrangement, in operation of the EL fiber 40 the application of a voltage between the first conductor 42 and the second conductor 44 causes electroluminescence in the phosphor 46 at each site along the fiber at which a conducting EL pixel element 48 is disposed.

Figure 8:
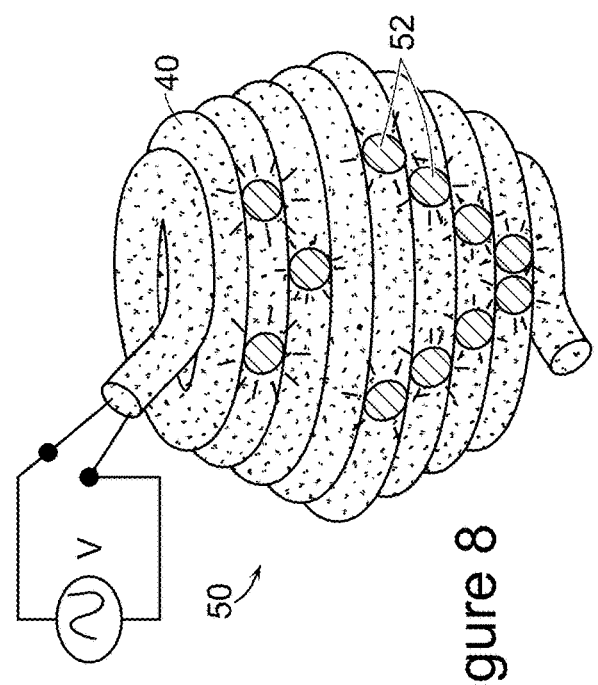
FIG. 8 is a schematic perspective view of an electroluminescent object formed, by 3D-printing, of the multimaterial electroluminescent fiber of FIGS. 7A-7B.

Referring to FIG. 8, a three dimensional structure such as a closed sphere 50 can be 3D-printed of the EL fiber 40, with EL pixel sites 52 that light up in response to application of a voltage, V, between the first and second electrical conductors of the fiber functional domain. The pixel sites 52 can be a priori specified along the length of fiber such that a selected pixel display arrangement is provided in the object that is printed of the EL fiber 40. FIG. 8 illustrates an example of such, in which pixel sites are selected so that the sphere 50 displays a smiling face.

This rudimentary example illustrates the principal of a 3D-printed electroluminescent object formed of EL fiber and is not limiting. Other examples of EL fiber-based object configurations include uniform disposition of separated pixel sites throughout an entire 3D-printed structure, creating light patterns in 3-dimensions, and disposition of different pixel arrangements around a single 3D-printed object, offering varying displayed images at different viewpoints.

The EL fiber 40 of FIGS. 7A-7B can be formed of any suitable materials that accommodate a given printed object application as well as fiber production method, as explained in detail below. The first and second electrical conductors can be formed of a suitably conducting material, e.g., wire of copper, tungsten, gold, silver, tin, aluminium, cadmium-copper, zirconium-copper, nickel-copper, or other conducting material. The electrically conducting EL elements, e.g., spheres, that are distributed along the length of the EL fiber and that make electrical connection between the two electrical conductors can be formed of, e.g., BiSn. The phosphor layer over the second conductor can be provided as, e.g., ZnS doped with a selected dopant such as Cu, yttrium aluminium garnet (YAG), manganese or aluminium, doped zinc-cadmium-sulphide (ZnCdS), and doped zinc-cadmium-sulfur-selenide (ZnCdSSe). A dielectric formed of a high dielectric-constant material such as poly(vinylidene fluoride) (PVDF) or a ceramic oxide like barium or strontium titanate can be provided in the fiber functional domain, disposed around the second electrical wire 44, which acts to intensify the electric field onto the phosphor, these functional domain structures, as well as in the fiber fusion domain.

The first electrical conductor can have a diameter of, e.g., between about 20 µm and about 100 µm and the second, coated electrical conductor can have a diameter of, e.g., between about 0.20 mm and about 0.30 mm. The electrically conducting EL elements, e.g., spheres, that are distributed along the length of the EL fiber and that make electrical connection between the two electrical conductors can have a diameter of, e.g., between about 80 µm and 100 µm. The phosphor layer over the second conductor can be provided with a thickness of, e.g., between about 0.01 mm and about 0.03 mm.

With this size scale, an EL object that is 3D-printed of the EL fiber can have high resolution and can be adapted for many applications. There further can be included in the EL fiber a hollow optical transmission region for enabling display of optical signals delivered through the EL fiber as well as display of light emitted from the fiber's EL components. An EL object formed of the EL fiber can be fully shape-customizable and can have lighted pixels incorporated in highly-curved sections, producing a shape-customizable highly-curved display. Further, the pixelated display on an EL object can be three dimensional. Such a three dimensional display can provide different images at different viewpoints of the object.

Applications of such EL-based objects include a 3D-printed eye of a toy that acts as a curved display, a 3D-printed globe that displays the world map, and a 3D-printed object that senses and produces light signals upon stimuli from the environment. Further, am EL-based object enables a 3D-printed visualization of 3D-shaped structures with lighted pixels providing additional data on the structure. For example, a heart model that is 3D-printed with EL fiber can highlight defects in a patient's heart through the lighted pixels. A building model 3D-printed with EL fiber having lighted pixels at locations with poor structural stability can help architects and engineers notice sites of interest.

Figure 9A:
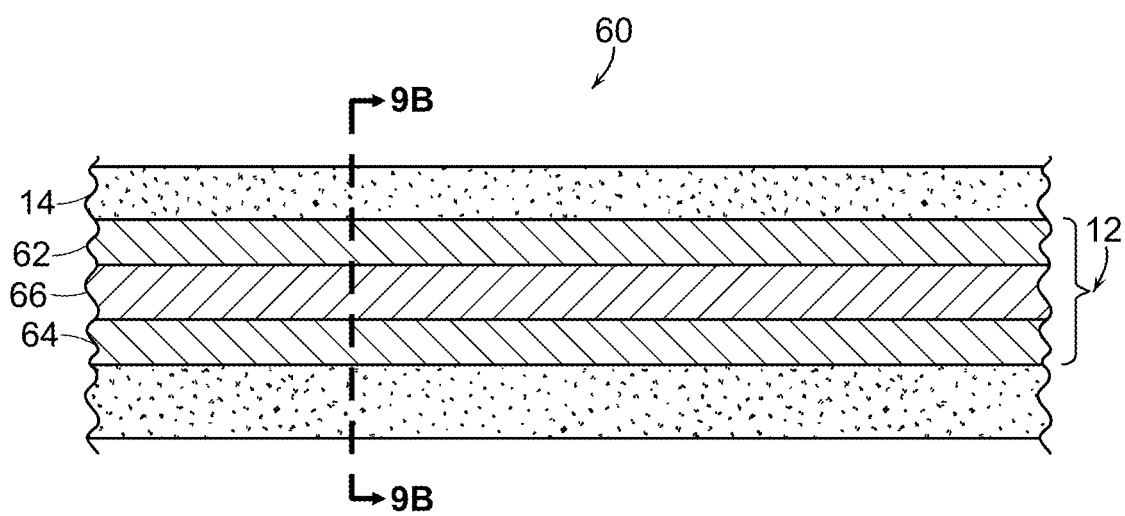
FIGS. 9A-9B are a cross-sectional longitudinal side view and cross-sectional view, respectively, of a photodetecting fiber.
Figure 9B:
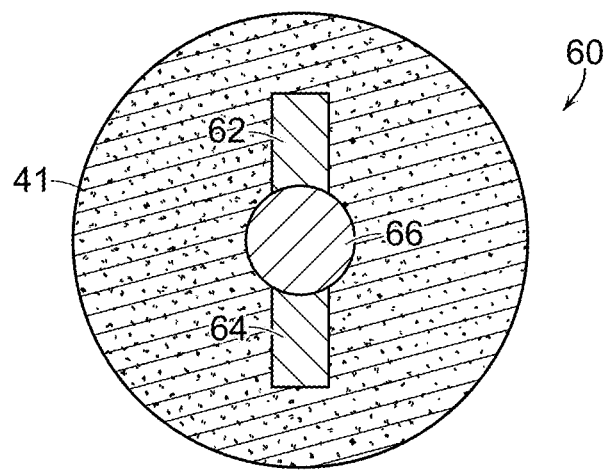

In a further embodiment, an object is formed by 3D-printing with a length of fiber that includes one or more photodetecting functional domains. Referring to FIGS. 9A-9B, there is shown in side view and in cross-section, respectively, a section of a photodetecting fiber 60 provided in an embodiment herein for producing a photodetecting object by printing of the photodetecting fiber 60 into the arrangement of the object. The photodetecting fiber 60 includes an electrically insulating fusion domain 14 and a functional domain 12 with one or more photodetecting elements. When printed into a structural object arrangement, the photodetecting fiber imparts photodetecting functionality to the object for omnidirectional localized detection of light by the object.

In one embodiment, the photodetecting fiber 60 includes a photodetecting element that extends continuously along the length of the photodetecting fiber. As shown in FIGS. 9A-9B, in this arrangement the photoconducting element includes first and second electrically conducting regions 62, 64, between which is disposed a region of photodetecting material 66. The functional domain of the fiber thereby extends in plane of the fiber cross section from an edge of the first electrical conducting region 62 to an edge of the second conducting region 64. The fusion domain 14 of the photodetecting fiber is provided with an electrically insulating material. If the functional domain 12 is defined in cross-section as a generally circular region, then electrically insulating material 41 included in the fusion domain can also be included as electrically insulating material 41 in the functional domain 12 around the other functional domain elements. The photodetecting fiber can be arranged and produced in any suitable manner and particularly as taught in U.S. Pat. No. 7,292,758, issued Nov. 6, 2007, the entirety of which is hereby incorporated by reference.

In one embodiment, the photodetecting fiber contains conducting polymers such as conducting polyethylene, conducting polycarbonate or metallic materials such as bismuth, tin, indium, lead-tin, bismuth-indium, bismuth-tin, tin-zinc, tungsten, or copper wire as either the first or second electrically conducting region, chalcogenide semiconductors such as selenium, arsenic-selenide, arsenic-sulphide, arsenic-selenide-telluride or germanium-arsenic-selenide-telluride as the photodetecting material, and polycarbonate, cyclic olefin co-polymer, polysulfone, polyetherimide or polyethersulfone as the electrically insulating region.

Figure 10A:
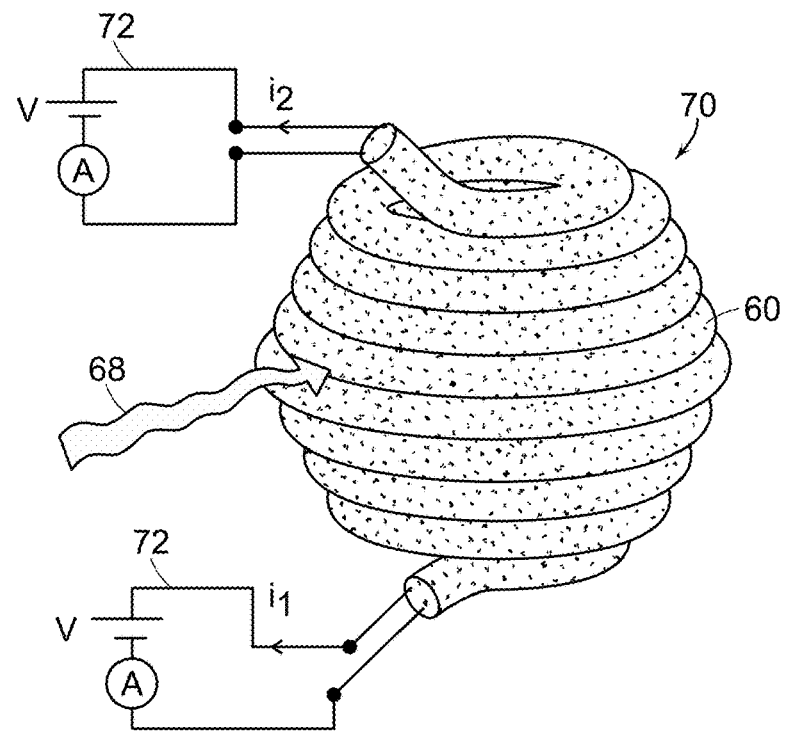
FIG. 10A is a schematic perspective view of a photodetecting object formed, by 3D-printing, of the multimaterial photodetecting fiber of FIGS. 9A-9B.

With the photodetecting fiber arrangement, in operation of the photodetecting fiber 60 the application of a voltage between the first conductor 62 and the second conductor 64 applies a voltage across the photodetecting material 66. Referring to FIG. 10A, a three dimensional photodetecting structure such as a closed sphere 70 can be printed of the photodetecting fiber 60. The photodetecting material region 66 produces an electrical current in response to impingement of illumination 68 onto the fiber of the sphere 70. This electrical current can be measured in one or more circuits 72 that are connected to the electrical conductors in the fiber 60 from which the sphere 70 is formed.

Figure 10B:
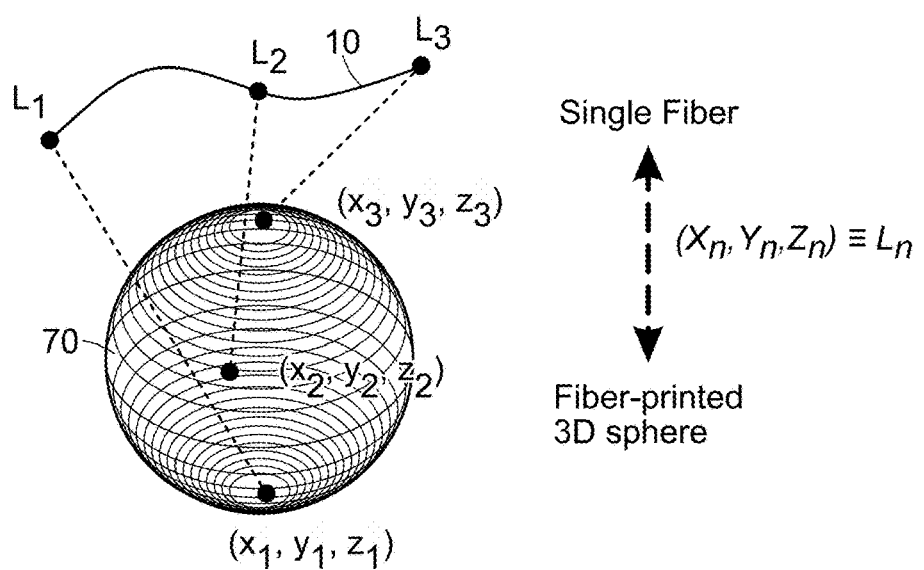
FIG. 10B is a schematic view of modeling parameters employed to map a site of illumination on a 3D-printed sphere with a corresponding site along a length of fiber from which the sphere is 3D-printed.

When the extent of a beam of incident illumination 68 that impinges the sphere 70 is generally on the size scale of the photodetecting fiber, there can be achieved a mapping between the longitudinal photodetecting fiber length and the three dimensional object structure, to ascertain the location of illumination impingement on the structure. Referring also to FIG. 10B, a site in three dimensions, $X_n$, $Y_n$, $Z_n$), on the sphere 70 can be mapped to a site, $L_n$, along the photodetecting fiber longitudinal axis. Then in operation, with a measurement circuit 72 at each end of the photodetecting fiber 70, there can be measured the electrical current flowing through the two circuits, $i_1$ and $i_2$ as light impinges at any arbitrary position on the sphere 70.

The ratio of the electrical current flowing through the two measurement circuits is distinct to the site, $L_n$, along the fiber length, of light impingement by:

$$L_n = \frac{\delta}{2}\ln\left(\frac{e^{\frac{L}{\delta}} + \frac{i_1}{i_2}}{e^{\frac{-L}{\delta}} + \frac{i_1}{i_2}}\right), \quad (1)$$

where $L_n$ is the length from one end of the fiber to an arbitrary site selected along of the fiber, L is the total longitudinal length of the fiber, $i_1/i_2$ is the measured current ratio and δ is the characteristic length of the photodetector, given by:

$$\delta = \sqrt{\frac{\rho_{PD}}{\rho_{EC}}S_{EC}\frac{\pi}{2}}, \quad (2)$$

where $\rho_{PD}$ and $\rho_{EC}$ are the resistivity of the photodetecting material and electrical conductor, respectively, and $S_{EC}$ is the cross-section area of the electrical conductor. With the calculated value of $L_n$ and the one-to-one mapping algorithm, there can be specified the x-y-z coordinate position of the detected light impingement.

In a method to achieve this, a suitable algorithm can be implemented, e.g., in the commercial MATLAB environment, from The Math Works, Natick, Mass. In a suitable algorithm, the print path of fiber during a 3D-print process to form an object is given. The print path contains every x-y-z spatial point of a 3D object being printed and the length of fiber to be dispensed along the distance between each two adjacent x-y-z spatial points on the object. A summed dispensed length of fiber can then be assigned to each x-y-z spatial point. This summed dispensed length of fiber, i.e., $L_n$ as given above, is the total length of fiber dispensed prior to printing at a specific x-y-z spatial point. $L_n$ is unique for each of the x-y-z spatial point because the 3D structure is printed from a single continuous fiber. Hence, given the value of $L_n$ from the light illumination experiment into the algorithm, the algorithm will search the different x-y-z spatial points and output the x-y-z spatial point that has the unique $L_n$ value equal to the input $L_n$ value.

This demonstrates that with a photodetecting object 3D-printed of photodetecting fiber, light can be locally detected by an arbitrary 3D-printed structure with only an electrical connection at each end of the length of photodetecting fiber included in the structure, as opposed to discrete electrical connections made to multiple discrete sensors disposed on a structure. A photodetecting object such as the photodetecting sphere is also uniquely capable of full omnidirectional illumination sensing without the need for optical components such as mirrors or lenses. Such a three dimensional structure with omnidirectional light-sensing capability can therefore address applications such as solar tracking for satellites, energy harvesting, light management applications, e.g., in automobiles, and biomedical applications such as artificial eyes.

A 3D-printed photodetecting object as provided herein can be arranged to provide photodetection that is application-specific. For example, the 3D-printed object can be arranged as printed body armor that senses laser illumination at one or more selected illumination frequencies. The location of the laser illumination on the armor can be spatially resolved, allowing the wearer to determine the position of the laser origin. This enables optical communication and information delivery with the armor. In another application, robots including 3D-printed photodetecting parts can be controlled with optical signals and/or can respond to specific optical stimuli, such as ambient sun light or laser illumination.

A further example application of the printed photodetecting object addresses solar cell and light management technology. Current efficiency in energy harvesting of light depends on the intensity of sunlight that falls upon the solar cells. The photodetecting object is an omnidirectional light tracking device that provide feedback on the position of sunlight. Similarly, fiber-based photodetecting objects provided heroin can be employed in household, factory, and office environments equipment to inform users about the distribution of light around their region such as to better optimize and manage the settings of light sources.

The photodetecting object of FIG. 10 is an example of a bread class of three dimensional, macroscale sensing objects provided herein having microscale sensing elements that are integral with and fully connected throughout the bodily structure of the sensing objects. The 3D-printing of such sensing objects with functionally sensing fiber provides an ability to form customizable-shaped sensors with precisely positioned sensing elements integral to the sensing object. Because the sensing mechanism is incorporated into the object itself, few limitations are imposed on the object geometry. Curved, rigid surfaces and complicated customizable structures can therefore be addressed with the sensing paradigm. Further, by consolidating the structure and function of a 3D-printed fiber-based object, application-dependent properties such as weight, durability, and size and shape of sensing mechanisms can be achieved.

Figure 11:
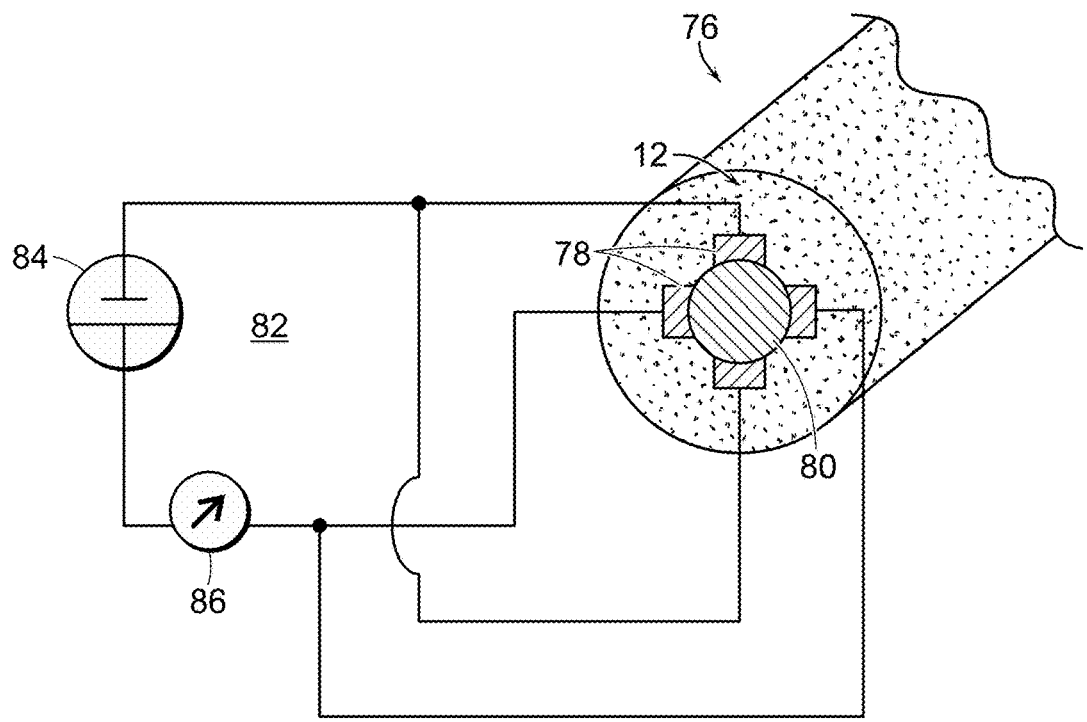
FIG. 11 is a schematic view of a thermal detection fiber to be employed for 3D-printing of a thermal detection object.

Referring now to FIG. 11, in a further embodiment of an object 3D-printed with a functional fiber, there is provided the ability to 3D-print a thermal sensing object of a continuous length of thermal sensing fiber 76. The thermal sensing fiber 76 includes a functional domain 12 having conducting and semiconducting elements 78, 80 that together produce a signal in response to heat in the vicinity of the fiber, and therefore, in the vicinity of the thermal sensing object formed of the fiber. In one example scenario, the thermal sensing fiber 76 includes multiple electrical conductors 78 making contact to a thermally sensitive material such as a semiconducting material element 80. For example, a chalcogenide glass such as $Ge_{17}As_{23}Se_{14}Te_{46}$ (GAST), or any variation of the composition $Ge_xAs_{40-x}Se_yTe_{60-y}$, can be employed as a thermally sensitive material, with electrodes provided as, e.g., an alloy of 96% Sn-4% Ag, with polysulfone (PSU) employed as an electrical insulating material in the functional domain and as a fusion material in the fusion domain. The arrangement and production of the thermal sensing fiber is carried out in one embodiment provided herein as taught in U.S. Pat. No. 7,567,710, issued Jul. 29, 2009, the entirety of which is hereby incorporated by reference.

With this fiber arrangement, connection from the electrical conductors 78 to a circuit 80 is configured for applying a voltage 84 between the conductors 78, across the sensing material 80. Measurement 86 of electrical current or other circuit parameter is supported in the circuit 80. Heat from the fiber environment is conducted through the fiber to the sensing material 80, at which thermally-excited electronic charge carriers are generated, changing the electrical resistivity of the material 80. This change in resistivity in turn adjusts the electrical current through the circuit 82; the thermal sensing fiber thereby operates as a changing resister in the circuit 82. The fiber thereby transduces a change in temperature into a measurable change in a circuit parameter, such as voltage, current, or capacitance.

As a result, a thermal sensing object formed of the thermal sensing fiber can be employed as a real-time, distributed temperature sensor that can be integrated into a user environment with a functional structure as well as temperature sensing capability. Large structures, such as automobiles, spacecraft, and airplanes can include structural features formed of the thermal sensing fiber to monitor temperature locally across the structure, enabling highly localized detection of thermal events that may require attention.

In one embodiment, there is 3D-printed from the thermal sensing fiber a vessel, such as a cup, that informs a user of the temperature distribution of the liquid, e.g., wine, coffee, or other beverage, within the cup. Measurement of real-time spatial temperature distribution of a liquid is useful because changes in temperature of a liquid can affect the taste and quality of the liquid. Ina further embodiment, pipes that transfer hot liquid from one pipe end to the other pipe end require low heat loss from the transfer liquid. Different pipe cross-sections, such as circular, cube, triangular, or ellipsoid, can be 3D-printed with the thermal sensing fiber to provide real-time spatial temperature distribution of the liquid flow for optimizing pipe shape to minimize heat loss in the pipe.

Figure 12:
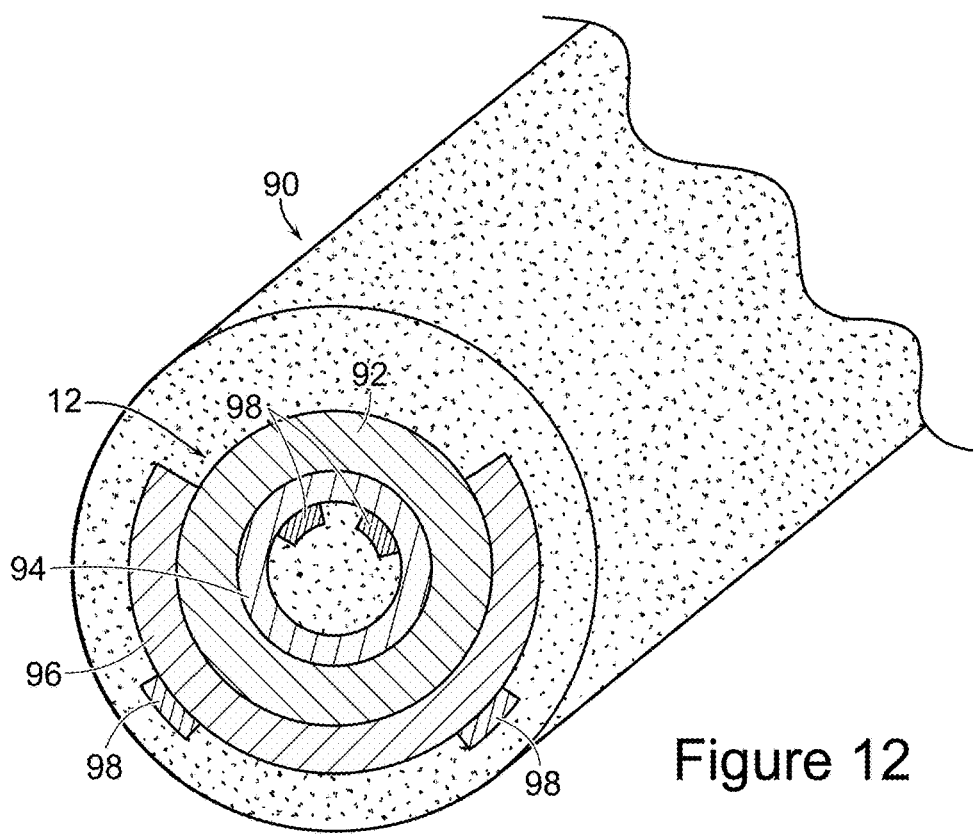
FIG. 12 is a schematic view of a piezoelectric fiber to be employed for 3D-printing of a piezoelectric object.

Referring to FIG. 12, in a further embodiment, a structural object is 3D-printed using a piezoelectric fiber 90 as the printed object material. Here the fiber 90 produces and/or detects vibrations in the environment of the piezoelectric object from which the piezoelectric fiber 90 is produced. The fiber 90 includes in the fiber functional domain 12 a region of non-centrosymmetric material 92, such as a piezoelectric material. Electrical conductors 94, 96, make contact to the piezoelectric material region 92, and additional conducting elements 98 make contact to the first electrical conductors 94, 96. All of these functional domain regions extend along the length of the piezoelectric fiber 90. With this arrangement, the application of a time varying electric field between the conductors 94, 96, an acoustic waveform is generated in the active region via the reverse piezoelectric effect. Conversely, when an acoustic perturbation is introduced to the fiber, e.g., by a mechanical stress or strain, the piezoelectric material can generate an electric field between the conductors 94, 96 that can be detected by measuring the electrical potential difference between the conductors 94, 06.

The piezoelectric material can be provided as, e.g., poly (vinylidene fluoride), barium titanate, lead titanate, lead zirconate titanate, zinc oxide, or other selected material, while the conductors can be supplied as conducting polymers such as conducting polyethylene or conducting polycarbonate, or can be supplied as a metallic material such as bismuth, tin, indium, lead-tin, bismuth-indium, bismuth-tin, tin-zinc, tungsten, copper wire or any other selected material. The arrangement and production of the piezoelectric fiber is carried out in one embodiment provided herein as taught in as taught in U.S. Pat. No. 9,365,013, issued Jun. 14, 2016, the entirety of which is hereby incorporated by reference.

With a three dimensional object 3D-printed of the piezoelectric fiber 90 and connected to a circuit, e.g., a circuit 72 as in FIG. 10, a piezoelectric 3D-printed object can produce uniform vibrations over the entire volume of the object under AC voltage application. Such a vibratory object can well-address applications in which counter vibration is desirable. For example, a 3D-printed piezoelectric fiber-based structure can be custom-produced for sports equipment, such as tennis rackets, hockey sticks, baseball bats, and golf clubs. The piezoelectric fiber-based structure can provide a counter vibration that mitigates harsh vibrational absorption of energy from the sports equipment to the athlete.

In a further application, a piezoelectric object can be employed to monitor environmental stress and strain. For example, a 3D-printed structure formed of the piezoelectric fiber can be custom-printed for adaptation to an implant or prosthetic device, to track the stress sustained on the implant in real-time. Similarly, a 3D-printed prosthetic including the piezoelectric fiber can be equipped with stress-monitoring capability to optimize the dimensions and structures of the prosthetic for different users.

Alternatively, the piezoelectric fiber enables the production of custom objects that provide distributed vibration throughout the object. This can be employed for, e.g., vibrational stimulation of patients with nerve-related pain, such as peripheral small fiber neuropathy. A 3D-printed piezoelectric object with a custom geometry that is tailored to the needs of a specific patient can be employed to administer vibration to the patient undergoing treatment, allowing for perfect contour matching of the vibratory object device to the patient's body shape.

Figure 13:
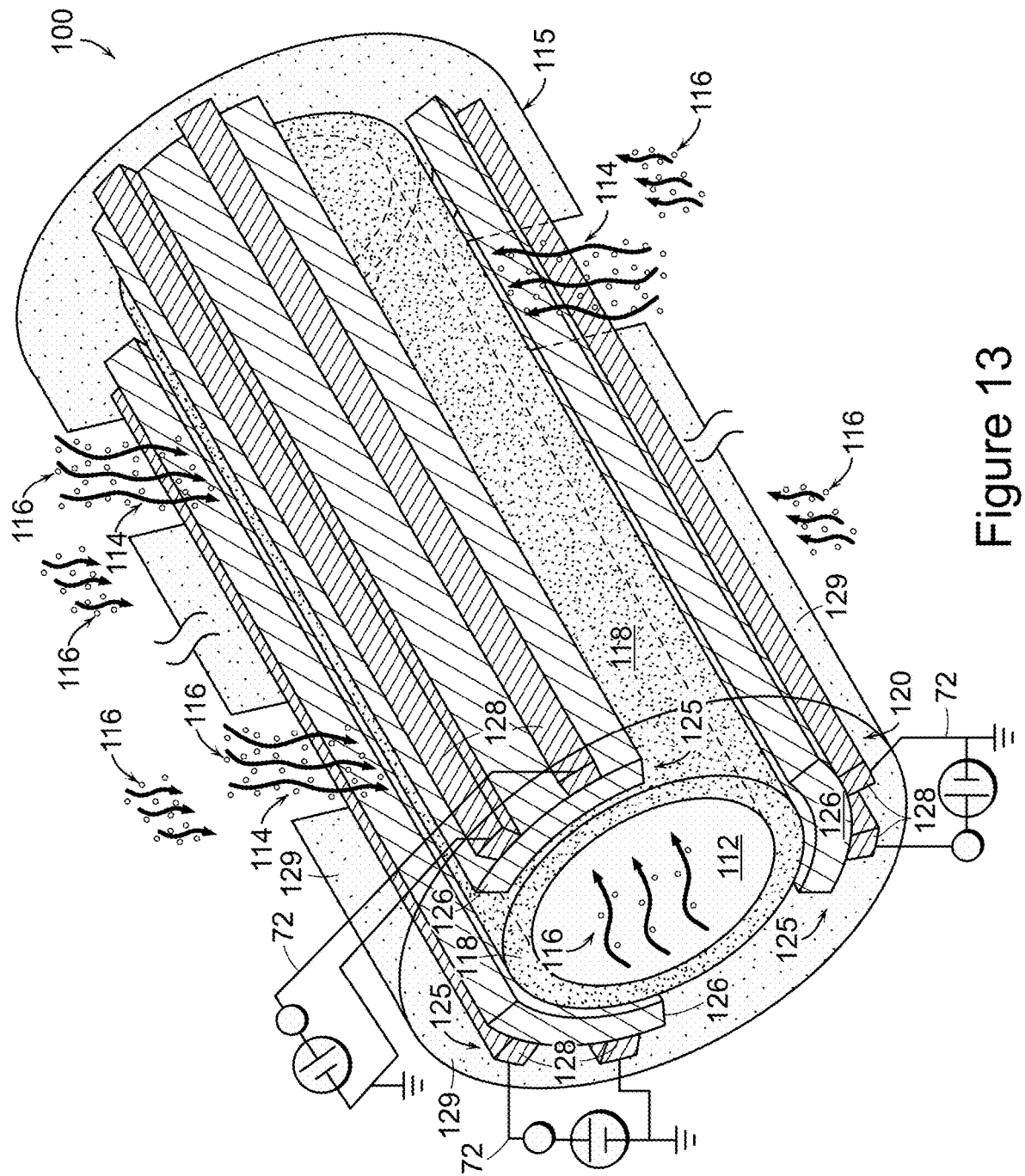
FIG. 13 is a schematic view of a chemical sensing fiber to be employed for 3D-printing of a chemical sensing object.

Referring to FIG. 13, in a further embodiment, there is provided a chemical sensing fiber 100 that is 3D-printed into a chemical sensing object. A conduit 112 or other capillary is included in the chemical sensing fiber 100, along with intake apertures 114 in the fiber wall 115 to enable the transportation of species 116 to be sensed into the fiber 100. Sensing material 118 is provided as a layer of, e.g., luminescent or chemiluminescent material that can interact with the species 116 and develop a luminescent output in response to the interaction. Photoconducting elements 126 are positioned to detect the luminescence and provide an electrical output signal to electrodes 128. The electrodes 128 in turn are connected with external circuits 72 for application of a bias voltage between the electrodes for detection of the photodetecting elements 126. When an intake species 116 enters the fiber 100 and interacts with the sensing material 118, light is produced that reaches the photoconducting elements 126, thereby providing an electrical current indication in the sensing circuitry 72 as a direct signal from transduction sites along the fiber.

The fiber can be produced with, e.g., a photoconducting glass such as Selenium-Sulphide ($Se_{97}S_3$), a fluorophore sensing material such as fluorescein, with conductors such as a metallic tin-lead alloy ($Sn_{63}Pb_{37}$), CPC and Polysulfone (PSU). The arrangement and production of the chemical sensing fiber is carried out in one embodiment provided herein as taught in U.S. Patent Application Publication No. US 2014/0212084, published Jul. 31, 2014, the entirety of which is hereby incorporated by reference.

With this arrangement of a chemical sensing fiber 100, a 3D-printed chemical sensing object is configured to provide highly localized chemical sensing that has three dimensional sensing capabilities in the sensing field and that is tailored in geometry and structural as well as sensing function to a particular application. In one embodiment, there is provided a 3D-printed tank or piping arrangement having chemical sensing capability and arranged for holding a chemical liquid or gas. A change in the property or the concentration of the liquid or gas can be detected by the 3D-printed chemical-sensing enclosure, and the local spatial site of the change can be determined by the 3-D-printed enclosure for repair.

Figure 14A:
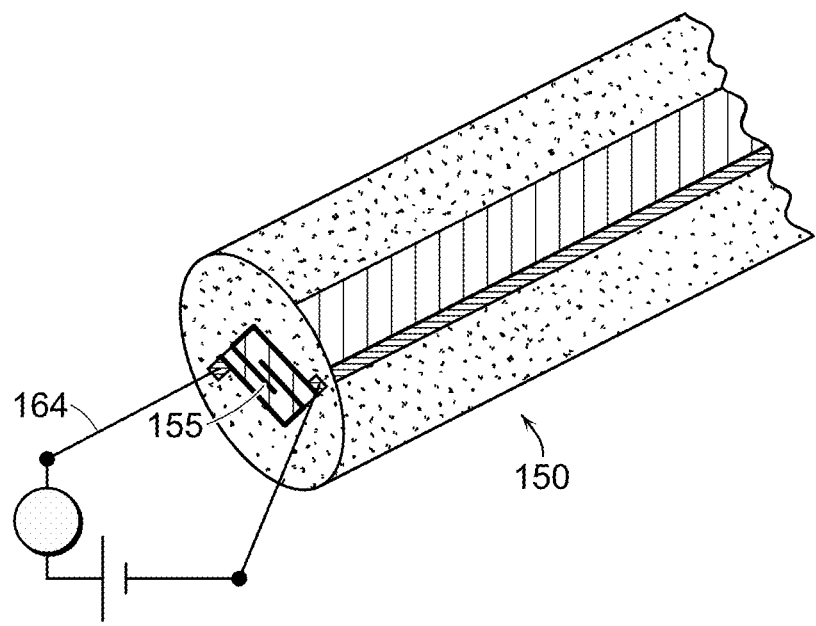
FIGS. 14A and 14B are a schematic view and a cross-sectional view, respectively, of a capacitive touch-sensing fiber to be employed for 3D-printing of a touch-sensing object.
Figure 14B:
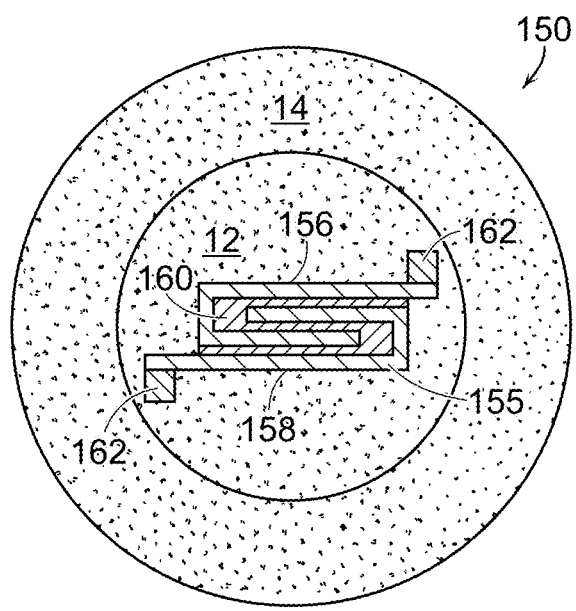

Referring to FIGS. 14A-14B, in a further embodiment, there is provided a 3D-printed object that is formed of a touch-sensitive fiber 150. The touch-sensing functionality of the fiber can be imparted by, e.g., a functional fiber domain 12 that includes one or more electrically capacitive elements 155; i.e., the fiber functional domain includes at least one capacitive element having a capacitance that is changed by the application of touch to the fiber. In one example embodiment, the capacitive element 155 of the functional domain is formed of interdigitated electrodes 156, 158, with a dielectric material 160 disposed between the electrodes 156, 158. A sensing electrode 162 is separately connected to each electrode. The interdigitated electrodes 156, 158 can be formed of, e.g., a conducting polymer such as conducting polyethylene or conducting polycarbonate. The dielectric material 160 can be provided as, e.g., poly(vinylidene fluoride) (PVDF), or as an oxide-based composite made up of thermoplastic polymers and oxides such as indium-tin oxide, barium titanate. The sensing electrodes 162 can be formed of, e.g., metallic materials such as bismuth, tin, indium, lead-tin, bismuth-indium, bismuth-tin, tin-zinc, tungsten, copper wire, or any other selected material. Polycarbonate or other suitable thermoplastic material can be employed as the fiber fusion domain material.

An object that is 3D-printed of the capacitive fiber 150 generates a change in a circuit parameter in an output circuit 164 in response to touch. When a finger is placed on the printed fiber, the contact of the finger on the fiber disturbs the local electric field between the electrodes and the dielectric, increasing the local capacitance and decreasing the local impedance at the point of contact. This is a similar mechanism to that of decrease in local resistivity of a printed photodetecting object upon illumination at a particular point on the object. By connecting circuits on both ends of a continuous fiber employed in the 3D-printing of the object, and by measuring the electrical current from both ends of the fiber, the current ratio can be correlated with a particular site on the object in same way that illumination of a photodetecting object can be correlated with a particular illumination site on the object. The one-to-one mapping algorithm and Expression (1) above, can be employed, if a 3D-printed capacitive object is printed from a single continuous fiber length. In this case, Expression (2) above is modified by replacing the expression terms for resistivity of a photodetecting material and resistivity of an electrical conductor with impedance of the dielectric material 160 and the impedance of the interdigitated electrodes 156, 158.

Conventional touch displays are flat and 2-dimensional. In contrast, a capacitive fiber-based 3D-printed object configured as a touch display can be 3-dimensional. Accordingly, generalized objects can be rendered touch-interactive for users. In one embodiment, a game employing a touch sensor controller provides an interactive experience for a user with 3D touch sensors. In further embodiments, robotics and prosthetics having 3D-printed touch-sensing limbs provide a haptic feedback on what and where the limb is touching. Touch-sensitive 3D switches for devices, e.g., lighting in a room, can also be 3D-printed with the capacitive fiber, in which different touch movements on a 3D switch produce different outcomes.

Figure 15:
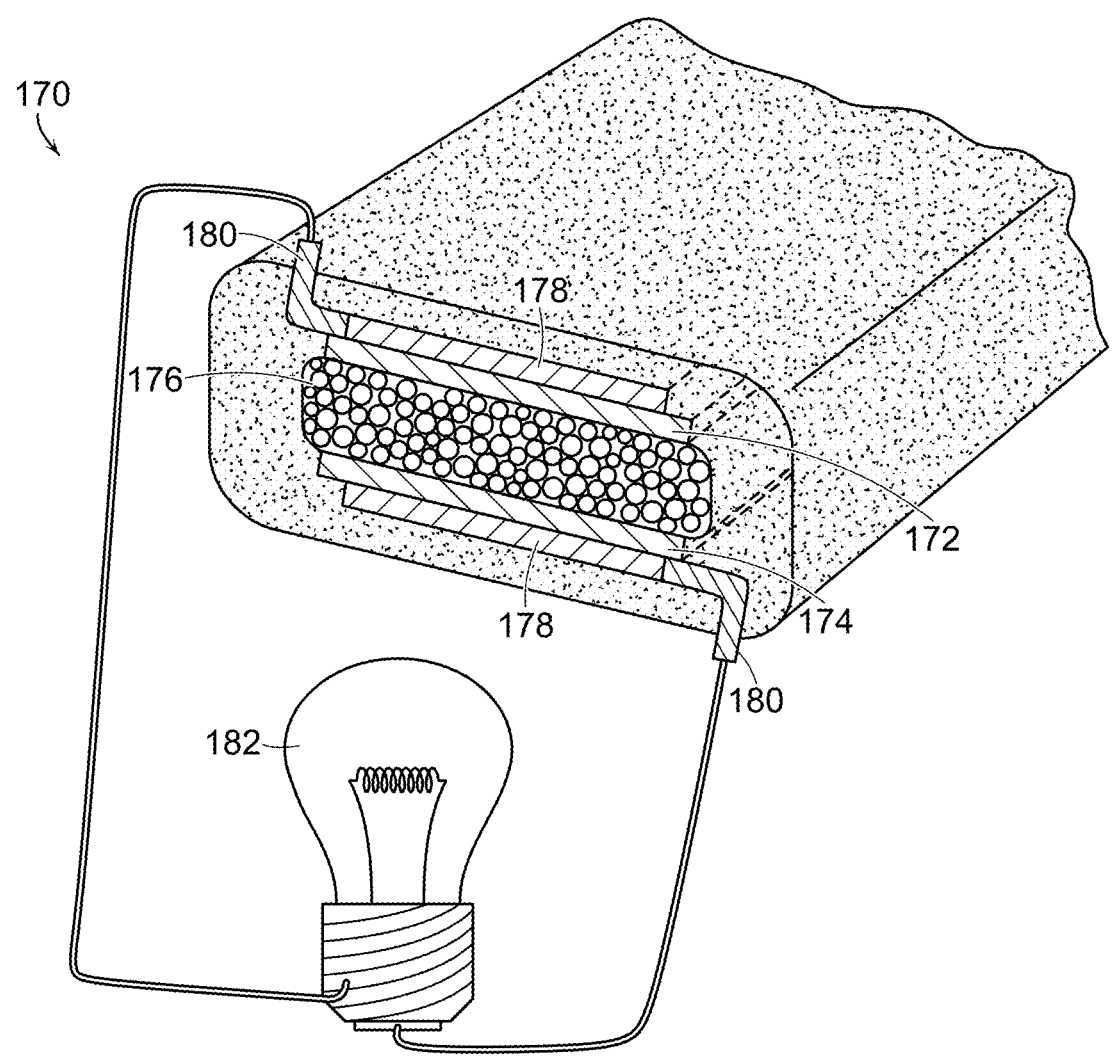
FIG. 15 is a schematic view of a fiber battery to be employed for 3D-printing of an object having battery power for output of electrical power.

Referring to FIG. 15, in a further embodiment there is provided a 3D-printed objected that is formed of a fiber battery 170. The fiber battery is used as the material to be 3D-printed into a selected three dimensional structural object that is itself an energy source. The fiber battery 170 includes in a functional domain of the fiber an electrically conducting anode 172 and an electrically conducting cathode 174 that are separated from each other by an ionically-conductive porous domain 176. Electrical conduction along the length of the fiber is achieved with electrically conducting current collectors 178 connected to the anode 172 and cathode 174, and by electrically conducting lead wires 180. The lead wires are connected at an end of a length of the fiber 170 as-printed in a structural configuration, in the manner shown in FIG. 3. The resulting 3-D printed battery can be configured with a load 182, to delivery power to the load. An electrically insulating material 184 is included as the fusion domain of the fiber and in the functional domain around the battery components.

In the embodiment described here, the fiber battery is shown as being generally rectangular in cross-sectional shape. But it can be preferred that the outer cross-sectional shape of the fiber battery be generally circular to accommodate the generally circular nature of a 3D-print nozzle. To achieve this condition, the fusion domain of the fiber can be made cylindrical by inserting a rectangular fiber battery preform into a secondary cylindrical fiber preform having a hollow rectangular channel for housing the rectangular fiber battery preform, and thermal drawing of the nested preforms together. As a result, the rectangular fiber battery shown can be adapted to have a cylindrical outer fusion domain shape, which then facilitates 3D-printing of cylindrical fiber from a circular nozzle outlet.

The active anode material of the fiber battery can be provided as, e.g., $Li_2TiO_3$, pure lithium, a tin-based metal alloy, graphite, synthetic graphite, silicon-based nanoparticles, or other conducting nanoparticles, or other suitable material. The active cathode material can be provided as, e.g., a layered lithium oxide such as $LiCoO_2$, $LiMnO_2$, $LiNiO_2$ or other layered lithium oxide that accommodates intercalation. The active cathode material alternatively can be provided as, e.g., a spinel lithium oxide such as $LiMn_2O_4$, $LiTi_2O_4$, $LiV_2O_4$, or other spinel lithium oxide. The active cathode material can also be provided as, e.g., a phospho-olivine such as $LiFePO_4$, or other suitable material. The ionically-conductive porous domain can be formed of, e.g., solid polymer regions of, e.g., PVdF or copolymers, with a selected liquid or other electrolyte. This fiber battery arrangement and production of the fiber battery is conducted as an embodiment herein as taught in U.S. Patent Application Publication No. 2016/0155534, published Jun. 22, 2016, the entirety of which is hereby incorporated by reference.

A 3D-printed battery object formed of the fiber battery 170 can be customized to any shape and size, and therefore can moot the space and geometric requirements for a given energy application. A 3D-printed battery can operate as a structural material in the structure of, e.g., a vehicle, to provide both structure and energy at local sites in the vehicle. Indeed, a battery of any size and shape can be formed for portable localized energy delivery in any suitable structure, such as body armor, liquid delivery containers, portable heaters, drones, vehicle encasements, and other structures.

Turning now to 3D-printing methods provided herein to produce objects with the functional fibers described above, and referring back to FIG. 1, in one method provided herein, termed fiber surface heating, a fiber 10 is dispensed through a print nozzle 16 under print parameters and nozzle conditions that heat the surface of the fiber fusion domain 14 while retaining the structure of the fiber functional domain 12. The fiber fusion domain surface is heated sufficiently to enable the conditions shown in FIG. 2, namely, fusion of sections 21 of the fiber at the fusion domain surface, along fusion lines 23, to produce a continuous solid region of fiber in a structural arrangement 20.

As explained above, a fiber 10 to be 3D-printed can include a functional domain with materials and elements that are brittle, rigid, and not amenable to material flow. Such brittle, rigid materials, which are not conventionally print-compatible, are herein rendered amenable to 3D-printing by circumferentially encapsulating the rigid materials in a flexible fiber fusion domain material that provides sufficient flexural strength for 3D-printing while providing a fusion surface that can be heated for fusing adjacent fiber sections together. In addition, fibers that are thermally drawn from fiber preforms generally include fiber materials that have similar melting points and glass transition temperatures, to enable thermal co-drawing of the fiber. As a result, structural changes and material mixing within the fiber could occur when dispensed through a conventional, heated 3D-printer nozzle.

Herein is provided a fiber surface heating method that heats a fiber surface for fusion by 3D-printing while at the same time preserving the structural integrity and device functionality of the materials in the fiber functional domain. This functional domain preservation is achieved by keeping the temperature of the functional fiber domain as low as possible during the 3D-print process. Preferably, the functional domain is maintained in a hardened, solid state during 3D-printing, thereby maintaining the structures and positions of the materials in the functional domain unchanged by the 3D-printing process.

In one embodiment, the fiber fusion domain is provided as a thermoplastic polymer to provide the flexural strength required for 3D-printing of the fiber while protecting the interior functional domain of the fiber. In general, the flexural strength of thermoplastic polymers is sufficiently high to enable smooth feeding of the fiber through a print nozzle without buckling or breakage. Further, the viscosity of a thermoplastic polymer decreases as the temperature of the polymer is increased above its glass transition temperature, and thermoplastic polymers solidify easily upon cooling from an elevated temperature to room temperature. This enables a printed fiber-based object to solidify quickly, to prevent structural shifting of the fiber functional domain, and to harden quickly and retain its shape.

Considering then the construction of a fiber including a thermoplastic polymer fusion domain, a fiber's functional domain 12 and fusion domain 14 are shown in general in the fiber examples of FIGS. 5A and 5B. A fiber 10 for use in 3D-printing of an object includes a fusion domain 14 that can consist of two or more layers and two or more different materials, as shown in FIG. 5A. The outermost material of the fusion domain 14 is preferably a thermoplastic polymer, and inner layers of the fusion domain are likewise preferably thermoplastic polymers.

The functional domain 12 of the fiber is defined in cross section as extending between the outermost edges of non-thermoplastic elements within the fiber. For example, as shown in FIG. 5A, the functional domain extends from a left-most edge of a circular region 15 on the left to a right-most edge of a circular region 17 on the right In FIG. 5B, the functional domain extends from a left-most edge of a rectangular region 19 on the left to a right-most edge of a rectangular region 19 on the right. The functional domain is then defined as being generally circular in cross section with a diameter set by the largest extent between edges of elements in the domain. The functional domain circumference is encased by the outer fusion domain. For most applications, it is preferred that a thermoplastic polymer material is provided to fill the functional domain region between elements of the functional domain, out to the diameter of the functional domain, as shown in FIG. 5A-5B. In other words, the elements of the functional domain preferably are encapsulated in a thermoplastic polymer.

The thermoplastic polymer employed in the fiber functional domain can be different than that of the fusion domain, or can be the same thermoplastic polymer employed in the fusion domain. Thermoplastic polymers such as polycarbonate (PC), acrylonitrile butadiene styrene (ABS), polylactic acid (PLA), Cyclic Olefin Copolymers (COC), Polysulfone (PSU), Polyetherimide (PEI), Polyethylene terephthalate (PET), Polystyrene (PS), Polyvinyl Alcohol (PVA), Nylon, Polyethersulfone (PES), thermoplastic elastomers, or any other suitable thermoplastic polymers can be employed as the electrically insulating region.

The successful 3D-printing of a fiber by the fiber surface heating method provided herein can be accomplished with a thermoplastic polymer fiber fusion domain by imposing several print conditions. Firstly, in the fiber surface heating method, the outer surface of a fiber dispensed through a print nozzle is heated, at the output of the print nozzle, to a temperature that is at least as high, or higher, than a critical fusing temperature, $T_{crit}$, defined as that surface temperature which enables a fiber fusing rate that is equal to the 3D-print speed of the fiber through the print nozzle. If the temperature of the fiber surface, i.e., the temperature of the fusion domain surface of the fiber, is above the critical fusing temperature, then the printed sections of fiber are strongly fused together for a given speed at which the fiber is being arranged into an object. Given a thermoplastic polymer fusion domain, a surface temperature above the critical fusing temperature causes interdiffusion of polymer chains across fusion lines, between sections of the fiber, providing a strong fusion between the sections. The fusion of two fiber sections can therefore in one embodiment be defined as the interdiffusion of polymer chains between two adjacent fiber sections.

The critical fusing temperature. $T_{crit}$, is set by material properties of the thermoplastic polymer, such as glass transition temperature, viscosity, and surface energy, as well as the printing speed and the temperature of the print bed on which an object is being printed. To determine the critical fusing temperature, $T_{crit}$, for a selected thermoplastic material, the process of 3D-printing with the fiber is modelled, e.g., with the modified Sintering Equation as:

$$\frac{d\vartheta}{dt} = \frac{\Gamma}{a\mu} \frac{2^{-\frac{5}{3}}\cos\vartheta\sin\vartheta(2-\cos\vartheta)^{\frac{1}{3}}}{(1-\cos\vartheta)(1+\cos\vartheta)^{\frac{1}{3}}}, \quad (3)$$

where $\vartheta = \sin^{-1}(y/a)$, y is the neck radius between two adjacent printed fiber sections as shown in FIG. 2, defined as one-half of the fused distance that intersects two truncated, adjacent circular fiber section cross sections, a is the total radial extent of the fiber, assumed to be circular, $\Gamma$ is the surface tension of fusion domain material, and $\mu$ is the temperature-dependent viscosity of the fusion domain material. The surface temperature, T, of the fiber after dispense from the print nozzle and deposition in a structural arrangement, as the fiber cools, can be modeled as:

$$T = T_E + (T_o - T_E)e^{-mv_{print}t}, \quad (4)$$

where t is the time, $T_E$ is the temperature of the environment around the deposited fiber, $T_o$ is the initial temperature of the fiber upon dispensing from the print nozzle, at a time t, defined as t=0, and $v_{print}$ is print speed. The factor m is a fiber cooling factor given by:

$$m = \frac{\sqrt{1 + 4\left(\frac{k}{\rho C v_{print}}\right)\left(\frac{hP}{\rho C A v_{print}}\right)} - 1}{2\left(\frac{k}{\rho C v}\right)}, \quad (5)$$

where k, $\rho$ and C are the thermal conductivity, density and specific heat capacity, respectively, of the fusion domain material, h is the convection coefficient, and P and A are the perimeter and area, respectively, of the cross-section of the fiber. Expression (4) can be determined by measuring the temperature of the dispensed fiber surface over time for a given print speed. Through this measurement, the multivariate cooling factor, m, can be determined. The viscosity, $\mu$, of the fiber surface follows an Arrhenius relation with temperature, and can be represented by:

$$\mu = \mu_o e^{E_a/kT}, \quad (6)$$

where the temperature of fiber surface is given as T, $E_a$ the activation energy, $\mu_o$ is the viscosity constant and k is Boltzmann constant Expression (6) can be determined by measuring the viscosity of the material under varying temperature via rheometry. Then Expression (4) can be substituted into Expression (6), which in turn can be substituted into Expression (3), and Expression (3) can be substituted into Expression (2), with the material parameters of a selected thermoplastic material substituted to determine the threshold fusion critical temperature that enables printing with the fiber.

Figure 16A:
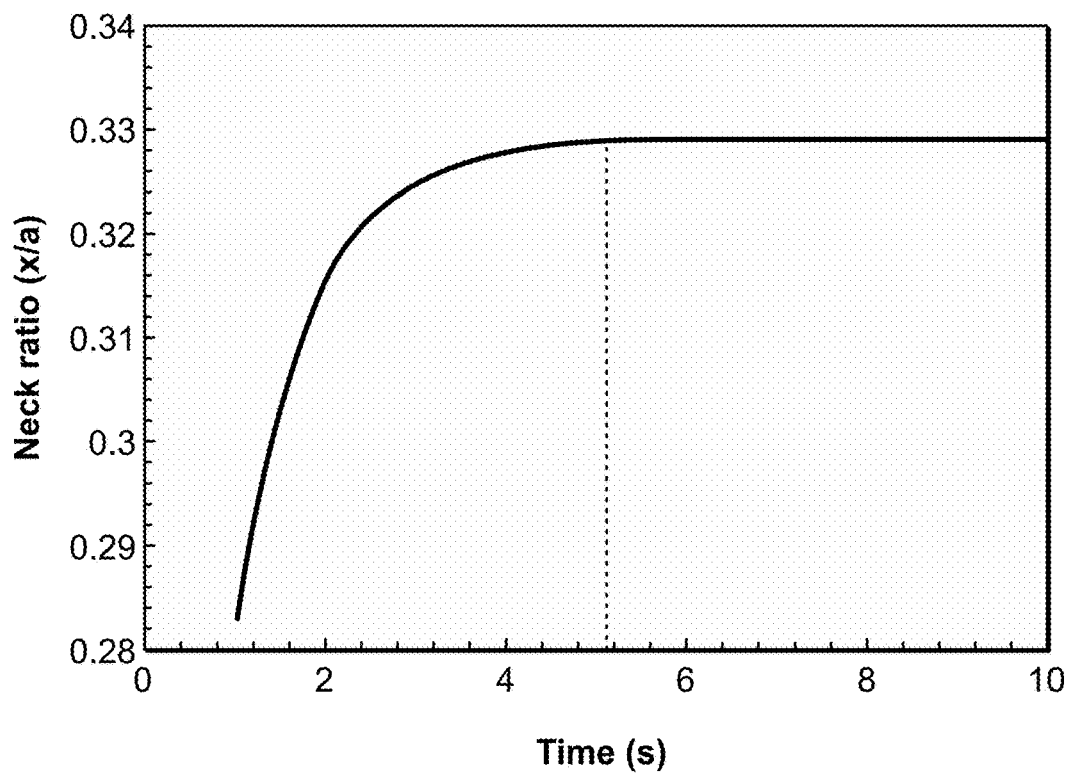
FIG. 16A is a plot of the ratio of the neck radius, between two adjacent fiber sections, to fiber radius, as a function of time, for a given fiber fusion domain material.
Figure 16B:
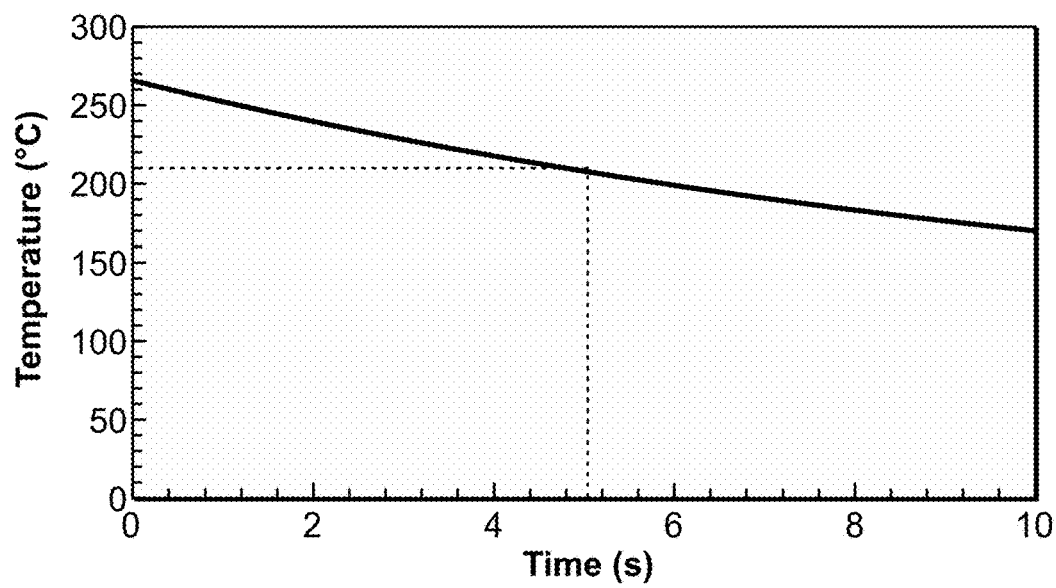
FIG. 16B is a plot of the temperature of a fiber surface as a function of time after the fiber is dispensed from a heated nozzle.

Referring to FIG. 16A, with this relationship, there can be plotted the ratio of the neck radius, x, between two adjacent fiber sections, to fiber radius, a, as a function of time, for a given fiber fusion domain material. This example plot demonstrates this process with the parameters for the thermoplastic polymer PC. The plot indicates that no neck growth takes place after approximately 5 s, and therefore at 5 s fusing is complete. In other words, the fiber surface temperature must be at least as high as the critical fusing temperature up until 5 s for fusing of fiber sections of thermoplastic polymer PC to be successful. Plotting Expression (3) above, as shown in FIG. 16B, then enables a correlation between the fiber temperature as a function of time. For the PC example given here, at a time of about 5 s, the fiber surface temperature is about 210° C. In other words, the critical fusing temperature for which significant neck growth can take place between adjacent deposited fiber sections having a PC fusion domain is 210° C. Thus, the critical fusing temperature, $T_{crit}$, for 3D-printing with a fiber having a PC fusion domain is therefore given as 210° C. This analysis can be conducted for any selected fiber fusion domain material to determine the requisite critical fusing temperature for enabling fusion of adjacent fiber sections in the formation of a 3D-printed object.

The second print condition imposed by the fiber surface heating method provided herein is that the fiber's functional domain retains its structure and material characteristics during printing. In order to retain the fiber functional domain structure, the functional domain materials have to overcome the mechanical stresses that are imposed by the 3D-printing process. The 3D-printing process produces mechanical stress in the fiber by imposing a print layer height, i.e., height of an individual layer to be formed of a fiber section, that is generally less than the diameter of the fiber. This condition is imposed to increase the interfacial area between adjacent fiber sections for enhancing adhesion and fusion between the sections. A fiber section is therefore compressed to a layer height that is less than the fiber diameter as the fiber section is deposited in a structural arrangement, and a corresponding force of compression is imposed on the fiber.

The fiber functional domain materials also have to overcome a tendency to thermal capillary breakup during printing. Thermal capillary breakup is a process in which a structure that is continuous along the fiber length breaks into separate isolated structures, such as spheres, due to heating of the structure and the material around the structure. Under some heating conditions of a fiber fusion domain, the elements of the fiber functional domain could be caused to break up during the print process.

To retain the functional domain structure during the print process and to prohibit break up of functional domain structures during the print process, the fiber surface heating method provided herein heats the material in the fiber functional domain to a temperature that is no greater than about the glass transition temperature, $T_g$, of the thermoplastic polymer that is included in the fiber functional domain. The yield strength of a thermoplastic polymer is highest at temperatures below the glass transition temperature. With a high yield strength, the thermoplastic polymer in the functional domain can shield functional domain elements from mechanical stresses imposed by the printing process. In addition, a thermoplastic polymer at a temperature below its glass transition temperature does not have a tendency to flow, i.e., the viscosity of the thermoplastic polymer is high. As a result, a high-viscosity thermoplastic polymer prohibits thermal capillary breakup of functional domain elements during the printing process.

Figure 17:
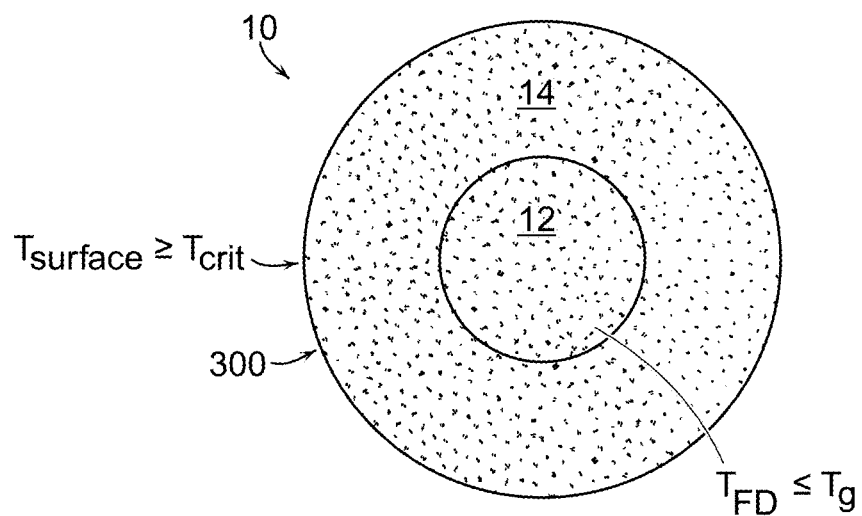
FIG. 17 is a cross-sectional view of a multimaterial fiber having a functional domain and fusion domain controlled at temperatures for enabling fusion of the fusion domain.

Thus, in one embodiment, as shown in FIG. 17, the fiber surface heating method heats a fiber such that there is produced a radial temperature gradient across the fiber cross section, between the two fiber domains. The surface 300 of the fusion domain 14 of the fiber is heated to surface temperature, $T_{surface}$, that is at least as high, or higher, than the critical temperature, $T_{crit}$, determined for a selected thermoplastic polymer in the manner described above. The material, e.g., thermoplastic polymer, that is included in the functional domain 12 of the fiber around the domain elements is heated to a functional domain temperature, $T_{FD}$, that is no greater than the glass transition temperature, $T_g$, of the material included in the functional domain. The temperature of the fiber decreases from the outer surface temperature, $T_{surface} \geq T_{crit}$, inward to the temperature functional domain temperature, $T_{FD} \leq T_g$, at the outer radius of the functional domain 12.

Figure 18:
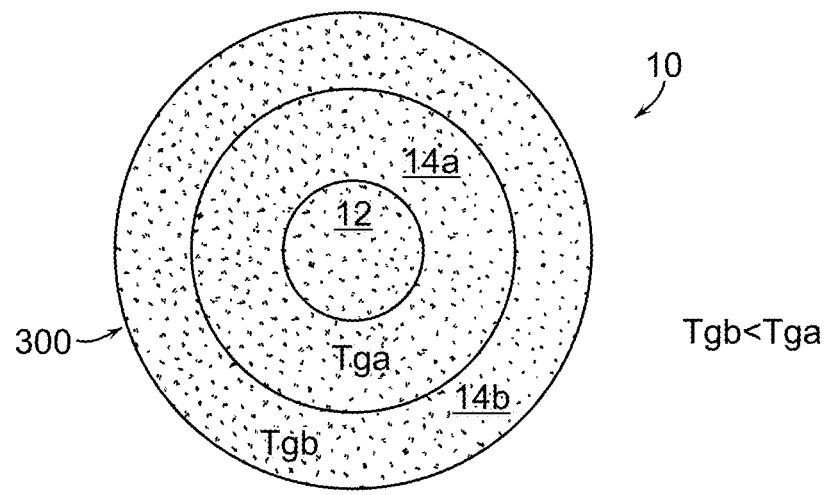
FIG. 18 is a cross-sectional view of a multimaterial fiber having a functional domain and multiple fusion domains of differing glass transition temperatures for enabling fusion of the outermost fusion domain.

In a further embodiment, shown in FIG. 18, the fiber 10 includes multiple concentric fusion domain regions 14a, 14b. Both the inner fusion domain region 14a and the outer fusion domain region 14b include one or more thermoplastic polymer constituents. The thermoplastic polymer of the outer fusion domain region 14b has a glass transition temperature, $T_{gb}$, that is lower than the glass transition temperature, $T_{ga}$, of the inner fusion domain region. Having a lower glass transition temperature, the outer fusion domain region requires a lower critical temperature, $T_{crit}$, at the fiber surface 300 for fiber fusion during 3D-printing with the fiber. As a result, printing with the fiber can be conducted at a lower temperature than would otherwise be required. The surface of the fiber is provided as a material with reduced viscosity, easily able to fuse, while the interior of the fiber is maintained in a solid, structurally rigid state.

In one example of such an arrangement, an inner fusion domain 14a of a fiber 10 as in FIG. 18 is provided as a first thermoplastic polymer, e.g., polycarbonate (PC), which has a glass transition temperature, $T_{ga}$ of about 147° C. An outer fusion domain 14b of a fiber as shown in FIG. 18 is provided as a second thermoplastic polymer, e.g., cyclic olefin copolymer (COC), which has a glass transition temperature, $T_{gb}$, of about 80° C. The critical fusing temperature, $T_{crit}$, for COC is about 145° C. while the critical fusion temperature, $T_{crit}$, PC fusion domain is much higher, 210° C. With the fiber having an outer surface of COC, with its lower critical fusing temperature, the fiber can be printed at a lower temperature than if the fiber surface was formed of PC, and the interior regions of the fiber can be further shielded from the print heating. In one embodiment, the outer fusion domain region is formed of a material having a glass transition temperature that is at least about 50° C. less than the glass transition temperature of the material with which the inner fusion domain region is formed. Here the inner fusion domain region can be considered to be a cladding region.

The outer fusion domain region 14b is formed as an integral fiber material during fiber manufacture, e.g., during thermal draw of a fiber preform into the fiber. In a further embodiment, the outer fusion domain 14b of the fiber includes one or more materials that are coated onto a fiber after manufacture of the fiber. In either case, the outer fusion domain region is one embodiment formed of a material that solidifies due to external stimulation. In one example of such, a fiber is coated with an outer fusion domain region formed of a heat-activated thermoset, such as an epoxy material. The epoxy layer is in a liquid, low-viscosity state at room temperature. When heat is applied to the epoxy layer, solvent in the epoxy evaporates away, and the polymeric chains in the epoxy form permanent cross-linkages. When such cross-linkages are formed, the epoxy hardens and adheres to adjacent surfaces. Unlike thermoplastics, which exhibit decreased viscosity at increased temperatures, thermoset materials retain viscosity even at increased temperatures, because the cross-linkages that are formed during the heating are permanent. With an outer fusion domain region 14b of a thermoset material, the critical fusion temperature is determined for the thermoset, and the 3D-printing parameters set accordingly.

This embodiment demonstrates that the fiber can be arranged with any number of circumferential layers to tailor the thermal and fusion characteristics of the fiber surface for enabling 3D-printing with the fiber. A fiber including a cladding layer can be surrounded by a fusion domain layer in the outer/inner fusion domain configuration given above. Different surface layers can be deposited on a fiber after manufacture of the fiber, after fiber manufacture and/or just prior to 3D-printing with the fiber. The functional domain of the fiber can therefore be structurally and materially preserved during 3D-printing by providing any suitable combination fiber surface layers in the fusion domain of the fiber.

The outermost fusion domain of the fiber can also be tailored to achieve selected arrangements of a 3D-printed object. In one embodiment, an outer fusion domain layer is not continuous, i.e., the outer fusion domain layer is discontinuous along the fiber length as-formed and is maintained in a state of discontinuity during dispensing through a heated print nozzle. With this condition, the length of fiber includes fusable surface sites only at specific positions along the length of fiber. Fiber sections along the fiber length that do not include a fusion domain material at the fiber surface cannot fuse to other fiber sections. As a result, when an object is 3D-printed with the fiber, voids are incorporated into the structure of the object In one embodiment, such voids are included in a 3D-printed object as inlets and/or outlets for liquids. In a further embodiment, 3D-printed structure is arranged as an open net or web that is formed by incorporation of voids. In this embodiment, a stretchable 3D-printed device structure is provided.

Figure 19:
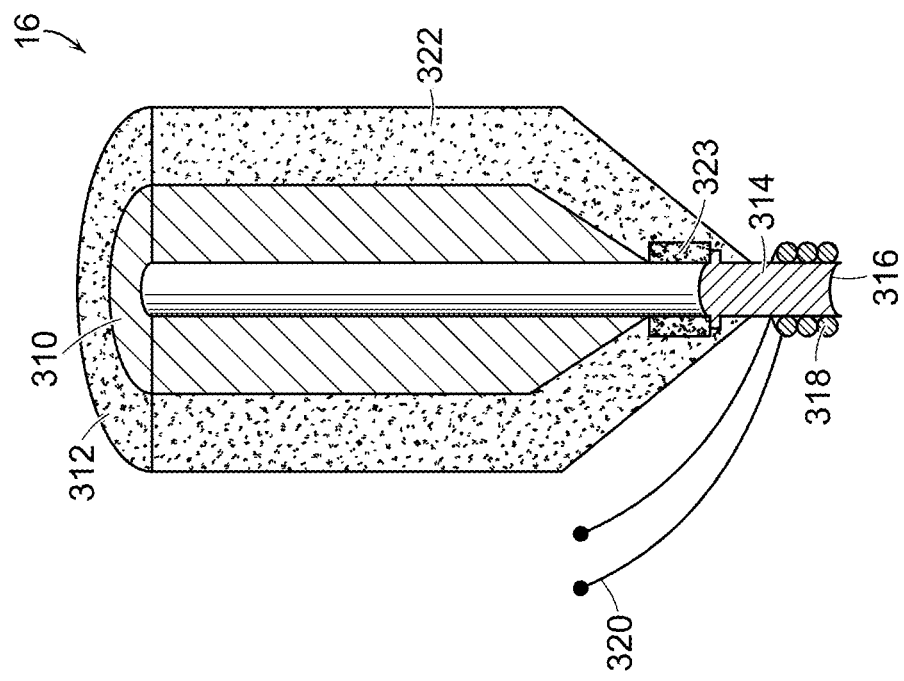
FIG. 19 is a cross-sectional view of a heated nozzle for dispensing a multimaterial functional fiber in 3D-printing of an object with the multimaterial functional fiber.

This fiber surface heating paradigm is achieved with a fiber surface heating nozzle provided herein. Referring to FIG. 19, one embodiment of the print nozzle 16 of FIG. 1 is shown in detail. The print nozzle design is tailored to enable relatively high-speed dispensing of a functional fiber provided herein through a relatively short hot region at the dispensing end of the print nozzle such that the amount of time the fiber is exposed to heat is reduced below that of conventional 3D-printing techniques. This reduces the amount of heat diffusion through the fiber fusion domain into the fiber functional domain.

In the print nozzle 16 shown in cross section in FIG. 19, a nozzle channel 310 of constant diameter is disposed from a top nozzle inlet 312 to a nozzle channel outlet adjacent to a heating tube 314 with a bottom nozzle outlet 316. The channel 310 is a guiding channel for feeding a fiber through the nozzle. The nozzle channel 310 can be provided of any material but preferably is electrically and thermally insulating, and of low contact friction, such as a tube of Polytetrafluoroethylene (PTFE). At the bottom of the channel 310 there is disposed a nozzle heating tube 314; the heating tube 314 is mated with the upper nozzle channel 310. The heating tube 314 can be heated in any selected manner. In one embodiment, the heating tube 314 is an electrically and thermally conducting tube, such as a stainless steel tube, and wire turns 318, e.g., turns of nichrome wire, are disposed around the tube, with connection 320 to an electrical current source for heating the stainless steel tube via the energized wire.

The inner diameter of both the nozzle channel 310 and the heating tube 314 is preferably substantially the same as the diameter of a fiber to be fed through the nozzle, as is shown in FIG. 1. This facilitates the precise feeding of a fiber into the heating tube of the nozzle with good vertical alignment. Without this vertical feeding directed by the upper, unhealed nozzle channel 310, the fiber being fed into the heating tube could buckle or bend upon reaching the heating tube, rendering the fiber unprintable. In addition, the resolution of the 3D-print features of an object formed of the functional fiber, i.e., the extent of the individual printed fiber lines in the printed object, can be set solely by the diameter of a fiber that is customized for a given object to be printed with a nozzle accordingly customized. This advantage is further amplified by the ability to structure the functional domain of a fiber on the microscale and the nanoscale.

It is recognized that due to the nonuniformity in fiber diameter along a fiber length to be employed for 3D-printing, it can be difficult to obtain very long fiber with a substantially constant diameter. In one example of an acceptable condition, the inner diameter of the channel 310 the heating tube 314 is about 0.8 mm while the diameter of a fiber being fed through the nozzle varies along the fiber length between about 0.7 mm and 0.8 mm. In general, any fiber having a diameter that is within a range of about 14% less than the inner nozzle diameter, i.e., the inner nozzle diameter is at most 14% greater than the outer fiber diameter, is still printable along the length of the fiber, including the range of variation in diameter, with a single set of print parameters. But while printing of fiber with diameter less than 0.7 mm is still possible with a 0.8 mm nozzle diameter, it requires another set of print parameters and it also reduces the precision in printing. In general, for most applications, it is preferred that the fiber diameter be no larger than the nozzle diameter. An inner diameter of the channel 310 and the heating tube 314 is for many applications between about 0.1 mm and about 1.0 mm in diameter.

The print nozzle 16 includes a region of thermal insulation 322 that is disposed around the nozzle channel 310 from the nozzle inlet 312 all the way to the end of the nozzle channel and extending downward around the heating tube 314 to the point along the heating tube length at which are disposed the wire turns 318 around the heating tube 314 or other source of heat. In one embodiment, the insulation 322 is an adhesive, such as an epoxy, that holds the heating tube 314 vertically in place. An additional insulating region 323 is provided that prevents excessive flow of heat from the heating tube 314 to the nozzle channel 310 and thereby maintains the inlet 312 of the nozzle channel 310 as a 'cold end' of the nozzle, opposite the heating tube outlet 'hot end.' In one example embodiment, the thermal insulation 322 is provided as a high thermally-insulated epoxy paste, such as Hi-Temp Stove and Gasket Cement, Rutland Products, Inc., Rutland, Vt.

In one example embodiment, the nozzle channel 310 is about 19.6 mm in length and has a wall thickness of about 0.5 mm. The heating tube 314 is between about 0.5 mm and about 1.85 mm in length and has a wall thickness of about 0.1 mm. The inner diameter of both the nozzle channel 310 and the heating tube 314 is in one example about 0.8 mm. The insulating region 322 of the nozzle is in this embodiment is about 2 mm in thickness. Any suitable number of wire turns 318 can be included at the heating tube, for example, at least one wire turn and preferably at least four wire turns.

In operation of the heating nozzle 16, a functional fiber 10 is fed into the channel 310 to pass down through the heating tube 314. The fiber is heated while passing through the heating tube, and exits the outlet 316 of the nozzle, which is the outlet of the heating tube, at a selected surface temperature that is preferably higher and at least no less than, the fiber temperature given by the expressions above. The fiber surface temperature is preferably slightly higher than that prescribed by the expressions to accommodate convective cooling with air along the layer height. With a slightly higher fiber surface temperature, the temperature of the fiber surface after cooling and upon deposition onto the prior printed layers can fulfill the thermal condition in which the temperature of the fiber surface is no less than the critical fusing temperature required for fusing to take place.

With this consideration, the speed at which a functional fiber is fed through the nozzle is selected based on the temperature of the heating tube 314, the length of heating tube 314 that is actually heated by the wire turns, and the diameter of the fiber, to meet the temperature requirements of the fiber surface heating process described above for a given fiber geometry and material composition. 3D-print quality is drastically effected by variation in nozzle parameters. For example, at relatively slow dispensing speeds, at relatively high heating tube temperatures, or for a relatively long heating tube, heat applied to a fiber easily and quickly diffused from the fusion domain to the functional domain of the fiber, possibly causing the functional domain materials to melt and mix, and possibly damaging the functional domain materials and device interfaces. At slightly faster dispensing speeds, at relatively lower heating tube temperatures, and for a shorter heating tube length, a fiber may still not be able to be smoothly dispensed from the nozzle due to the shear resistive force between the melted surface of the fiber fusion domain and the interior wall of the heating tube. This can cause jamming of the fiber in the nozzle and damage to functional domain materials and device interfaces that are close to the fusion domain of the fiber. In an ideal scenario, the dispensing speed, the heating tube length, and the temperature of the heating tube together enable smooth fiber dispensing from the outlet of the print nozzle, and enable the formation of curves and bends in the fiber as well good fusion between fiber sections, all while preserving the structure of the fiber functional domain. At even lower heating temperatures, for an even shorter heating tube length, and at even fasts dispensing speeds, the functional domain of the fiber is preserved, but the surface of the fiber fusion domain is not sufficiently heated to enable fusion of fiber sections in arrangement of an object with the fiber.

First considering for the nozzle geometry, the maximum length of the heating tube 314 is selected based on the diameter of the fiber to be employed with the nozzle. For example, for a fiber of diameter 0.8 mm, the maximum length of the heating tube 314 is about 2 mm. This maximum is set based on the process by which the surface of a fiber will melt in the heating tube 314, because upon melting, the fiber can tend to wet and stick to the internal wall of the heating tube. With such sticking, a fiber would have to push through a surface resistance from the wetting effect or remain stuck in the nozzle. As a result, for given fiber materials, there is a required minimum feeding speed of the fiber through the heating tube in order to overcome the surface shear resistance acting on the fiber.

Above some maximum heating tube length, the minimum force required to push the fiber through the heating tube can cause buckling of the fiber. When the fiber buckles, the fiber will remain stuck in the nozzle. The minimum force, $F_{min}$, that enables pushing of a fiber through the heating tube while preventing buckling is given as:

$$F_{min} = \frac{\pi^3 E r^4}{16 L_f^2} \quad (7)$$

where E and r are the elastic modulus and the radius of the fiber, respectively; $L_f$ is the length of the fiber between the heating tube and the dispensing system that pushes the fiber through the heating tube. The surface resistance force is proportionally related to the length of the heating tube. By identifying $F_{min}$ from Expression (7) for a given set of conditions and equating the minimum force to the surface resistance force, the maximum allowable length of the heating tube can be determined. For a 0.8 mm-diameter fiber, 2 mm is the longest heating tube length that can be employed without causing buckling of a fiber.

Preferably, the distance between the nozzle inlet 312 in FIG. 19 and the hot nozzle outlet 316 is as large as practically possible, and the region 322, 323 of insulating material disposed along the guiding channel 310 is preferably as thermally insulating as is possible practically, so that the nozzle inlet is not heated. In one example embodiment, the insulating regions 322, 323 is provided as a high-temperature insulating double-sided tape, e.g., the commercially available tape CHR 2905-10R Fiberglass Tan Silicone 2-sides Tape from Saint-Gobain S. A., Devins, M A. For example, a single layer of tape of thickness of about 0.13 mm can used as the insulating material. Multiple layers of tape can be employed to increase the thickness of the tape, so long as vertical alignment of the channel 310 and the heating tube 314 is maintained. Thermal tape can be preferred over a rigid insulating tube because the tape can adhere well to a metal heating tube 314, while it may be difficult to form adhesion between a rigid insulating tube and the Teflon channel as well as hot heating tube. But any insulating region material and arrangement can be employed, including active cooling arrangements and cooling systems as-provided with conventional 3D printers.

Whatever cooling or thermal insulating arrangement is employed in the nozzle 16, it is preferred that the length of the channel 310 and the insulating or cooling mechanism be selected so that at the nozzle input and along the nozzle channel 310, the surface of the fiber fusion domain is at a temperature that is lower than the glass transition temperature of the material present at the surface of the fiber fusion domain. The length of the heating tube seta the radial heating into the fiber, which is inversely dependent on the speed of fiber feeding through the nozzle.

Considering the duration of time in which a section of fiber is present in the heating tube of the nozzle, the longer a fiber is present in the heating tube of the nozzle, the higher the surface temperature that can be attained by the fiber section. But given that the fiber section is moving through the heating tube of the nozzle, the surface of the fiber section cannot in practice actually attain the temperature of the heating tube during its traversal of the tube, and the higher the speed of dispensing through the nozzle, the lower the temperature that can be attained by the surface of the fiber. Conversely, an increase in the length of the heating tube increases the duration of time a fiber section is heated, requiring a tower heating temperature. Based on these considerations, in general, in one embodiment, the length of the heating tube 314 is no more than about 10% of the total nozzle length. In a further embodiment, the length of the heating tube 314 is no more than about 3 times as large as the inner diameter of the nozzle outlet 316, and more preferably the length of the heating tube is less than the inner diameter of the nozzle outlet 316.

The acceptable range of heating tube temperature to be employed also depends on the selected print layer height, defined as the height between the outlet tip 316 of the heating tube 314 in the nozzle shown in FIG. 19 and a fiber layer that was just previously dispensed and printed. Note that the layer height determines the height of the individual printed layer. Upon exiting the nozzle, the hot fiber cools down due to convective heat transfer to the air around it. This temperature decrease is exponentially dependent on the increase in the distance away from the nozzle outlet. As a result, as the layer height is decreased, the temperature of the surface of a dispensed fiber section increasingly remains at its dispensed temperature, closer to critical fusing temperature. An increase in layer height necessitate a higher temperature for the heating tube of the nozzle.

With regard to the fusion domain material of a fiber, the critical fusing temperature of the fusion domain surface material primarily sets the required nozzle heating, but in addition, high-thermal diffusivity and high-convective heat transfer fusion domain materials require an increased heating tube temperature to compensate for a higher rate of heat flow and heat loss in such materials.

Given the above factors affecting the nozzle temperature requirements, a general expression that determines if a certain set of print speed and nozzle temperature are sufficient for enabling fusion of the fusion material domain is given as:

$$v_{max.print} = v_{max,0} e^{-E_{fusion}/kT}, \quad (8)$$

where $v_{max.\ print}$ is the maximum print speed for a given temperature, $v_{max,0}$ is the maximum speed constant, $E_{fusion}$ is the activation energy for fusion to take place and T is the temperature of the heating tube. This expression is valid only for heating tube temperatures above the critical fusing temperature. For a given heating tube temperature, if the print speed is faster than $v_{max.print}$, fusion of the deposited fiber cannot take place fast enough and there can be no adhesion between fiber sections. For an example embodiment of a fiber having a fusion domain surface that is the thermoplastic polymer polycarbonate, the value of $v_0$ is 6.78 m/min, and $E_{fusion}$ is $2.52 \times 10^{-20}$ J. Similarly, a general expression that determines if a print speed and nozzle temperature would cause loss of functionality of the fiber functional domain is given as:

$$v_{min.print} = v_{min,0} e^{-E_{functionality}/kT}, \quad (9)$$

where $v_{min.\ print}$ is the minimum print speed for a given temperature, $v_{min,0}$ is the minimum speed constant, $E_{functionality}$ is the activation energy that results in the loss of functionality and T is the temperature of the nozzle. This expression is valid only for heating tube temperatures above the critical fusing temperature. For a given temperature, if the print speed is lower than $v_{min.print}$, loss of functionality of the fiber functional region can take place. For an example fiber fusion domain material polycarbonate and a photodetecting structure in the functional domain, the value of $v_{min,0}$ is 4.07 m/min and $E_{functionality}$ is $2.62 \times 10^{-20}$ J. To ensure good adhesion, the layer height is here no more than 82% of the fiber diameter.

For example, given a fiber having a fusion domain surface that is formed of the thermoplastic polymer polycarbonate, having a critical fusing temperature, $T_{crit}$, of about 210° C., the heating tube of the nozzle is set at a temperature between about 225° C. and about 450° C. for a given set of layer heights between about 0.4 mm and about 0.6 mm and a fiber dispensing speed that is between about 90 mm/min and around 370 mm/min. The choice of the nozzle temperatures needed for other cladding materials can be based on the above relationship between its thermal properties and the nozzle temperature required, while using polycarbonate as the reference material.

The considerations just described for temperature and dispensing speed can be employed to determine the acceptable upper bond dispensing speed and lower bound dispensing speed for a given fiber functional domain arrangement and a given nozzle geometry. Table I, Table II, and Table III below provide examples of this determination, based on Expressions (8) and (9) above, for the conditions shown therein.

TABLE I

| Fiber Functional Domain | Electroluminescent |
|---|---|
| Fusion Domain material | PC ($T_g$ = 147° C.) |
| Fiber fraction of Functional domain | 0.45 |
| Diameter of fiber | 0.87-0.97 mm |
| Temperature of Bed | 130-140 ° C. |
| Bed Layer | PC |
| Length of heating tube | 0.5 mm |
| Nozzle Diameter | 0.97 mm |
| Layer Height | 0.55-0.70 mm |
| Highest Nozzle Temperature | 450 ° C. |
| Upper-bound speed at this temperature | 370 mm/min |
| Lower-bound speed at this temperature | 330 mm/min |
| Lowest Nozzle Temperature | 265 ° C. |
| Upper-bound speed at this temperature | 165 mm/min |
| Lower-bound speed at this temperature | 140 mm/min |
| Maximum print speed (v)(mm/min) vs varying temperature (T/K) | $V_{max.\ print}$ = 5009 $e^{(-1900/T)}$ |
| Minimum print speed (v)(mm/min) vs varying temperature (T/K) | $V_{min.\ print}$ = 5330 $e^{(-2035/T)}$ |

TABLE II

| Fiber Functional Domain | Electroluminescent |
|---|---|
| Fusion Domain Material | COC (Tg = 80° C.) |
| Fiber fraction of Functional Domain | 0.45 |
| Diameter of fiber | 0.87-0.97 mm |
| Temperature of Bed | 80 ° C. |
| Bed Layer | COC |
| Length of heating tube | 0.5 mm |
| Nozzle Diameter | 0.97 mm |
| Layer Height | 0.55-0.70 mm |
| Highest Nozzle Temperature | 450 ° C. |
| Upper-bound speed at this temperature | 845 mm/min |
| Lower-bound speed at this temperature | 330 mm/min |
| Lowest Nozzle Temperature | 160 ° C. |
| Upper-bound speed at this temperature | 128 mm/min |
| Lower-bound speed at this temperature | 48 mm/min |
| Max print speed (v)(mm/min) vs varying temperature (T/JC) | $V_{max.\ print}$ = 6780 $e^{(-1826/T)}$ |
| Min print speed (v)(mm/min) vs varying temperature (T/K) | $V_{min.\ print}$ = 5330 $e^{(-2035/T)}$ |

TABLE III

| Type of Functional Domain | Photodetecting |
|---|---|
| Fusion Domain Material | PC ($T_g$ = 147° C.) |
| Fiber fraction of Functional domain | 0.2 |
| Diameter Of fiber | 0.7-0.8 mm |
| Temperature of Bed | 130-140 ° C. |
| Bed Layer | PC |
| Length of heating tube | 0.5 mm |
| Nozzle Diameter | 0.8 mm |
| Layer Height | 0.45-0.6 mm |
| Highest Nozzle Temperature | 450 ° C. |

TABLE III-continued

| Type of Functional Domain | Photodetecting |
| --- | --- |
| Upper-bound speed at this temperature | 370 mm/min |
| Lower-bound speed at this temperature | 200 mm/min |
| lowest Nozzle Temperature | 225 °C. |
| Upper-bound speed at this temperature | 108 mm/min |
| Lower-bound speed at this temperature | 90 mm/min |
| Max print speed (v)(mm/min) vs varying temperature (T/K) | $V_{max.\ print} = 6780\ e^{(-1826/T)}$ |
| Min print speed (v)(mm/min) vs varying temperature (T/K) | $V_{min.\ print} = 4072\ e^{(-1895/T)}$ |

Considering now print speed in more detail, two distinct speeds are defined, namely, the speed at which fiber is dispensed through the nozzle, and the speed at which fiber is deposited in a geometric structural arrangement from the nozzle. The deposition speed is the speed at which a newly dispensed section of fiber is fused into a 3D-print arrangement, with the term 'deposition' meant to refer to the process in which a newly dispensed section of fiber is positioned relative to and fused with fiber sections that have been previously deposited. The deposition speed is equivalent to what is known as the print speed, which is the translation speed at which the nozzle itself moves.

The dispensing speed is the vertical speed at which the fiber is being passed through the nozzle. The fiber dispensing speed is dependent on four functions to be achieved by the fiber speed, namely, the overcoming of surface resistance between a fiber section and the internal nozzle wall; the reduction of heat flow into the functional domain of the fiber; the reduction of compressive stress in the fiber, and the prohibition of excess fiber deposition.

A higher fiber dispensing speed through the nozzle increases the force with which a fiber pushes through the surface resistance between the fiber surface melt and the internal wall of the heating tube as mentioned above. The degree of surface resistance is dependent on how well the fiber surface melt wets and adheres to the heated internal wall of the heating tube, and this varies for different materials. Stronger adhesion necessitates a higher dispensing speed. By increasing the dispensing speed, a fiber section spends a reduced time in the heating tube, and thus the amount of heat flowing into fiber is reduced. In addition, higher thermal-diffusivity fusion domain materials necessitate a higher deposition speed to prevent excessive heat flow into the functional domain. As the fiber dispensing speed is increased, the compressive stress acting on depositing fiber sections increases, improving adhesion to prior fiber layers. This factor is mechanical and not overly material-dependent and should not be affected by the fiber fusion domain material selection.

These factors indicate that a relatively higher fiber dispensing speed can be preferred. But as dispensing speed is increased, at some speed an excess of fiber is dispensed, which in the extreme can result in swirling of a fiber section in air, above previously deposited fiber sections, with no deposition/adhesion of the depositing fiber section to the fiber sections previously deposited. To prevent this, the layer height can be further decreased to ensure adhesion. Alternatively, the print speed can be correspondingly increased so as to ensure that the ratio of the print to dispensing speed is more ideal.

For the example fiber fusion domain material polycarbonate, in order to overcome surface resistance within a heating tube length of about 2 mm in a dispensing nozzle, the fiber dispensing speed is about 80 mm/min. A fusion domain material having wetting properties that cause stronger adhesion to internal walls would require a higher dispensing speed. Thereafter, a consideration of reducing heat penetration into the functional domains of the fiber can be considered to determine if the dispensing speed results in excessive heat flow into the fiber to damage the functional domain.

For many applications, the ratio of the print speed to the dispensing speed is relatively fixed at a ratio that is between about 1:0.9 and about 1:1.1, independent of the fusion domain material of a given fiber to be printed into an object. This is because for ratios below about 1:0.9, the print speed is faster than the dispensing speed, and thus the printed lines may not adhere well. Note that for ratio below 1:0.9, a dispensed fiber can be under tension between the nozzle output and an underlying structure being printed, which may result in the formation of in-fiber spheres via capillary breakup.

For a ratio between print speed and dispensing speed above 1:1.1, the print speed is slower than the dispensing speed, and this can result in more fiber being extruded, causing a larger extrusion width, meaning that the printed lines can widen and may give rise to a less precise print. For higher ratio above 1:1.3, and for a fixed layer height, swirling of the fiber in the air may take place, disabling adhesion. But as explained, printing can be achieved for ratios higher than 1:1.3 if the layer height is reduced. This results in shear fragmentation via compressive stress between the print bed and the feeding fiber. With these considerations for dispensing speed which ranges between 80 mm/min to 400 mm/min, and range of ratio of print to dispensing speed, the print speed can be derived.

In one embodiment, a three dimensional object to be 3D-printed with functional fiber is preferably 3D-printed using a single continuous multimaterial fiber length having a fusion domain of polycarbonate. The object is printed with a printing speed that is between about 90 mm/min and about 175 mm/min, with the ratio of the print speed and dispensing speed ranging from between about 1:0.9 to about 1:1.1. The temperature of the heating nozzle is in this embodiment between about 225° C. and about 450° C.

With these fiber surface heating method parameters specified for the printing nozzle provided herein, any suitable 3D-printer can be employed in the fiber surface heating method, e.g., a commercially-available printer such as the RoVa3D multi-nozzle printer. Serial Number R3DR100118, from ORD Solutions, Cambridge, Ontario, Calif. The software, known as Gcode, used to generate the printing path of the 3D object, and inform the printer of the printing path, can be any suitable code, e.g., open-source Slic3r and Printrun, Python host software from Pronterface. A dispensing nozzle that enables the fiber surface heating method provided herein is employed in whatever printing system is selected, so that the required surface heating conditions can be met.

Whatever 3D-print system is employed, the system is preferably arranged in the conventional manner with a print bed on which an object is printed. The temperature of the print bed on which an object is printed is preferably heated to enable the printing to be initiated and to proceed with fusion to the print bed. Specifically, the print bed temperature is sufficiently high to prevent deposited fiber layers on the print bed from peeling during the print. As the outer edges of the 3D-printed structure are exposed to the environment, e.g. air, those outer edges cool faster than the interior of the structure. This results in nonuniform expansion and contraction rates between the outer edges and the interior of the print structure, which can result in bending or deflection of the structure. If the adhesion to the print bed is poor, the forces from bending or deflection usually result in peeling of the print structure from the print bed. In order to prevent peeling, the print bod preferably is set at a temperature above the heat deflection temperature of the fusion domain material. The heat deflection temperature of a material is the temperature at which the material remains malleable. Keeping the print structures in the heat-deflection range allows the printed structure to remain flat on the print bed during the print process.

As the print bed temperature is increased, there is a lower force caused by the bending of the deposited structure and thus lesser tendency for peeling to occur, which could be caused by poor adhesion to the print bed. For some applications, it can be preferred to provide the surface of the print bed with a thermoplastic polymer material layer, such as thin film of polycarbonate, to ensure good adhesion between first printed fiber layers and the print bed. The temperature of a polycarbonate printing bed is in one embodiment set at a temperature between about 120° C. and 130° C.

These parameters give examples for 3D-printing by fiber surface heating of the functional fiber as-provided herein. Turning to production of the functional fiber itself prior to 3D-printing with the fiber, the functional fiber can be produced by thermally drawing a fiber preform into the functional fiber, as explained above. In one embodiment, a fiber preform is arranged and thermally drawn into the functional fiber by one or more thermal drawing techniques as taught in U.S. Pat. No. 7,295,734, issued Nov. 13, 2007; as taught in U.S. Pat. No. 7,292,758, issued Nov. 6, 2007; as taught in U.S. Pat. No. 7,567,740, issued Jul. 28, 2009; as taught in U.S. Pat. No. 9,263,614, issued Feb. 16, 2016; as taught in U.S. Pat. No. 9,365,013, issued Jun. 14, 2016; as taught in U.S. Pat. No. 9,512,036, issued Dec. 6, 2016; as taught in U.S. Patent Application Publication No. 2015/0044463, published Feb. 12, 2015; as taught in U.S. Patent Application Publication No. 2014/0272411, published Sep. 18, 2014; and as taught in "Sub-Micrometer Surface-Patterned Ribbon Fibers and Textiles" Adv. Mater., V. 29, pp. 1605868 1-6, 2017, the entirety of all of which are hereby incorporated by reference.

In general, any suitable thermal drawing process that accommodates all of the functional domain materials and elements and that provides a fusion domain material can be employed. In a first step, there is assembled a macroscopic fiber preform structure that is arranged by manual placement, by deposition, layering, machining, and any other process needed to arrange preform materials in a geometry that will correspond to a drawn fiber. Any materials or elements like those described above can be included for attaining a selected fiber functionality.

In the preform arrangement, the outer preform layer or layers include the material that is to operate as a fiber fusion domain for 3D-printing with the fiber. This fiber fusion domain material preferably can flow at the temperature selected for fiber preform drawing. A reasonable criterion for this condition is that the fiber fusion domain material flow during the fiber draw by having a viscosity lower than about $10^8$ Poise at the selected draw temperature. For example, given a thermoplastic polymer fiber fusion domain material, then a thermoplastic polymer viscosity of between about $10^1$ Poise and about $10^8$ Poise can be acceptable, with a viscosity of between about $10^4$ Poise and about $10^7$ Poise more preferred, all at the selected fiber draw temperature. The fusion domain material preferably retains both its structural integrity and its chemical composition at the fiber draw temperature. Although the fusion domain material may elongate during the fiber draw, when the fusion domain material cools and solidifies, the elemental composition of the fusion domain material in the drawn fiber is the same as the elemental composition of the fusion domain material in the preform. In one embodiment, the fusion domain material is electrically insulating as well as transparent to wavelengths of radiation of interest, e.g., for operation of a photonic or optoelectronic functional domain in the fiber.

With these considerations, the fiber fusion domain material can be provided as, e.g., a thermoplastic polymer, a glass, an elastomer, a thermoset, or other material that can flow during thermal fiber drawing. A thermoplastic elastomer (TPE), such as styrenic block copolymers, and thermoplastic polyurethanes can also be used as fiber fusion domain material. Other materials, such as a thermoset, can be added on the surface of the fiber, by any suitable process, such as like dip-coating, such that the added material becomes the outermost surface material of the fiber.

Conventional fiber cladding materials can be employed as the fusion domain material, including, e.g., Polycarbonate (PC), Poly-ethylene (PE), Cyclic Olefin copolymers (COC), Poly-methyl methacrylate (PMMA) or any other acrylic, Polysulfone (PSU), Polyetherimide (PEI), Polystyrene (PS), Polyethylene (PE), Poly-ether ether ketone (PEEK), poly-ether sulfone (PES), or other suitable material. Poly-tetrafluoroethylene (PTFE or Teflon™) and other fluorinated polymers or copolymers can also be employed in configurations in which their characteristically poor surface adhesion properties can be accommodated. While amorphous polymer materials can be preferred for many applications, it is also recognized that some semicrystalline polymers, e.g., branched PTFE, PE, can be employed as a fiber fusion domain material. A necessary condition for any suitable polymeric fusion domain material is that there exists a fiber draw temperature at which the polymer can be drawn into a fiber at a reasonable speed, e.g., greater than about 1 mm/minute, without decomposition. The fusion domain material can also be provided as silica or any glassy material such as borosilicate glass, chalcogenide glass, or other suitable glassy material.

The arrangement of the fiber functional domain in the fiber preform can include materials that flow during the thermal draw, can include materials that break up into isolated structures during the thermal draw, and can include materials that do not flow, melt, or change their dimensions to any substantial extent during the thermal draw. The fiber preform can be consolidated, if necessary, in the conventional manner, to form intimate material interfaces between materials arranged in the fiber preform. This consolidation step can be conducted multiple times, e.g., after various materials of the functional domain of the are introduced into the preform. Then in a final step, the preform is thermally drawn into a fiber for 3D-printing with the fiber.

Figure 20:
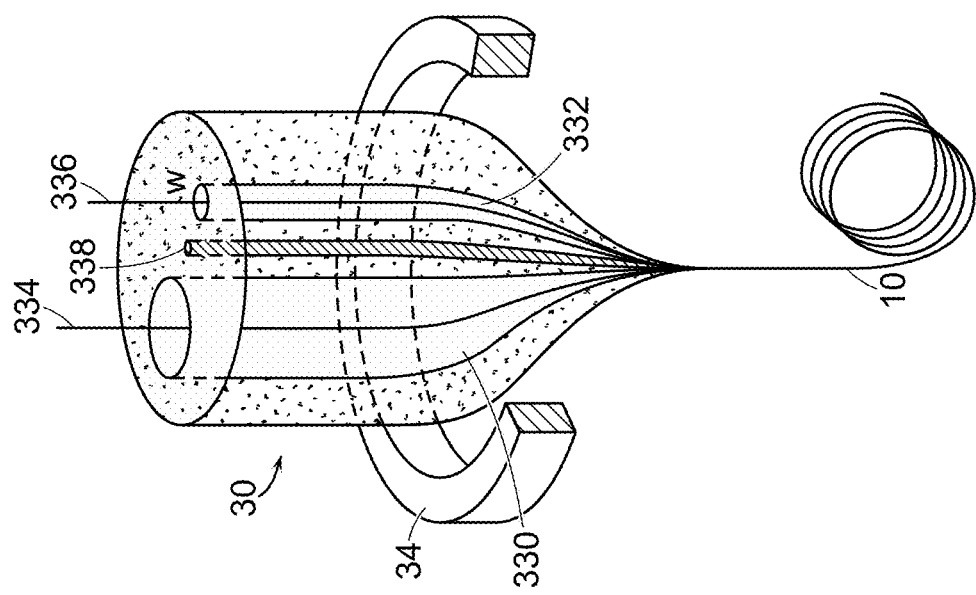
FIG. 20 is a schematic perspective view of a multimaterial fiber preform being thermally drawn into a multimaterial functional fiber while electrical conductors are fed into the preform.

The fiber preform can also include hollow channels to accommodate the introduction of materials at the time of preform drawing. Referring to FIG. 20, in one embodiment, a fiber preform 30 includes multiple hollow channels, e.g., two hollow channels 330, 332. These hollow channels can be employed during thermal draw of the preform 30 through a heated zone 34 of a draw tower, such that there are fed elongated elements 334, 336 into the hollow channels 330, 332, respectively. In one example of this for production of the electroluminescent fiber 40 shown in FIGS. 7A-7B, one elongated element 334 is a phosphor-coated copper wire to function as the phosphor element in the fiber 40. In this example, the other elongated element 336 is a tungsten (W) wire or other selected wire for making electrical contact within the drawn fiber. The two elongated elements are fed into the fiber preform as the preform is thermally drawn.

Other elements, hollow channels, and other structural arrangements can be included in the preform. In one embodiment, the preform 30 includes a region of material 338, such as BiSn as described above in connection with FIGS. 7A-7B, that forms electroluminescent pixel regions 48 in the electroluminescent fiber 40. The regions 48 can be formed out of a continuous elongated material region 338 during the thermal drawing process, after the thermal drawing process, or in the fiber preform itself.

In one example thermal fiber drawing process, a draw tower is configured in a conventional three-zone draw setup, with, e.g., top zone temperature, middle-zone temperature, and bottom zone temperature each between about 100° C. and about 500° C. The middle-zone temperature should be the highest of the three zone temperatures, and is considered to be a stated draw temperature. One or more drawing zones are sufficient if three are not available. The drawing temperature should be primarily selected based on the fusion domain material to be used. For example, the higher the glass transition temperature of the fusion domain material to be used, the higher the required draw temperature. Example fusion domain materials and corresponding middle-zone fiber drawing temperature ranges are as follows: PC-draw temperature between about 145° C. and about 400° C.; PSU-draw temperature between about 180° C. and about 400° C.; PEI-draw temperature between about 217° C. and about 400° C.; PE-draw temperature between about 100° C. and about 400° C.; COC draw temperature between about 70° C. and about 400° C.; PMMA-draw temperature between about 85° C. and about 400° C.; PS-draw temperature between about 100° C. and about 400° C.; PEEK-draw temperature between about 140° C. and about 500° C.; and PES-draw temperature between about 200° C. and about 500° C.

During the fiber draw, the preform is vertically fed through the drawing zones with a selected feed speed, for example, about 1 mm/min, and a selected draw speed, for example, 1.6 m/min. The ratio of the feed speed to the draw speed sets the fiber draw ratio; for example, for these feed and draw speeds, a draw ratio of 40 is produced, meaning that all lateral dimensions of the preform are decreased by a factor of 40 in the fiber, while all axial distances of the preform are increased by a factor of 1600 in the fiber. These conditions set the final dimension of the drawn fiber. Thus, to obtain a different size of a fiber out of the same preform, the feed and draw speeds are adjusted to produce a selected fiber dimensionality. The tension applied to the fiber during the fiber draw can be, e.g., in the range of between about 10 gr/mm² and about 800 gr/mm².

If a solid wire or wires, or other elongated regions, are guided into the preform during the draw, the tension to be used is highly dependent on the turn of the wire spool, given that the spool will oscillate according to the spin of the spool. In the draw, solid wires that are inserted into the preform can be tied to the bate-off weight of the preform. Once the bate-off occurs, the fiber body material clamps around the wires and wires become embedded in the fiber body material. The wires are pulled into the preform from a spool just by the pulling on the fiber through the draw tower, since the wires are embedded inside the fiber and do not slip. No external feeding mechanisms are required, although use of ball bearings or a feeding motor can be employed, if desired, to decrease the stress fluctuation, since there is no dependence on spool spinning intervals.

After the thermal draw, the resulting fiber can be spooled for storage prior to 3D-printing with the fiber, and prior to spooling, can be post-draw processed as needed for a given functional domain condition. The drawn fiber can be annealed, can be coated with one or more layers of materials, can be mechanically manipulated, e.g., by machining, and can have elements and materials affixed to the outer surface of the drawn fiber.

In one embodiment provided herein, a drawn fiber is processed to produce physically separated in-fiber particles, such as microspheres, within the functional domain of the fiber, along at least a portion of the longitudinal length of the fiber, by heating of the entire fiber cross section. For fiber materials and configurations that are amenable to external fiber heating, there is imposed a temporally dynamic thermal gradient, or moving thermal gradient, along the longitudinal fiber axis, that heats the fiber. For example, a fiber can be longitudinally fed through a spatially localized heating site such as a flame, at a controlled fiber speed. As the fiber is fed into the spatially localized heating site, one or more continuous elongated functional domain regions soften and melt, and are subject to capillary instability, which causes a portion of the molten region to pinch off into a droplet to reduce surface energy. As the molten droplet moves out of the localized heating site while the fiber feed is continued, the droplet solidifies, becoming a solid particle that is embedded in the functional domain of the fiber. During the droplet and particle formation processes, the material between elements of the functional domain, e.g., a thermoplastic fusion domain material, softens and flows around the molten droplet and then hardens with the particle. This in-fiber particle production method can be conducted by the method of embodiments herein as taught in U.S. Pat. No. 9,512,036, issued Dec. 6, 2016, U.S. Patent Application Publication No. 2016/0060166, published Mar. 3, 2016, U.S. Patent Application Publication No. 2015/0044463, published Feb. 12, 2015 m and U.S. Patent Application Publication No. 2014/0272411, published Sep. 18, 2014, the entirety of each of which is hereby incorporated by reference.

Turning to FIGS. 21A-21D, in a further embodiment for in-fiber particle formation, a laser is focused on a selected elongated functional domain region within a fiber. In this process, a laser 350 is focused onto a selected region 355 of a fiber 360 for which capillary breakup is desired. The laser is focused through the fiber 360, and particularly through other fiber regions 362, 364. Preferably outer regions, e.g., the outermost region 362, which is the fiber fusion domain material, is transparent to the wavelength of the laser. The fiber 360 can be translated through the laser spot with a selected velocity for a given capillary breakup process.

Figure 21A:
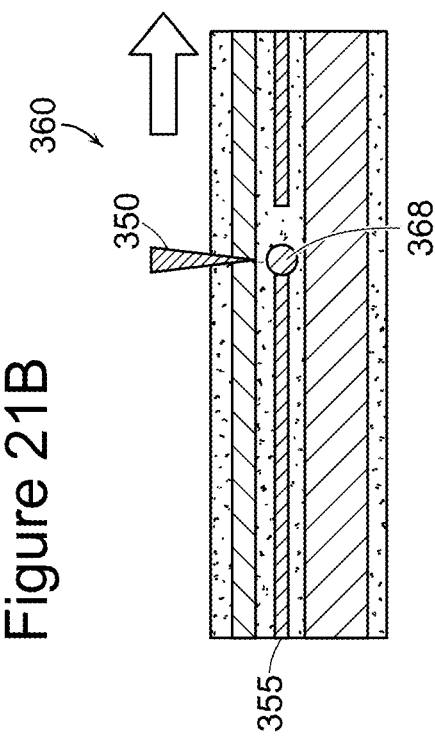
FIGS. 21A-21D are cross-sectional views of a multimaterial electroluminescent fiber at four stages of processing to produce separated electroluminescent pixels along the fiber length.

As shown in FIG. 21A, the focusing of the laser 350 onto a selected region 355 causes the region 355 to absorb the laser energy and become heated. The fusion domain material 362 around the selected region 355 also becomes heated, and as the temperature of the fusion domain material increases beyond the material's glass transition temperature, the viscosity of the fusion domain material decreases. This causes a capillary instability in the selected region 355, causing a pinch-off point 366 of the selected region material at the site of the laser.

Figure 21B:
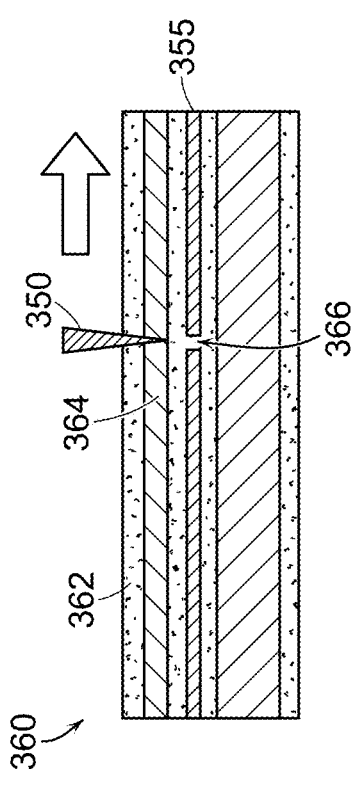

Referring to FIG. 21B, as the fiber 360 moves through the laser spot, there is a high tendency for the pinched-off selected region material to form a sphere 368 because the most stable thermodynamic equilibrium state is a sphere. The shaping of the pinch-off point into a sphere is aided by the low-viscosity state of the fusion domain material in the vicinity of the pinch-off point. As the fiber continues to move through the laser spot, more material from the selected region 355 is added to the growing sphere 368.

Figure 21C:
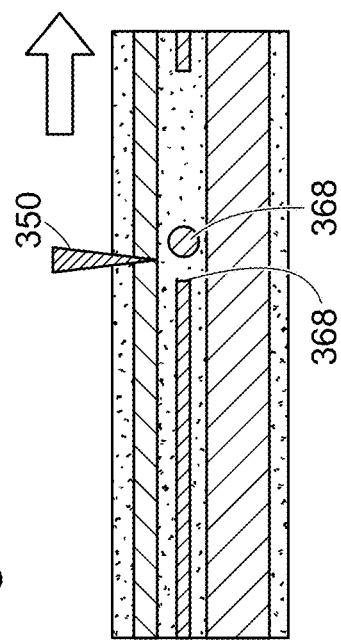
Figure 21D:
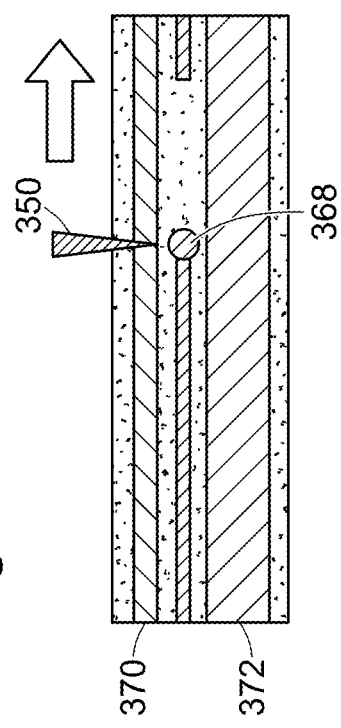

Referring to FIG. 21C, given an arrangement in which elongated regions 370, 372 are located in the fiber arrangement, then the radius of the sphere 368 will continue to increase until the outer surface of the sphere contacts the adjacent regions 370, 372. The sphere size is therefore constricted by the placement of regions 370, 372 in the fiber. As a result, this process automatically causes the sphere to be put into mechanical contact with the adjacent regions 370, 372. Then, referring to FIG. 21D, as the fiber movement is continued, the fully-developed sphere progresses beyond the location of the laser 350. A new pinch-off point 366 then forms and another sphere is produced. This process can be continued until a desired sequence of separated spheres are produced within the fiber.

This laser-based capillary breakup method provides several particular advantages. A sequence of spheres can be produced at a selected one or more sections along a fiber length so that the fiber includes sections having sequences of spheres as well as sections having continuous material regions. One or more spheres can be produced at selected, localized sites along the fiber length. In addition, unlike conventional heating methods that would heat a fiber from the outside inward, the laser-based heating method enables fiber heating at a selected internal material region inside of the fiber by focusing of the laser at the selected region inside the fiber. Undesirable fiber deformation that could occur by heating of the entire fiber from the outer fiber surface is therefore avoided. The ability to focus laser energy at a precise and localized region within a fiber enables sufficient energy for break-up to be directed to the selected region while the remainder of the fiber materials are not subjected to heating.

If the constraining regions 370, 372 are not included, the capillary breakup method remains operable and a sequence of spheres can be formed. In this embodiment, the sphere size and the spacing between spheres are dependent only on the material properties of the sphere and the fusion domain material, as well as the speed of the fiber translation. Adding constraining regions 370,372 only reduces the maximum possible sphere size that can be formed without the constraining regions. Thus, the sphere size can be otherwise set by controlling the distance of the selected region, between region 370 and 372, and/or by controlling the speed at which the fiber is moved through the laser location.

In one embodiment, the capillary breakup process provided herein can be applied for producing the electroluminescent fiber 40 of FIGS. 7A-7B and FIG. 8, as explained above. Referring to FIGS. 21A-21D, in this embodiment, the selected region 355 to be formed into separate spheres is the material for defining electroluminescent pixel sites, and is formed of, e.g., BiSn. The elongated adjacent regions 370, 372, in the fiber are, e.g., tungsten wire or other suitable wire such as copper, and a phosphor-coated wire, such as a phosphor-coated copper wire, respectively. Given this example configuration, a fusion domain material of polycarbonate can be preferred, and correspondingly a laser having a wavelength of 808 nm can be employed as polycarbonate is transparent to this wavelength. A laser spot size of about 50 microns can be employed, at a power of about 2 W, with a laser pulse mode of 5 kHz and a duty cycle of 0.2%, with a fiber translational speed of 0.0004 mm/s.

These process conditions can be adapted as-desired; for example, the BiSn sphere radius can be increased by decreasing the translational speed of the fiber through the laser spot. In this case, the density of electroluminescent pixels is increased due to reduced separation between adjacent spheres. An increase in diameter of the BiSn region also causes an increase in sphere radius. But the maximum-attainable sphere radius remains dictated by the spacing between the first wire and the phosphor-coated wire. Below that maximum sphere radius, smaller sphere radii can be obtained by controlling the wire separation within the fiber, on opposite sides of the BiSn region, and/or by controlling the speed with which the fiber is translated through the laser spot.

Whatever method for in-fiber particle production is employed, and referring back to FIG. 6B, the production of in-fiber particles produces structures 27, 29 within a functional fiber that are incorporated in an object printed with the fiber. Any suitable material can be provided for the in-fiber particulate structures, including inorganic and organic species, electrically conducting, semiconducting, and insulating materials, and inhomogeneous, geometrically tailored materials, such as core-shell particles, nested particles, bi-particles and tri-particles, Janus particles, azimuthally arranged particles, and other particle arrangements.

For example, the formation of in-fiber particles is carried out in one embodiment to encapsulate one or more therapeutic liquids within microspheres along the length of a fiber to be used in 3D-printing an object. In this embodiment, the 3D-printed object can be an implantable object that includes a controlled drug delivery system provided by liquid spheres within the fiber. The spheres can be sited precisely along the length of a fiber, and arranged within the fiber, to include therapeutic liquids for delivery by the implantable object.

In a further embodiment, microstructures can be included at different sites along a length of fiber to be used in 3D-printing, with different functionalities implemented by the different microstructures. An object that is 3D-printed of such a fiber can have different functionalities at various positions and directions of the printed object based on the selected corresponding microstructure sitting along the functional fiber. The functional fiber herein thereby provides, in one embodiment, a 3D-printed object having a plurality of different functionalities at different object locations.

In a further embodiment, the functional fiber can be employed in the production of multimaterial metamaterials. In one example of such, customizable solid state lattice structures can be produced. Photonic crystals and metamaterials are produced from an assembly of either a single material or multimaterials to form a repetitive and hierarchal pattern that enables unique properties beyond its constituent materials. Recent findings in new metamaterials has brought about advances in research fields such as negative refractive index, superlens, cloaking devices, and acoustic filtering. Each of these can be addressed by 3D-printing with functional fiber as-provided herein.

In this embodiment, thermal drawing of functional fiber and 3D-printing are together employed in a recursive manufacturing process of cyclic draw-3D-print-and-redraw, producing, e.g., multimaterial lattices and hierarchal metamaterials. This cyclic process, in which 3D-printing is employed to print functional fiber into a selected arrangement of fiber that is redrawn, enables formation of structures, such as a periodic lattice, that would be difficult to achieve with conventional fiber stack-and-draw or mask lithography methods. The multimaterial fiber is printed into a fiber preform that itself is thermally drawn to achieve a fiber of higher material and geometric complexity. A particular embodiment of such enables the formation of a hierarchal metamaterial, which includes a single material or multi-material lattice that in turn contains sub-lattices of varying structures. Such a metamaterial is analogous to a fractal effect, whereby zooming into a unit of a macro pattern, one can then observe smaller sub-patterns which may contain even tinier patterns. The cyclic draw-3D-print-and-redraw recursive manufacturing method is thereby shown to provide significant advantages over conventional methods in that 3D-printing is capable of precisely placing a fiber in an arrangement of high complexity.

Beyond a single cycle of draw-3D-print-and-redraw, multiple cycles can be employed to manufacture highly sophisticated metamaterials. In principle, the cycle of draw-3D-print-redraw to form a structure can be repeated with no limit, bringing about different structural lattices and building up the levels of hierarchy with each cycle. Such hierarchal meta materials are of interest particularly for an ability to interlace physical properties from the different lattices. For example, gold nanohole arrays decorated into repetitive microscale patches display much higher refractive index sensitivities than otherwise. Hierarchal metamaterials can thus yield unprecedented and exceptional properties beyond the current standards.

The fiber surface heating method provided herein can also be tailored to produce within a fiber functional domain non-equilibrium structures such as rods, spheroids, cones, and teardrops. In one embodiment, a functional fiber including a sequence of particles within the functional domain of the fiber is dispensed through the print nozzle provided herein at a dispensing speed and at a heating temperature that causes the particles to take on a selected geometry, such as a teardrop geometry.

For example, given a ratio of print speed to dispensing speed that is greater than about 1:1.3, fragmentation of the functional domain will take place, creating rods within the fiber. For a ratio of print speed to dispensing speed that is less than about 1:0.9 together with a print speed that is less than about 20 mm/min, thermal capillary breakup of the functional domain to form spheroids, spheres and teardrops will take place. Generally, for relatively lower print speeds or relatively higher nozzle temperature, there is an increasing tendency to form a sphere in a material region, which is the shape of lowest energy. As the print speed is increased or the nozzle temperature decreased, the longitudinal length of the particle will be amplified since it takes time for the material of the functional domain to move and develop into a sphere, hence a spheroid can be formed. Increasing the print speed or decreasing the nozzle temperature creates a teardrop as there is a lack of time to pinch off the functional domain. This control can be employed to form custom-geometry particles within a fiber as the fiber is printed into an object.

Example I

Production of Electroluminescent Fiber

An electroluminescent fiber like that shown in FIGS. 7A-7B was produced by thermal drawing of a fiber preform into the fiber. The preform was produced by first preparing a cylindrical polycarbonate rod, e.g. Product 8571K35 from McMaster-Carr, Elmhurst, Ill., with a diameter of about 35 mm and length of 10 cm. A first hollow channel 330, in which was to be fed a phosphor-coated wire, was drilled by a drill bit of diameter 9.3 mm, vertically downwards on a drill press, at a position that was 1.5 mm to the right of the center of the rod's cross-section. This channel was drilled totally through the length of the preform. The second hollow channel 333, in which was to be fed $Bi_{0.58}Sn_{0.42}$, was drilled by a drill bit of diameter 1.5 mm, vertically downward on a drill press, at a position that was 4.3 mm to the left of the center of the rod's cross-section. This channel was drilled to half the length of the preform. The third hollow channel 332, to be fed with the W electrode wire, was drilled by a drill bit of diameter 1.5 mm, vertically downwards on a drill press, at a position, 6.25 mm to the left of the center of the rod's cross-section. This channel was drilled totally through the length of the preform.

Chunks of $Bi_{0.58}Sn_{0.42}$ powder, e.g., Product GF24773665 from Sigma-Aldrich Corp, Natick, Mass., was then ground into smaller-sized powder and filled into the second hollow channel. The preform holding the $Bi_{0.58}Sn_{0.42}$ powder was then placed vertically in a vacuum oven with temperature of 150° C. for 1.5 hours. The BiSn powder melted and flowed to fill up the hollow channel, hence forming a cylindrical $Bi_{0.58}Sn_{0.42}$ core.

A phosphor-coated copper wire, e.g., Model D502 from Shanghai Keyan Phosphor Technology Co. Ltd., Shanghai, China, included a copper wire of 0.23 mm in diameter that was coated with a 0.018 mm-thick sub-layer of polymeric dielectric, and lastly coated with an outer layer of Cu-doped ZnS with a thickness of 0.018 mm. A tungsten wire of 0.05 mm in diameter, e.g., Product Number 044191 from Alfa Aesar, Ward Hill, Mass., was also prepared. Both the phosphor-coated copper wire and the tungsten wire were loaded onto their individual spool holders prior to thermal draw.

The preform was thermally drawn in a three-zone vertical tube furnace drawing tower with the top-zone temperature of 150° C., a middle-zone draw temperature of 270° C., and a bottom-zone temperature of 110° C. Phosphor-coated wire of 0.266 mm in diameter was fed into one of the preform channels during the draw, and the tungsten wire of 0.05 mm in diameter was fed into the other preform channel during the draw. The final diameter of the electroluminescent fiber drawn from the tower ranged between about 0.8 mm and about 1.0 mm.

With a final outer diameter of 0.93 mm, the thermally drawn electroluminescent fiber included the phosphor-coated wire which was a copper wire of 0.23 mm in diameter coated with a 0.018 mm-thick sub-layer of polymeric dielectric and an outer layer of Cu-doped ZnS with a thickness of 0.018 mm, the tungsten wire of 0.05 mm in diameter, and the cylindrical $Bi_{0.58}Sn_{0.42}$ core of 0.04 mm in diameter. From the cross-sectional view of the fiber, the distance between the centers of the phosphor-coated wire and the $Bi_{0.58}Sn_{0.42}$ core was 0.192 mm, and the distance between the centers of the $Bi_{0.58}Sn_{0.42}$ core and the tungsten was 0.07 mm.

After thermal drawing, the fiber was subjected to a laser-based in-fiber particle formation process like that shown in FIGS. 21A-21D. A laser, Product L4-2495 from Viavi Solutions, Milpitas, Calif., having a spot size of about 50 microns and a power of 2 W was controlled in pulse mode at 5 kHz and a duty cycle of 0.2% controlled by a function generator, Tektronix AFG3252, Tektronix, Inc., Beaverton, Oreg. The fiber was arranged on a spool to be translated past the laser site, adjacent to the laser, at a translation speed of 0.0004 mm/s. After translation past the fiber, optical inspection of the fiber confirmed the presence of BiSn spheres of diameter between about 80 µm and about 100 µm along the fiber length.

The fiber including BiSn spheres was arranged with electrical connection between the copper and tungsten wires at one end of the fiber, as shown in FIG. 8. An alternating voltage supply, V, was configured for applying a voltage between the copper and tungsten wires, and the voltage amplitude was set at values between 150 V and 700 V. The frequency of the voltage source was set at values between 1000 Hz and 15 KHz.

As the voltage was applied to the wires in the fiber, the electroluminescent intensity at the site of three adjacent BiSn spheres along the fiber corresponding to three electroluminescent pixel sites along the fiber was measured. The measurement was completed by first by placing the fiber on a levelled surface with the interface between the BiSn spheres and phosphor being about perpendicular to the levelled surface so that the light spots at the interface were observed through an optical microscope placed above. Optical images of the lighted pixels were then captured for increasing applied voltages. These images were captured by a 10MP Microscope Digital Camera SKU:MA1000 from Amscope, Inc., in a dark environment with a constant camera exposure set at 40 ms. These images were post-processed through an image processing software, ImageJ, by taking a line scan across the lighted spots and measuring the image pixel intensity across the line scan. This intensity has arbitrary units (a.u.) allocated to it since this measurement was meant to compare the light intensities and pixel widths for varying voltages.

Figure 22A:
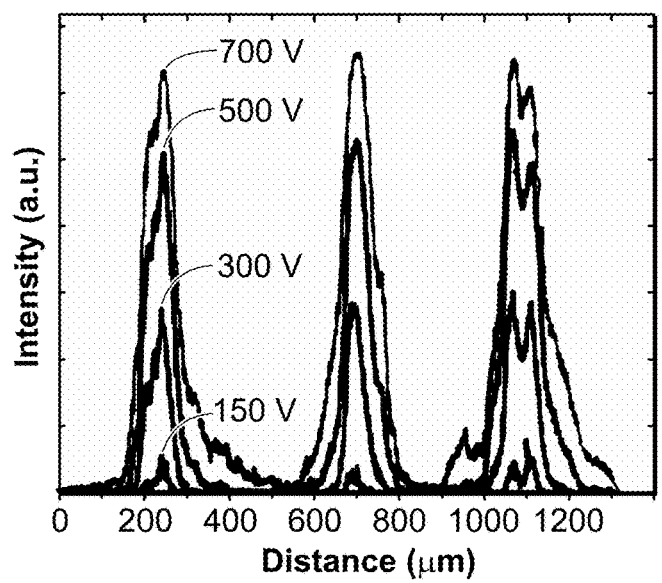
FIG. 22A is a plot of measured intensity of electroluminescent illumination from three adjacent electroluminescent pixels along an electroluminescent fiber, as a function of the voltage applied to the fiber.
Figure 22B:
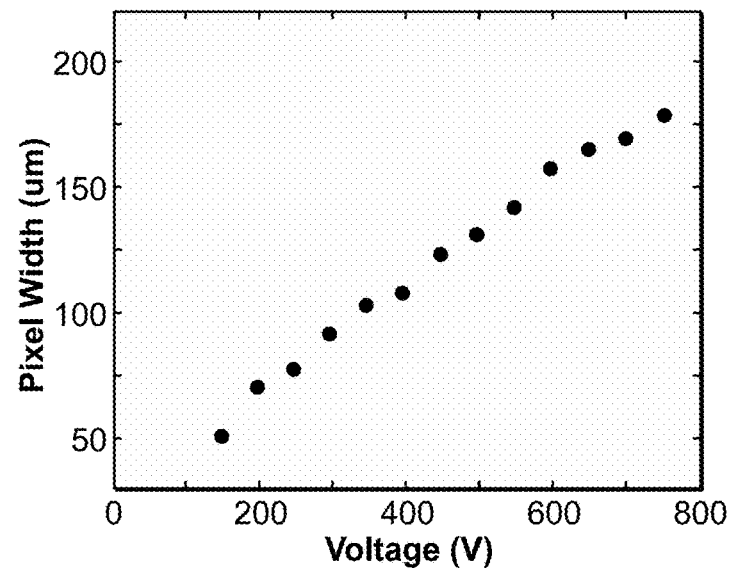
FIG. 22B is a plot of measured electroluminescent illumination width produced by an in-fiber electroluminescent pixel, as a function of the voltage applied to the pixel.

FIG. 22A is a plot of optical intensity that was measured for the fiber sites of three BiSn spheres. As the voltage was increased, the intensity correspondingly increased, and was substantially uniform between the three separate electroluminescent pixel sites. For the 18 µm-thick ZnS phosphor coating employed on the copper wire, a minimum applied voltage of about 100 V was required to produce detectable light in the coating. As the voltage amplitude is increased above this threshold voltage, the electric field in the fiber, between the two wires and around the ZnS coating, grows and expands, effectively expanding the width of a single electroluminescent pixel site. FIG. 22B is a plot of the effective pixel width as a function of the amplitude of voltage applied to the fiber. As the voltage increases, the pixel width was found to increase proportionally.

Figure 22C:
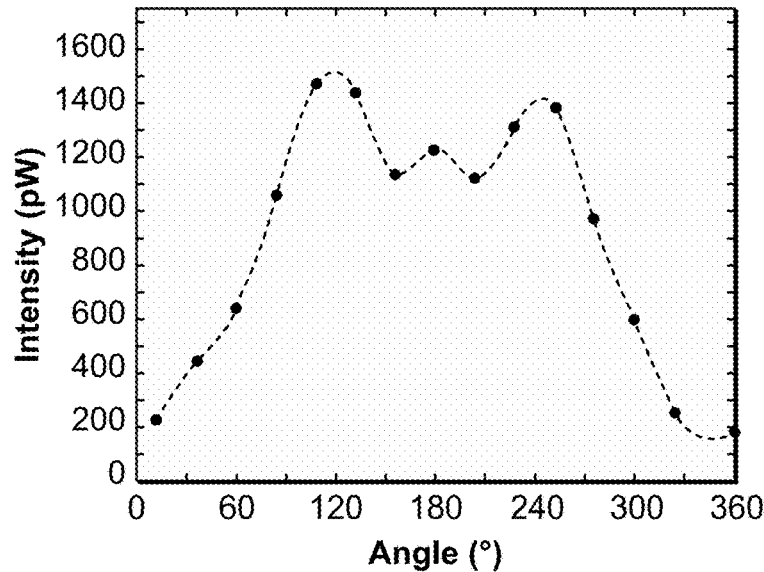
FIG. 22C is a plot of the measured intensity of electroluminescent illumination from an in-fiber electroluminescent pixel, as a function of viewing angle circumferentially around the fiber.

The intensity of illumination from one pixel site as measured as a function of angle around the circumference of the fiber at the pixel site. FIG. 22C is a plot of illumination intensity for angles around the fiber circumference. FIG. 22D is a schematic cross-sectional representation at a fiber pixel site, defining the angles of measured intensity shown in the plot of FIG. 22C.

With these measurements, it was demonstrated that there can be produced a fully functional electroluminescent fiber having separated illumination pixel sites. An object such as a display, as shown in FIG. 8, can be 3D-printed using the functional electroluminescent fiber to achieve a display that is integral with an object 3D-printed with the fiber.

Example II

3D-Printing of a Photodetecting Object with a Photodetecting Fiber

A photodetecting object was 3D-printed of a photoconducting fiber as follows. A fiber preform was arranged including the photoconductive chalcogenide glass amorphous $As_2Se$, shaped into a cylinder of 4 mm in diameter using the seal-ampoule melt-quenching. Here a sealed ampoule containing powdered $As_2Se_5$ was heated to 650° C. for 10 h in a rocking furnace to ensure a homogeneous cylindrical shape. The glass liquid was then cooled to a temperature of about 300° C. before quenching in water. A polycarbonate cylindrical rod of outer diameter of 10 mm containing the cylindrical chalcogenide glass $As_2Se_5$ rod of 4 mm in diameter was arranged with the rod contacted at opposite sides by two electrodes made up of conducting polyethylene, each with a rectangular cross-section of width 3 mm and height 2.6 mm. The rod containing the cylindrical chalcogenide glass and conducting polyethylene was then wrapped with polycarbonate layers until the rod became the final preform itself, attaining a diameter of 35 mm.

This fiber preform was consolidated for 45 minutes at a temperature of 190° C., under vacuum. The preform was thermally drawn in a three-zone vertical tube furnace drawing tower with the top-zone temperature of 150° C., a middle-zone draw temperature of 270° C., and a bottom-zone temperature of 110° C. The final diameter of the fiber drawn from the tower ranged between about 0.7 mm and about 0.8 mm.

A photodetecting pyramid was 3D-printed with a single continuous length of the fiber. The fiber diameter used to print the pyramid was about 0.76 mm, and the layer height for the pyramid was about 0.55 mm. The nozzle temperature and print speed used to print this pyramid was 250° C. and 150 min/min, respectively. The length of the heating tube was 1 mm. The speed ratio of print speed to dispensing speed was 1:1.05. The bed temperature was set at 125° C. The pyramid had base dimensions of 1.3 cm by 1.3 cm and a height of 1.1 cm and the number of printed layers in the pyramid was 23. The continuous length of the fiber to print this pyramid was about 70 cm.

Referring to FIG. 23A, the pyramid was configured in an electrical circuit by contacting the top end of the fiber length and the bottom end of the fiber length with leads to a circuit, with a voltage connection thereby made across the length of fiber, from one point on the pyramid to another. A Keithley multimeter, Product Number 6487 picoammeter with voltage source, was used to both provide the voltage of 100V and to measure the current from the circuit. Each circuit, top and bottom, used the same type of multimeter. The electrical connections from fiber to circuit were made using a razor blade to carefully shave away the polycarbonate outer cladding and expose the conducting polyethylene (CPE). Silver ink was applied on the exposed CPE, and later dried. Copper wire was then rolled tightly around the dried silver ink, before applying and drying of more silver ink onto copper wire to secure it in place. Each end of fiber length required the 2 opposite CPE to be exposed for connection to the positive and ground voltage leads.

A 500 mW/cm$^2$ broadband white light source, Biax Electronics FLE 23W R40 from General Electric, was directed to the 3D-printed pyramid and the amplitude of an applied voltage was swept through a range of values. The distance from the white light source to the pyramid was about 20 cm. The current through the circuit was measured for each application voltage. The same voltage application was then conducted under dark conditions.

Figure 24A:
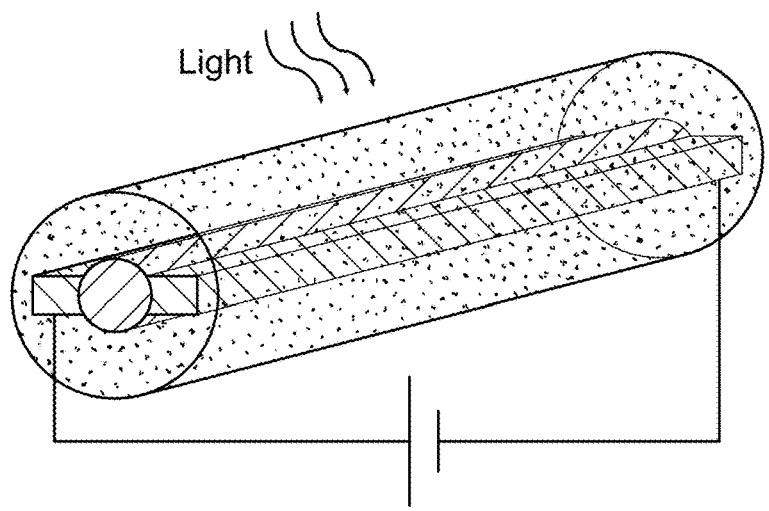
FIG. 24A is a schematic view of a photodetecting fiber arranged for photodetection.

Referring also to FIG. 24A, separate from the 3D-printed pyramid, a 250 cm-long section of fiber from the original drawn fiber was arranged in a circuit and the broadband white light source directed to the fiber section while the amplitude of an applied voltage was swept through a range of values.

Figure 24B:
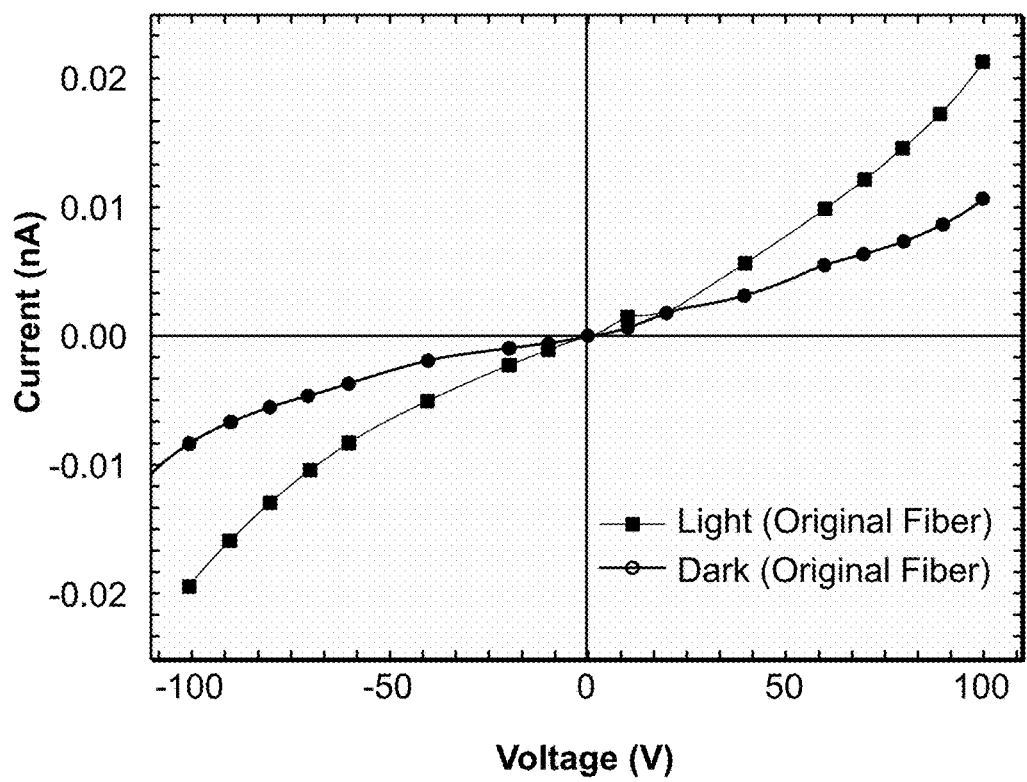
FIG. 24B is a plot of measured current out of the photodetecting fiber of FIG. 24A as a function of the voltage applied to the fiber, under dark conditions and under a condition of illumination of the fiber.

FIG. 23B is an I-V plot of measured electrical current as a function of applied voltage amplitude under dark conditions and under the condition of light impinging the pyramid. FIG. 24B is an I-V plot of the measured current as a function of applied voltage amplitude under dark conditions and under the condition of light impinging the straight length of original fiber. These plots depict characteristic non-linear photoresponse curves, attributed to the amorphous photodetecting $As_2Se_5$ semiconducting chalcogenide material. The similarity in the I-V curves between a straight section of drawn fiber and the 3D-printed pyramid of fiber highlights the ability of the 3D-printing process to retain the fiber functional properties, here photodetecting properties.

It is also noted that the ability to register a photocurrent in the pyramid demonstrates that the electrically-conducting functional domain of the pyramid is continuous throughout the whole pyramid. The 3D-printing process is thereby shown to retain the structure of the fiber functional domain and to embody the functional domain functionality even in a complex topology such as the tip of the pyramid, at which point the deposited fiber must to make an approximately 360° printing turn. This demonstrates the feasibility of 3D-printing a macro-scale functional device that is fully connected and with microscale sensing elements throughout the entire printed body, formed from a fiber.

Example III

3D-Printing of a Photodetecting Object with a Photodetecting Fiber

Figure 25B:
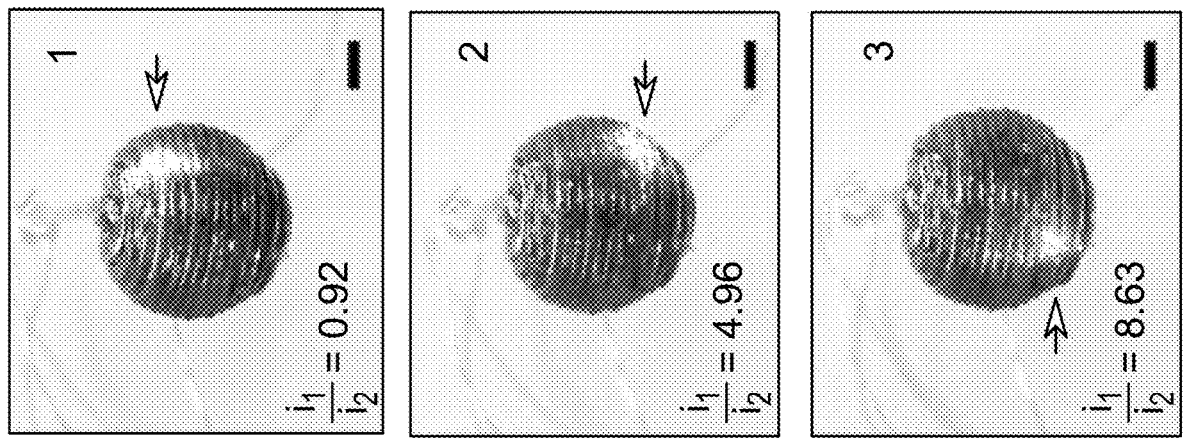
FIG. 25B is a schematic perspective view of three points of illumination on the sphere of FIG. 25A, indicating the electrical current ratio measured by the circuits of FIG. 25A.
Figure 25A:
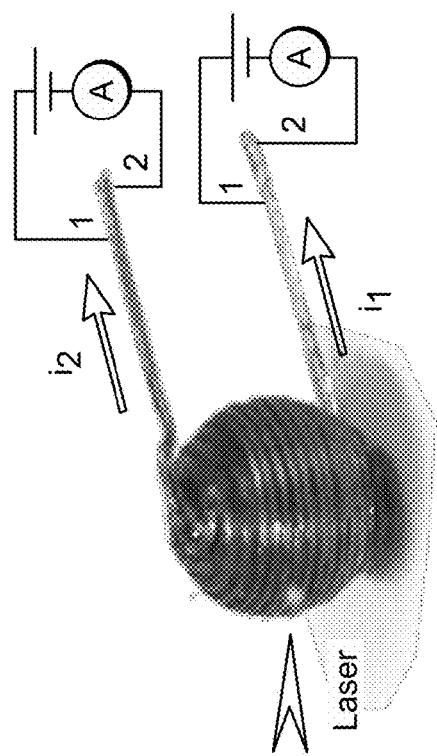
FIG. 25A is a schematic perspective view of an open sphere 3D-printed of a photodetecting fiber, with the sphere arranged for photodetection.

The photodetecting fiber of Example II was 3D-printed into a photodetecting sphere and arranged with electrical connections at ends of the fiber, as shown in FIG. 25A.

The laser, Deluxe Green Laser Pointer from Industrial Fiber Optics Inc., had a wavelength of 532 nm and power of 5 mW. A 6 mm focal length lens was used to focus the laser beam spot to ensure that the light spot fell within a single printed fiber layer of the printed sphere.

Figure 25D:
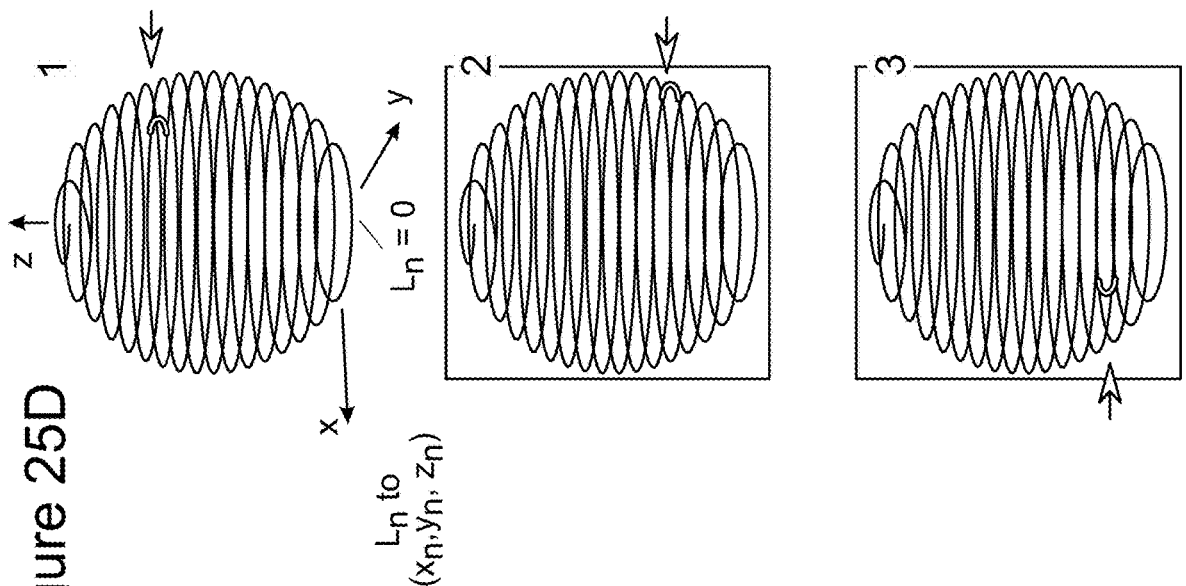
FIG. 25D is a schematic view of the three points of illumination on the sphere of FIG. 25B, indicating the calculated sites of the points of illumination.
Figure 25C:
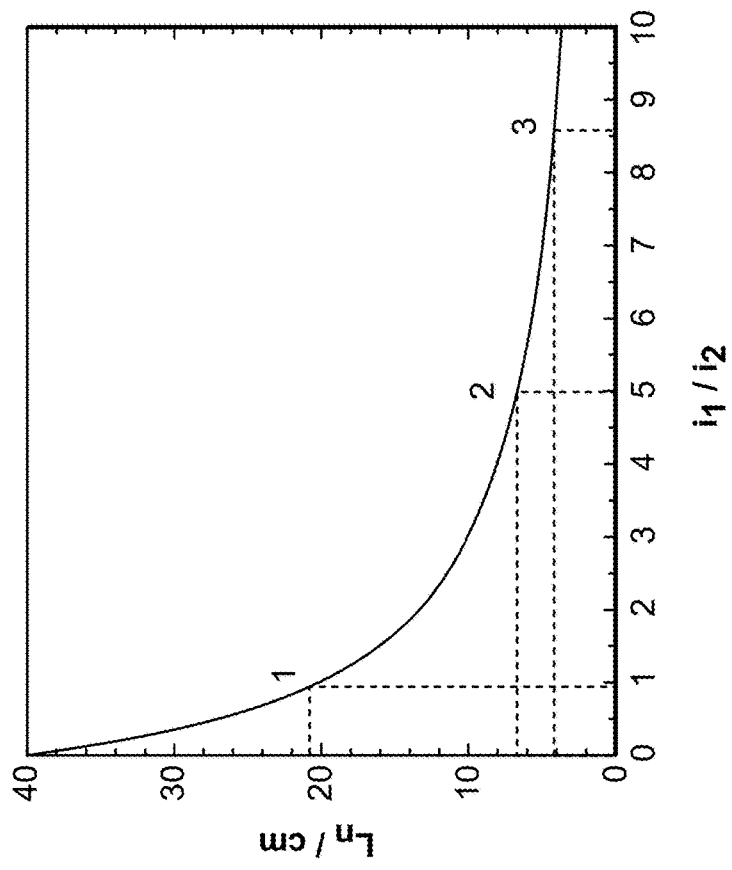
FIG. 25C is a plot of position along the photodetecting fiber from which the sphere of FIG. 25A was 3D-printed, as a function of the electrical current ratio, noting the current ratios of FIG. 25B.

As shown in FIG. 25B, three different sites on the sphere, the sites being labelled 1, 2, and 3 in FIG. 25B, were separately illuminated by the laser beam. The electrical current from each of the two circuits shown in FIG. 25A was measured for each of the three site illuminations, resulting in the ratio of electrical current in each of the two circuits, $i_1/i_2$, as shown for each site in FIG. 25B. Using the expressions given above to map the illumination site along the fiber with the measured current, the plot of FIG. 25C was constructed, enabling the detection/recognition of the three sites of illumination, based on the measured current, as shown in FIG. 25D. The very close match between the actual illumination sites, shown in FIG. 25B, and the calculated illumination sites determined based on measured current through the photodetector fiber, demonstrate both the accuracy of the sphere 3D-printed with fiber and the algorithm for spatially detecting light based on measured current through the 3D-printed sphere.

With the description above and the experimental examples just described, there is provided herein a method for multimaterial 3D-printing that enables the production of customizable, multiscale, three-dimensional objects that are fully functional, with functionality integral to the body of the object itself. This allows for customizable formation of 3D multimaterial structural designs while integrally providing the structure with nanoscale or microscale functional devices at the same time. Multiple materials are 3D-printed concurrently from a single print nozzle, with high spatial resolution defined by the microscale structurally-retained materials within the fiber.

In addition, the kilometer length scale of functional fiber that is thermally-drawn allows for 3D-printing of macroscale objects that are centimeters to meters in scale. Importantly, the thermal draw of multimaterial functional fibers enables configurations having translational symmetry of materials, structures and functionalities across the fiber cross section. Therefore, 3D-printing with functional fiber not only forms structures with 3D architectures, but also concurrently incorporates functionalities with axial structures in the 3D-printed layers, and does so continuously during the print. Such monolithic deposition then allows for the unrestricted formation of complex structural morphologies that are provided as-formed with inherent functional capabilities and with connections to internal electrical conductors. This enables a new paradigm for 3D-printing of multifunctional products that are endowed with inherent and custom functions with, e.g., microscale sensors, sources of power, illumination displays, and other modes of interaction.

It is recognized that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A structure comprising:
   a continuous length of fiber;
   said continuous length of fiber including:
      an interior functional domain comprising a plurality of different materials, the different materials arranged as at least one in-fiber functional component, and at least two electrical conductors, each electrical conductor disposed in electrical contact with a material in the functional domain;
      a cladding material encapsulating said at least one in-fiber functional component and said electrical conductors, along said continuous length of fiber, the cladding material having a cladding glass transition temperature; and
      a fusion domain circumferentially surrounding the encapsulated interior functional domain and comprising a polymer fusion domain material different than said cladding material and having a fusion domain glass transition temperature, said cladding glass transition temperature being at least about 50° C. greater than said fusion domain glass transition temperature and said polymer fusion domain material having a 3D-print critical temperature, $T_{crit}$, above which polymer chains of the polymer fusion domain material interdiffuse, said 3D-print critical temperature, $T_{crit}$, being less than said cladding glass transition temperature; and
   said continuous length of fiber being disposed as a plurality of fiber sections in a spatial arrangement in which said fusion domain of each said fiber section is in a state of material fusion having polymer chain interdiffusion with said fusion domain of another said fiber section.

2. The structure of claim 1 wherein said continuous length of fiber comprises at least three different materials and wherein said fusion domain comprises a Cyclic Olefin Copolymer (COC).

3. The structure of claim 1 further comprising external electrical connections to said electrical conductors.

4. The structure of claim 1 wherein each of said at least two electrical conductors comprise a conducting material selected from copper, tungsten, gold, silver, tin, aluminium, cadmium-copper, zirconium-copper, nickel-copper, a tin-lead alloy, electrically conducting polyethylene, and electrically conducting polycarbonate.

5. The structure of claim 1 wherein said continuous length of fiber comprises at least one semiconducting material.

6. The structure of claim 1 wherein said continuous length of fiber comprises at least one semiconducting material selected from the group consisting of silicon and germanium.

7. The structure of claim 1 wherein said spatial arrangement comprises said plurality of fiber sections arranged as structural walls.

8. The structure of claim 1 wherein said spatial arrangement comprises said plurality of fiber sections arranged as a bulk structural material.

9. The structure of claim 1 wherein said spatial arrangement comprises a layered stack of a plurality of fiber sections.

10. The structure of claim 1 wherein said spatial arrangement comprises a layered stack of a plurality of fiber sections disposed as structural walls.

11. A structure comprising:
a continuous length of fiber;
said continuous length of fiber comprising:
a plurality of different materials, including an inorganic microelectronic material, arranged as an in-fiber functional domain comprising a sequence of discrete pixels, and at least two electrical conductors, each electrical conductor disposed in electrical contact with a material in the functional domain;
a cladding material encapsulating said sequence of discrete pixels and said electrical conductors, along said continuous length of fiber, the cladding material having a cladding glass transition temperature; and
a fusion domain circumferentially surrounding the encapsulated interior functional domain and comprising a polymer fusion domain material different than said cladding material and having a fusion domain glass transition temperature, said cladding glass transition temperature being at least about 50° C. greater than said fusion domain glass transition temperature and said polymer fusion domain material having a 3D-print critical temperature, $T_{crit}$, above which polymer chains of the polymer fusion domain material interdiffuse, said 3D-print critical temperature, $T_{crit}$, being less than said cladding glass transition temperature; and
said continuous length of fiber being disposed as a plurality of fiber sections in a non-planar spatial arrangement in which each said fiber section is in a state of material fusion having polymer chain interdiffusion with another said fiber section.

12. The structure of claim 1 wherein said at least one in-fiber functional component comprises a sequence of spatially separated functional sensing elements and wherein said spatial arrangement comprises spatially separated functional sensing elements.

13. The structure of claim 1 wherein said continuous length of fiber includes a sequence of spatially separated functional particles and wherein said spatial arrangement comprises spatially separated particles.

14. The structure of claim 1 wherein said continuous length of fiber includes a light emitting in-fiber functional domain along the continuous length of fiber, and wherein said spatial arrangement comprises at least one light emitting path.

15. The structure of claim 1 wherein said continuous length of fiber includes an electroluminescent in-fiber domain along the continuous length of fiber, and wherein said spatial arrangement comprises an electroluminescent display.

16. The structure of claim 15 wherein said electroluminescent domain includes a phosphor material selected from the group consisting of Cu-doped ZnS, yittrium aluminium garnet (YAG), manganese, aluminium, doped zinc-cadmium-sulphide (ZnCdS), and doped zinc-cadmium-sulfur-selenide (ZnCdSSe).

17. A structure comprising:
a continuous length of fiber;
said continuous length of fiber comprising:
a plurality of different materials arranged as an in-fiber functional domain along the continuous length of fiber, and at least two electrical conductors, each electrical conductor disposed in electrical contact with a material in the functional domain;
said functional domain arranged as an electrical battery in-fiber domain along the continuous length of fiber, said electrical battery in-fiber domain including an anode material selected from $Li_2TiO_3$, lithium, a tin-based metal alloy, graphite, and silicon nanoparticles, a cathode material selected from $LiMn_2O_4$, $LiTi_2O_4$, $LiV_2O_4$, and $LiFePO_4$, and an ionically conductive porous polymer domain separating the anode material from the cathode material within the functional domain;
a cladding material encapsulating said functional domain along said continuous length of fiber, the cladding material having a cladding glass transition temperature; and
a fusion domain circumferentially surrounding the encapsulated interior functional domain and comprising a polymer fusion domain material different than said cladding material and having a fusion domain glass transition temperature, said cladding glass transition temperature being at least about 50° C. greater than said fusion domain glass transition temperature and said polymer fusion domain material having a 3D-print critical temperature, $T_{crit}$, above which polymer chains of the polymer fusion domain material interdiffuse, said 3D-print critical temperature, $T_{crit}$, being less than said cladding glass transition temperature; and
said continuous length of fiber being disposed as a plurality of fiber sections in a spatial arrangement in which each said fiber section is in a state of material fusion having polymer chain interdiffusion with another fiber section, said spatial arrangement having an electrical power output.

18. A structure comprising:
a continuous length of fiber;
said continuous length of fiber comprising:
a plurality of different materials arranged as an in-fiber functional domain along the continuous length of fiber, and at least two electrical conductors, each electrical conductor disposed in electrical contact with a material in the functional domain;
said functional domain arranged as an in-fiber piezoresistive domain along the continuous length of fiber, said piezoresistive in-fiber domain comprising piezoelectric poly(vinylidene fluoride); and
a cladding material encapsulating said functional domain along said continuous length of fiber, the cladding material having a cladding glass transition temperature; and a fusion domain circumferentially surrounding the encapsulated interior functional domain and comprising a polymer fusion domain material different than said cladding material and having a fusion domain glass transition temperature, said cladding glass transition temperature being at least about 50° C. greater than said fusion domain glass transition temperature and said polymer fusion domain material having a 3D-print critical temperature, $T_{crit}$, above which polymer chains of the polymer fusion domain material interdiffuse, said 3D-print critical temperature, $T_{crit}$, being less than said cladding glass transition temperature; and said continuous length of fiber being disposed as a plurality of fiber sections in a piezoelectric spatial arrangement in which each said fiber section is in a state of material fusion having polymer chain interdiffusion with another said fiber section.

19. The structure of claim 1 wherein said continuous length of fiber includes at least one in-fiber functional domain operative to respond to external contact of a surface region of said fiber, and wherein said spatial arrangement is operative to respond to external contact of said arrangement.

20. The structure of claim 1 wherein said continuous length of fiber comprises an in-fiber functional domain including a temperature-sensitive material that is in electrical contact with at least one of said at least two electrical conductors; and wherein said spatial arrangement comprises an external electrical contact to said at least one of said two electrical conductors.

21. A structure comprising:
a continuous length of fiber;
said continuous length of fiber comprising:
a plurality of different materials arranged as an in-fiber functional domain, and at least two electrical conductors, each electrical conductor disposed in electrical contact with a material in the functional domain; said functional domain of the continuous length of fiber including a plurality of separated spheres, each sphere in electrical contact with at least one of said electrical conductors;
a cladding material encapsulating said functional domain, the cladding material having a cladding glass transition temperature; and
a fusion domain circumferentially surrounding the encapsulated interior functional domain and comprising a polymer fusion domain material different than said cladding material and having a fusion domain glass transition temperature, said cladding glass transition temperature being at least about 50° C. greater than said fusion domain glass transition temperature and said polymer fusion domain material having a 3D-print critical temperature, $T_{crit}$, above which polymer chains of the polymer fusion domain material interdiffuse, said 3D-print critical temperature, $T_{crit}$, being less than said cladding glass transition temperature; and
said continuous length of fiber being disposed as a plurality of fiber sections in a spatial arrangement in which each said fiber section is in a state of material fusion having polymer chain interdiffusion with another said fiber section, said spatial arrangement including a plurality of separated spheres, wherein each of said spheres comprises a sphere of at least one of a metal and a semiconductor.

22. The structure of claim 1 wherein said functional domain includes a photodetecting material in electrical contact with at least one of said electrical conductors; and wherein said spatial arrangement comprises an external electrical contact to at least one of said electrical conductors.

23. The structure of claim 22 wherein said functional domain including a photodetecting material includes a chalcogenide semiconducting material.

24. The structure of claim 1 wherein said functional domain includes a chemically-sensitive material in electrical contact with at least one of said electrical conductors; and wherein said spatial arrangement comprises an external electrical contact to at least one of said electrical conductors.

25. The structure of claim 1 wherein said cladding material along said continuous length of fiber comprises a thermoplastic polymer material.

26. The structure of claim 25 wherein said thermoplastic polymer material comprises a material selected from polycarbonate (PC), acrylonitrile butadiene styrene (ABS), polylactic acid (PLA), Polysulfone (PSU), Polyetherimide (PEI), Polyethylene terephthalate (PET), Polystyrene (PS), Polyvinyl Alcohol (PVA), Nylon, Polyethersulfone (PES), and a thermoplastic elastomer.

27. A filament comprising:
a continuous length of fiber;
said continuous length of fiber including an interior functional domain comprising at least three different materials arranged as at least one in-fiber functional component, and at least two electrical conductors, each electrical conductor disposed in electrical contact with a material in the functional domain along said continuous length of fiber;
a cladding material encapsulating said at least one in-fiber functional component and said electrical conductors, along said continuous length of fiber, the cladding material having a cladding glass transition temperature;
a polymer fusion domain circumferentially surrounding the encapsulated interior functional domain and comprising a fusion domain material different than said cladding material and having a fusion domain glass transition temperature; and
wherein said cladding glass transition temperature is at least about 50° C. greater than said fusion domain glass transition temperature and said polymer fusion domain material has a 3D-print critical temperature, $T_{crit}$, above which polymer chains of the polymer fusion domain material interdiffuse, said 3D-print critical temperature, $T_{crit}$, being less than said cladding glass transition temperature.

28. The filament of claim 27 wherein said fusion domain is substantially circular in cross-section and said functional domain is substantially non-circular in cross-section.

29. The filament of claim 27 wherein said fusion domain material comprises a Cyclic Olefin Copolymer (COC).

30. The filament of claim 27 wherein said fusion domain is discontinuous along said length of fiber.

* * * * *